US012709819B2

(12) United States Patent
Ceran et al.

(10) Patent No.: US 12,709,819 B2
(45) Date of Patent: Aug. 18, 2026

(54) FURNACE APPARATUS FOR CRYSTAL PRODUCTION

(71) Applicant: Zadient Technologies SAS, Sainte-Hélène-du Lac (FR)

(72) Inventors: Kagan Ceran, Saint Baldoph (FR); Didier Marsan, Saint Baldoph (FR); Alexander Syrkin, Munich (DE); Omar Benamara, Lyons (FR); Moaine Jebara, Nantes (FR)

(73) Assignee: Zadient Technologies SAS, Sainte-Helene-du-Lac (FR)

( * ) Notice: Subject to any disclaimer, the term of this patent is extended or adjusted under 35 U.S.C. 154(b) by 4 days.

(21) Appl. No.: 18/037,672

(22) PCT Filed: Nov. 19, 2021

(86) PCT No.: PCT/EP2021/082331
§ 371 (c)(1),
(2) Date: May 18, 2023

(87) PCT Pub. No.: WO2022/106635
PCT Pub. Date: May 27, 2022

(65) Prior Publication Data

US 2023/0407519 A1 Dec. 21, 2023

(30) Foreign Application Priority Data

Nov. 19, 2020 (EP) .................................... 20208651
Dec. 11, 2020 (DE) ..................... 10 2020 215 755.3

(51) Int. Cl.
*C30B 29/36* (2006.01)
*C30B 23/00* (2006.01)
*C30B 23/06* (2006.01)

(52) U.S. Cl.
CPC .......... *C30B 23/066* (2013.01); *C30B 23/005* (2013.01); *C30B 29/36* (2013.01)

(58) Field of Classification Search
CPC ...... C30B 23/066; C30B 23/005; C30B 29/36
See application file for complete search history.

(56) References Cited

U.S. PATENT DOCUMENTS 3,011,877 A 12/1961 Schweickert et al.
3,030,189 A 4/1962 Schweickert et al.
(Continued)

FOREIGN PATENT DOCUMENTS

CN 102985363 A 3/2013
CN 108 910 890 A 11/2018
(Continued)

OTHER PUBLICATIONS

Notification of Reasons for Refusal, issued in Japanese Application No. 2023-559160 on Jan. 20, 2025, 8 pages.
(Continued)

*Primary Examiner* — Robert M Kunemund
(74) *Attorney, Agent, or Firm* — McDonnell Boehnen Hulbert & Berghoff LLP

(57) ABSTRACT

The disclosure refers to a furnace apparatus, in particular a furnace apparatus for growing crystals, in particular for growing SiC crystals. The furnace apparatus includes a furnace unit, where the furnace unit includes a furnace housing, at least one crucible unit where the crucible unit is arranged inside the furnace housing, where the crucible unit includes a crucible housing, where the housing has an outer surface and an inner surface, where the inner surface at least partially defines a crucible volume, where a receiving space for receiving a source material is arranged or formed inside the crucible volume, where a seed holder unit for holding a defined seed wafer is arranged inside the crucible volume,
(Continued)

and at least one heating unit for heating the source material, where the receiving space for receiving the source material is at least in parts arranged between the heating unit and the seed holder unit.

18 Claims, 21 Drawing Sheets

(56) References Cited

U.S. PATENT DOCUMENTS

| | | | |
|---|---|---|---|
| 3,157,541 | A | 11/1964 | Heywang et al. |
| 4,314,525 | A | 2/1982 | Hsu et al. |
| 4,491,604 | A | 1/1985 | Lesk et al. |
| 5,698,261 | A | 12/1997 | Ivanov et al. |
| 6,086,672 | A | 7/2000 | Hunter et al. |
| 6,791,917 | B2 | 9/2004 | Hayashi |
| 7,767,022 | B1 | 8/2010 | Gupta et al. |
| 8,512,471 | B2 | 8/2013 | Zwieback et al. |
| 9,315,895 | B2 | 4/2016 | Miyazawa et al. |
| 10,396,163 | B2 | 8/2019 | Wada et al. |
| 10,907,273 | B2 | 2/2021 | Myronov et al. |
| 11,851,784 | B2 | 12/2023 | Chen et al. |
| 11,859,309 | B2 | 1/2024 | Ahn et al. |
| 12,014,924 | B2 | 6/2024 | Kanbara et al. |
| 12,125,701 | B2 | 10/2024 | Khlebnikov et al. |
| 12,127,701 | B2 | 10/2024 | Kim |
| 12,330,948 | B2 | 6/2025 | Dukes et al. |
| 2002/0019117 | A1 | 2/2002 | Nagasawa |
| 2002/0083891 | A1 | 7/2002 | Vodakov et al. |
| 2004/0178176 | A1 | 9/2004 | Dunn |
| 2004/0194694 | A1 | 10/2004 | Sugiyama et al. |
| 2006/0073707 | A1* | 4/2006 | Powell .................... C30B 23/00 438/745 |
| 2007/0110657 | A1 | 5/2007 | Hunter |
| 2007/0251455 | A1 | 11/2007 | Wan et al. |
| 2008/0022923 | A1 | 1/2008 | Kordina et al. |
| 2008/0072817 | A1* | 3/2008 | Zwieback ............... C30B 23/00 117/951 |
| 2008/0115719 | A1* | 5/2008 | Gupta ..................... C30B 29/36 117/84 |
| 2009/0130333 | A1 | 5/2009 | Kim et al. |
| 2010/0291328 | A1 | 11/2010 | Forrest et al. |
| 2011/0159214 | A1 | 6/2011 | Gum et al. |
| 2011/0229638 | A1 | 9/2011 | Qin |
| 2011/0274851 | A1 | 11/2011 | Miyazawa et al. |
| 2011/0290175 | A1 | 12/2011 | Paranjpe et al. |
| 2011/0308449 | A1* | 12/2011 | Katsuno .................. C30B 29/36 118/726 |
| 2012/0225004 | A1 | 9/2012 | Zwieback et al. |
| 2012/0285370 | A1 | 11/2012 | Gupta et al. |
| 2013/0040103 | A1 | 2/2013 | Asamura et al. |
| 2013/0153836 | A1* | 6/2013 | Miyamoto .............. C30B 29/36 252/516 |
| 2013/0309496 | A1 | 11/2013 | Zwieback et al. |
| 2014/0038392 | A1 | 2/2014 | Yonehara et al. |
| 2014/0050648 | A1 | 2/2014 | Becker et al. |
| 2015/0123038 | A1 | 5/2015 | Dassel |
| 2016/0207783 | A1 | 7/2016 | Hopkins et al. |
| 2016/0348274 | A1 | 12/2016 | Genba et al. |
| 2017/0204532 | A1* | 7/2017 | Land ..................... C04B 35/571 |
| 2017/0321345 | A1 | 11/2017 | Xu et al. |
| 2018/0029893 | A1 | 2/2018 | Siller et al. |
| 2018/0118562 | A1 | 5/2018 | Drescher et al. |
| 2018/0290893 | A1 | 10/2018 | Dukes et al. |
| 2018/0327271 | A1 | 11/2018 | DesRosier et al. |
| 2019/0003046 | A1 | 1/2019 | Tanimoto et al. |
| 2019/0323145 | A1 | 10/2019 | Xu et al. |
| 2019/0360118 | A1 | 11/2019 | Fujikawa et al. |
| 2020/0071847 | A1* | 3/2020 | Vogel ...................... C30B 29/36 |
| 2020/0199777 | A1 | 6/2020 | Drachev et al. |
| 2021/0163302 | A1 | 6/2021 | Rimboeck et al. |
| 2021/0301418 | A1 | 9/2021 | Deng et al. |
| 2021/0332497 | A1 | 10/2021 | Chen |
| 2023/0197435 | A1 | 6/2023 | Biard |
| 2024/0026566 | A1 | 1/2024 | Crössmann et al. |
| 2024/0034635 | A1 | 2/2024 | Crössmann et al. |
| 2024/0035153 | A1 | 2/2024 | Crössmann et al. |
| 2024/0035201 | A1 | 2/2024 | Crössmann et al. |
| 2024/0044045 | A1 | 2/2024 | Crössmann et al. |
| 2024/0060211 | A1 | 2/2024 | Crössmann et al. |
| 2024/0093408 | A1 | 3/2024 | Crössmann et al. |
| 2025/0305140 | A1 | 10/2025 | Ceran et al. |
| 2025/0327208 | A1 | 10/2025 | Ceran et al. |
| 2025/0327210 | A1 | 10/2025 | Itou et al. |
| 2025/0341024 | A1 | 11/2025 | Ceran et al. |

FOREIGN PATENT DOCUMENTS

| | | | |
|---|---|---|---|
| CN | 208151525 | U | 11/2018 |
| CN | 108977795 | A | 12/2018 |
| CN | 109 402 731 | A | 3/2019 |
| CN | 110 331 439 | A | 10/2019 |
| CN | 111705363 | A | 9/2020 |
| CN | 116 695 252 | A | 9/2023 |
| DE | 1 184 738 | B | 1/1965 |
| DE | 601 24 472 | T2 | 9/2007 |
| DE | 102010044108 | A1 | 5/2012 |
| DE | 102004059191 | B4 | 7/2020 |
| EP | 1 186 685 | A2 | 3/2002 |
| EP | 1 205 584 | A1 | 5/2002 |
| EP | 0 859 879 | B1 | 7/2002 |
| EP | 1 471 168 | A | 10/2004 |
| EP | 2 264 223 | A2 | 12/2010 |
| EP | 2 465 979 | A2 | 6/2012 |
| EP | 2 024 536 | B1 | 7/2016 |
| EP | 3 351 660 | A1 | 7/2018 |
| EP | 3197847 | B1 | 11/2020 |
| EP | 4 279 451 | A1 | 11/2023 |
| GB | 988097 | A | 4/1965 |
| GB | 1128757 | A | 10/1968 |
| JP | 2000-169298 | A | 6/2000 |
| JP | 2002-362998 | A | 12/2002 |
| JP | 2004-311649 | A | 11/2004 |
| JP | 2009-117533 | A | 5/2009 |
| JP | 2011111372 | A * | 6/2011 |
| JP | 5293732 | B2 | 9/2013 |
| JP | 2017-081800 | A | 5/2017 |
| JP | 2018-016498 | A | 2/2018 |
| JP | 2018-083738 | A | 5/2018 |
| KR | 10-2153501 | B1 | 9/2020 |
| WO | 2007/133025 | A1 | 11/2007 |
| WO | 2007/136209 | A1 | 11/2007 |
| WO | 2012/029952 | A1 | 3/2012 |
| WO | 2013/016823 | A1 | 2/2013 |
| WO | 2013/049314 | A2 | 4/2013 |
| WO | 2016/141579 | A1 | 9/2016 |
| WO | 2016/162428 | A1 | 10/2016 |
| WO | 2017/053883 | A1 | 3/2017 |
| WO | 2018/177707 | A1 | 10/2018 |
| WO | 2018/183585 | A1 | 10/2018 |
| WO | 2019/201439 | A1 | 10/2019 |
| WO | 2019/227395 | A1 | 12/2019 |
| WO | 2020/078328 | A1 | 4/2020 |
| WO | 2021/191511 | A1 | 9/2021 |
| WO | 2022/123072 | A1 | 6/2022 |
| WO | 2022/123078 | A1 | 6/2022 |
| WO | 2022/123083 | A2 | 6/2022 |
| WO | 2022123079 | A1 | 6/2022 |

OTHER PUBLICATIONS

Baliga; B. Jayant, “Wide Bandgap Semiconductor Power Devices”, Materials, Physics, Design, and Applications, 2019, 21 pages.

“Carbon fibers”, Carbon fibers—Wikipedia, https://en.wikipedia.0rg/w/index.php?title=carb0n_fibers&01did=900826785, 2019, 8 pages.

Wellmann et al., “Modified Physical Vapor Transport Growth of SiC—Control of Gas Phase Composition for Improved Process Conditions”, Materials Science Forum, Silicon Carbide and Related Materials, 2005, vols. 483-485, 25-30.

Kobayashi et al., “Tensile Strength of Carbon-Carbon Composites at High Temperature up to 2773K”, ICCM, 2009, vol. 17, 8 pages.

(56) References Cited

OTHER PUBLICATIONS

Nishizawa et al., "New Crucible Design for SiC Single Crystal Growth by Sublimation", Mat. Res. Soc. Symp., Materials Research Society, 2001, vol. 640, 6 pages.
"Reinforced carbon-carbon", Wikipedia, The Wayback Machine—https://web.archive.orglweb/20220310232011lhtlps:l/en.wikipedia.org/wikilReinforced_carbon%E2%80%93carbon, 2022, 4 pages.
Extended European Search Report issued in European Patent Application No. 22173980.8 on Nov. 22, 2022, 11 pages.
International Search Report issued in Int'l Application No. PCT/EP2023/063306, mailed Oct. 17, 2023, 3 pages.
Written Opinion issued in Int'l Application No. PCT/EP2023/063306, mailed Oct. 17, 2023, 6 pages.
International Search Report and Written Opinion issued in International Application No. PCT/EP2023/057972, mailed Oct. 11, 2023, 10 pages.
Extended European Search Report issued in European Application No. 221739709, mailed Feb. 24, 2023, 12 pages.
International Search Report issued in Int'l Application No. PCT/EP2023/063308, mailed Oct. 9, 2023, 4 pages.
Written Opinion issued in Int'l Application No. PCT/EP2023/063308, mailed Oct. 9, 2023, 6 pages.
International Search Report issued in International Application No. PCT/EP2024/057950, mailed on Jun. 13, 2024, 4 pages.
Written Opinion issued in International Application No. PCT/EP2024/057950, mailed on Jun. 13, 2024, 4 pages.
Office Action issued in Taiwanese Patent Application No. 110143210, mailed Oct. 3, 2025, 21 pages.
International Preliminary Report on Patentability issued in International Application No. PCT/EP2024/074980, mailed on Oct. 9, 2025, 32 pages.
Desain et al., "Reaction of chlorine atom with trichlorosilane from 296 to 473K", The Journal of Chemical Physics, 2006, 125(22), 8 pages.
Duan et al., "Chlorination of trichlorosilane/chlorodimethylsilane using metal chlorides: experimental and mechanistic investigations", RSC Advances, 2023, 13(12), 7877-7885.
Zhang et al., "Optimization of thermal field of 150 mm SiC crystal growth by PVT method", RSC Advances, 2022, 12 (31), 19936-19945.
Partial European Search Report issued in International Application No. PCT/EP2025/068311, mailed Oct. 16, 2025, 14 pages.
Notice of Reasons for Rejection issued in Japanese Application No. 2023-559160 on Jul. 28, 2025, 6 pages.
Jennings, M. R., "Bow Free 4" Diameter 3C-SiC Epilayers Formed upon Wafer-Bonded Si/SiC Substrates, ECS Solid State Letters, 2012, 1(6), P85-P88.
Notification for the Opinion of Examination issued in Taiwanese Application No. 110146555 on Jul. 8, 2025, 27 pages.
International Search Report issued in International Application No. PCT/EP2024/074980, mailed on Dec. 4, 2024, 4 pages.
Written Opinion issued in International Application No. PCT/EP2024/074980, mailed on Dec. 4, 2024, 8 pages.
International Search Report issued in International Application No. PCT/EP2024/074973, mailed on Dec. 2, 2024, 4 pages.
Written Opinion issued in International Application No. PCT/EP2024/074973, mailed on Dec. 2, 2024, 10 pages.
Noda et al., "Reaction of Si with HCI to Form Chlorosilanes: Time Dependent Nature and Reacting Model", Journal of the Electrochemical Society, 2004, 151(6), C399-C404.
Office Action from Chinese Application No. 202180083690.X, dated May 21, 2026, with English translation.

* cited by examiner 126, 128, 134
128, 134

126, 130
122
150
148
147

107
122
130
142
138
156
144
140
154
146
152
147

126
129

174
196
204
200
202
132
198
194

174
204
126
132
107
156
158
126
128
134
126
129
162
156
158
164

124, 212
206
124, 214

208
208

210
124
206
124

208

210
124
206
124
AS
AS

208

124
244
206
124
246

HR
207
208

124
117
248

118
206, 210
A
207, 244
252

118, 119
118, 119
206, 210
A
207, 244

170
132
132 198
169
4
204
174
172
173
192
182, 190
188
107
118, 120
124, 214
206
130
150
148

130
166

130
166
185
184

130
166

130
166

130
166

130
166
186
185
184

312
316
314
130
302
310
300
299
142
140

130
298
295

296
142
140
358
142
362
360
130
140
364
141

FURNACE APPARATUS FOR CRYSTAL PRODUCTION

CROSS REFERENCE TO RELATED APPLICATIONS

This application is a U.S. national phase of International Application No. PCT/EP2021/082331, filed on Nov. 19, 2021, which claims priority to German Application No. 10 2020 215 755.3, filed Dec. 11, 2020, and claims priority to European Application No. 20208651.8, filed Nov. 19, 2020, all of which are incorporated by reference herein in their entirety.

FIELD OF THE DISCLOSURE

The present invention concerns at least a reactor or furnace apparatus for growing crystals according to claim 1 and preferably a method for producing SiC material.

BACKGROUND

Power electronics based on silicon carbide (SiC) wafers exhibit improved performance over those based on conventional silicon (Si) wafers, primarily due to the wider bandgap of SiC which allows it to operate at higher voltages, temperatures, and frequencies. With the worldwide transition to electric vehicles (EVs) gaining momentum, there is an increased interest in high performance SiC based power electronics, but SiC wafers remain considerably more expensive than Si wafers. Furthermore, commercial production of SiC wafers has only recently been standardized to 150 mm diameter, whereas commercial production of Si wafers has been standardized to 300 mm diameter for some time. Increased diameter is a major contributor to cost reduction in both the production of single crystals (from which wafers are cut), and the subsequent production of chips.

Currently, the prevailing method for commercial production of SiC single crystals is physical vapor transport (PVT). A conventional PVT furnace is formed in a cylindrical in shape. It is composed of one quartz tube or two concentric water-cooled quartz tubes sealed by a water-cooled lower flange and a water-cooled upper flange, which define the furnace volume. The lower flange includes a furnace gas inlet and the upper flange incorporates a furnace vacuum outlet. The quartz tube or tubes are surrounded by an external induction coil.

Inside such a furnace volume there is thermal insulation, typically fabricated from graphite, and inside the thermal insulation there is a crucible, also typically fabricated from graphite. The crucible contains SiC source material, typically in powder form. A SiC single crystal grows from a SiC seed wafer which is attached to a seed holder typically fabricated from graphite. The seed holder in turn is attached to the crucible lid, typically fabricated from graphite.

The crucible unit and the crucible lid define the crucible volume.

The furnace volume and the crucible volume are at the same pressure because the crucible and the crucible lid are permeable to the process gases.

The crucible further incorporates a growth guide, typically fabricated from graphite, which is used to direct vapors toward the growing crystal and to tune the thermal field and vapor flow around the sides of the growing crystal.

The PVT furnace is operated by first purging the air inside the furnace volume and crucible volume with an inert gas such as argon. The pressure is reduced to a vacuum of between 0.1 to 50 Torr respectively 13,3322 to 6666.12 Pa and the temperature, as measured at the top of the crucible lid by a pyrometer along the pyrometer sightline, is increased to approximately 2,000-2,200° C. using the induction coil. The PVT furnace is designed such that the temperature of the source material is typically several 100° C. higher than the top of the crucible lid or filter lid.

At these temperatures and pressures the source material undergoes incongruent sublimation and releases mostly Si vapor, and some $SiC_2$ and $Si_2C$ vapors, while becoming graphitized itself. The vapors migrate to the seed wafer by the process of thermally driven diffusion since the source material is maintained at a higher temperature that the seed wafer. Upon reaching the seed wafer, some of the $SiC_2$ and $Si_2C$ vapors integrate into its crystal structure resulting in the growth of the crystal. Excess $SiC_2$ and $Si_2C$ vapors pass between the growth guide and the crystal and form polycrystalline deposits on the sides of the seed holder, the underside of the crucible lid and the upper inner walls of the crucible.

By contrast, the Si vapor does not incorporate into the growing crystal but rather etches and permeates through all graphite components of the PVT furnace. When the source material has been largely consumed and crystal growth slows, the induction coil is turned off and the PVT furnace is cooled down. During repeated heating and cooling cycles, the Si vapor that has infiltrated the graphite components degrades the structural and thermal properties of these components. For example, the thermal conductivity of the insulation increases appreciably with the presence of infiltrated Si.

As a result, all graphite components of the PVT furnace have a relatively short service life and are typically replaced every few cycles, which contributes to high production costs. By contrast, the graphite components in a Czochralski (CZ) furnace used for production of Si single crystals typically have a service life of several hundred runs.

Permeability of the graphite crucible has become an accepted feature of SiC crystal growth by PVT, and operating methods have been adapted to this.

For example, doping gases such as nitrogen are typically introduced into the furnace volume through the furnace gas inlet and allowed to permeate into the crucible volume through the crucible to reach the crystal while Si vapor is permeating outward through the crucible into the furnace volume.

One of the main reasons the external induction coil is used instead of internal graphite resistive heating elements is that these heating elements would also quickly be degraded by the Si vapor. However, the induction coil has a significant limitation in that it causes a radial temperature gradient to form in the growing crystal because the sides of the crystal are closer to the induction coil and develop a higher temperature than the middle of the crystal. This temperature difference results in internal stresses in the crystal which in turn lead to defects. This phenomenon is accentuated as the diameter of the crystal is increased and is the primary reason why it is difficult to grow a large diameter crystal in a conventional PVT furnace.

In summary, uncontained Si vapor reduces the service life of graphite components in a conventional PVT furnace and also necessitate the use of an external induction coil which in turn limits the diameter of the crystal. A current state of the art conventional PVT furnace can grow SiC crystals with a diameter of typically only 150 mm whereas Si crystals are routinely grown to a diameter of 300 mm in a CZ furnace. Degradation by Si vapor of the graphite components in the PVT furnace changes their thermal properties and makes it difficult to maintain constant process conditions during a run and from one run to the next. Variability in process conditions results in a lower yield of crystals with acceptable levels of defects, also contributing to high production costs.

Numerous attempts have been made to improve the performance of the conventional PVT furnace. U.S. Pat. No. 20200199777 to Drachev et al. discloses a PVT furnace with solid source material positioned annularly between the crucible wall and an inner porous tube. A similar inner tube is proposed by Nishizawa et al. in New Crucible Design for SiC Single Crystal Growth by Sublimation, Mat. Res. Soc. Symp. Vol. 640, 2001 Materials Research Society. This inner tube essentially acts as an internal heater heated by the external induction coil and somewhat reduces the radial temperature gradient in the crystal.

U.S. Pat. No. 20190323145 to Zu et al. discloses a PVT furnace with an axial resistive heater positioned inside the furnace volume directly below the crucible. This axial resistive heater helps to create flatter radial isotherms but U.S. Pat. No. 20190323145 does not disclose any means of preventing Si vapor from escaping the crucible and degrading the axial resistive heater.

U.S. Pat. No. 20120285370 to Gupta et al. discloses a PVT furnace with a vapor capture trap disposed annularly around the crystal. The vapor capture trap is 3-20° C. cooler than the crystal and may be filled with a vapor absorbing member. Sublimation vapors enter the vapor capture trap and form solid deposits therein. However, given that the crystal is typically at a temperature of approximately 2,000-2,200° C., primarily the $SiC_2$ and $Si_2C$ sublimation vapors form deposits in the vapor capture trap whereas the Si sublimation vapor remains largely uncontained.

Wellman et al. in "Modified Physical Vapor Transport Growth of SiC-Control of Gas Phase Composition for Improved Process Condition", Mat. Sci. Forum, vols. 483-485 (2005) pp. 25-30, propose a gas pipe extending upward through the bottom of the crucible and through the source material to deliver gases into the crucible. This allows for tuning of the gas phase composition, particularly with respect to doping gases, resulting in improved crystal characteristics. However, injection of gases directly into the crucible volume slightly raises the pressure inside the crucible volume relative to the furnace volume and promotes permeation of gases, including Si vapor, through the crucible and into the surrounding insulation. Furthermore the gas is delivered into the crucible at a point between the source material and the growing crystal, convectively disrupting the thermal diffusion driven mass flux of sublimation species to the crystal.

SUMMARY

Therefore, it is the object of the present invention to provide an improved reactor or furnace apparatus and an improved method for producing crystals, in particular SiC crystals. It is a further object of the present invention to provide a reactor or furnace apparatus and a method for producing crystals, in particular SiC crystals, in a more cost effective manner. Thus, it is a further object of the present invention to provide a reactor or a furnace apparatus with increased lifetime and a method for producing crystals, in particular SiC crystals, that causes an increased lifetime of the reactor or furnace apparatus. It is another object of the present invention to provide a reactor or furnace apparatus and a method for producing crystals, in particular SiC crystals, that enables larger crystal diameters.

The above-mentioned object is solved by a new type of reactor respectively furnace apparatus which comprises at least the following features, in particular by a reactor according to claim 1: Such a new type of reactor or furnace apparatus is preferably a reactor or furnace apparatus for growing crystals, in particular for growing SiC crystals. Said reactor or furnace apparatus preferably comprises a furnace, wherein the furnace respectively furnace unit comprises a furnace volume. Said reactor or furnace apparatus also comprises at least one or more than one or exactly one crucible or crucible unit, wherein the at least one crucible or crucible unit is arranged inside the furnace volume. The crucible respectively crucible unit comprises, has or forms a crucible housing, wherein the crucible housing forms a housing, wherein the housing has an outer surface and an inner surface, wherein the inner surface at least partially forms respectively delimits a crucible volume. A receiving space for receiving a source material is arranged or formed inside the crucible volume. A seed holder unit for holding a defined seed wafer is preferably also provided, in particular arranged inside the crucible volume or such a seed holder unit is arrangeable inside the crucible volume. The reactor or furnace apparatus also has at least one heating unit, in particular for heating the source material and/or the crucible housing of the crucible respectively crucible unit. In case a seed holder unit is provided the receiving space for receiving the source material is preferably at least in parts arranged between the heating unit and the seed holder unit. The seed holder unit preferably comprises a seed wafer attaching surface, wherein the seed wafer attaching surface forms the seed holder unit front side and wherein the backside surface is formed on a side of the seed holder unit which is opposite to the seed wafer attaching surface.

This furnace apparatus is beneficial since it can be modified in one or multiple manners to solve at least one of the above-mentioned objects or to solve multiple or all of the above mention objects.

Further preferred embodiments are subject matter of the further specification parts and/or of the dependent claims.

According to a preferred embodiment of the present invention the furnace apparatus further comprises at least one leak prevention means for preventing leakage of gaseous silicon during operation from the inside of the crucible respectively crucible unit to a part of the furnace volume surrounding the crucible unit. This embodiment is beneficial since the drawbacks of leaking Si vapor are eliminated.

The leak prevention means is according to a further preferred embodiment of the present invention selected from a group of leak prevention means. The group of leak prevention means preferably comprises at least (a) a covering element for covering of surface parts and/or a density increasing element for increasing the density of a volume section of the crucible housing of the crucible unit, (b) a filter unit for capturing gaseous Si and/or (c) a pressure unit for setting up a first pressure inside the crucible unit and a second pressure inside the furnace but outside the crucible unit, wherein the second pressure is higher than the first pressure (d) gaskets arranged between housing parts of the crucible unit. This embodiment is beneficial since multiple features are provided to eliminate the drawbacks of leaking Si vapor. It is possible to provide such a furnace apparatus with one or multiple or all features of said group of leak prevention means. Thus, the present invention also provides solutions for varying needs, in particular for varying products, in particular crystals having different properties.

The leak prevention means reduces according to a further preferred embodiment of the present invention leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99,9% (mass) (this means ninety-nine comma nine percent). This embodiment is beneficial since due to the significant reduction of leaking Si vapor furnace unit components like the crucible housing and the heating unit can be reused multiple times, in particular more than 10 times or more than 20 times or more than 50 times or more than 100 times. Thus, the crucible unit, respectively the crucible housing, respectively sections of the crucible unit, respectively sections of the crucible housing have a permeability of less than $10^{-2}$ $cm^2/s$ or of less than $10^{-5}$ $cm^2/s$ or of less than $10^{-10}$ $cm^2/s$, in particular in view of Si vapor.

The crucible housing comprises according to a further preferred embodiment of the present invention carbon, in particular at least 50% (mass) of the crucible housing are made of carbon and preferably at least 80% (mass) of the crucible housing are made of carbon and highly preferably at least 90% (mass) of the crucible housing are made of carbon or the crucible housing complete consists of carbon, in particular the crucible housing comprises at least 90% (mass) graphite or consists of graphite, to withstand temperatures respectively for withstanding temperatures above 2,000° C., in particular at least or up to 3,000° C. or at least up to 3,000° C. or up to 3,500° C. or at least up to 3,500° C. or up to 4,000° C. or at least up to 4,000° C. (this means four thousand degree Celsius). The crucible housing is preferably impermeable to silicon gas (Si vapor). This embodiment is beneficial as it prevents Si vapor from permeating through the crucible housing and damaging the crucible housing and components outside of the crucible housing. Additionally, or alternatively the crucible unit respectively the crucible housing structure or the crucible housing comprises glassy carbon coated graphite and/or solid glassy carbon and/or pyrocarbon coated graphite and/or tantalum carbide coated graphite and/or solid tantalum carbide, in particular solid CVD tantalum carbide.

The leak prevention means is according to a further preferred embodiment of the present invention a covering element for covering the surface of the housing, in particular the inner surface and/or the outer surface, or for covering surface parts of the housing, in particular surface parts of the inner surface of the housing and/or surface parts of the outer surface of the housing. This embodiment is beneficial since the covering element can be generated on a surface of the housing or can be attached to a surface of the housing in a reliable manner and this approach is more economical than making the housing entirely out of the covering material.

The covering element is according to a further preferred embodiment of the present invention a sealing element, wherein the sealing element is a coating. The coating preferably comprises a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99,9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. This embodiment is beneficial the coating can reduce permeability of Si vapor through the crucible at the typical operating temperatures of the crucible. The coating highly preferably comprises a material or multiple materials selected from a group of materials at least comprising carbon, in particular pyrocarbon and glassy carbon. Thus, the crucible unit, in particular the crucible housing respectively the housing of the crucible unit is preferably coated with pyrocarbon and/or glassy carbon. The layer of pyrocarbon preferably has a thickness of more than or of up to 10 μm, in particular of more than or of up to 20 μm or of more than or of up to 50 μm or of more than or of up to 100 μm of more than or of up to 200 μm of more than or of up to 500 μm. The layer of glassy carbon preferably has a thickness of more than or of up to 10 μm, in particular of more than or of up to 20 μm or of more than or of up to 50 μm or of more than or of up to 100 μm of more than or of up to 200 μm of more than or of up to 500 μm.

The coating is generated according to a further preferred embodiment by chemical vapor deposition or wherein the coating is generated by painting, in particular of a precursor material, in particular phenol formaldehyde, and pyrolyzing after painting. This embodiment is beneficial since the coating can be generated in a reliable manner and this approach is more economical than making the housing entirely out of the covering material.

The leak prevention means is according to a further preferred embodiment of the present invention a density increasing element respectively a sealing element for increasing the density of a volume section of the crucible housing of the crucible unit, wherein the density increasing element is arranged or generated in the inner structure of the crucible housing, wherein the density increasing element is a sealing element, wherein the sealing element reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99,9% (mass). This embodiment is beneficial since the dimensions of the crucible unit remain the same respectively are not affected by the modification. The sealing element is preferably generated inside of the crucible housing by means of impregnation or deposition.

The leak prevention means is according to a further preferred embodiment of the present invention a filter unit for capturing gaseous Si. The filter unit comprises a filter body, wherein the filter body comprises a filter input surface respectively an input section for inputting gas comprising SiC species vapor, Si vapor, and process gases into the filter body and an output section respectively a filter output surface for outputting filtered process gas or gases, in particular doping and/or carrier gas/es. A filter element is arranged between the filter input surface and the filter output surface, wherein the filter element forms a trapping section for adsorbing and condensing SiC species vapor and in particular Si vapor. Thus, the filter material is preferably such that it causes Si vapors to be absorbed and condensed on a filter material surface. This embodiment is beneficial since SiC species vapors and Si vapors are trapped in a disposable component and do not coat and/or infiltrate other components of the furnace apparatus thus damaging and/or altering their properties such that their service lives are reduced. Thus, the amount of Si vapor which might leak is also significantly reduced. Most and preferably all of the Si vapors will be preferably trapped as a condensed liquid film on the internal surfaces of the filter. Additionally or alternatively a zone in the upper section of the filter is defined in which the temperature is below the melting point of Si and the condensed vapors actually solidify. The Si vapors preferably do not solidify as particles, but preferably as a solid film on the internal surfaces of the filter. This film may be amorphous or polycrystalline. Excess Si2C and SiC2 vapors will preferably also permeate into the lower section of the filter and preferably precipitate there as solid polycrystalline deposits on the internal surfaces.

It is additionally or alternatively also possible that the filter element forms the filter body, in this case the overall structure of the filter element is sufficiently solid to allow positioning of the filter element inside the crucible volume, in particular to attach the seed holder unit to the filter element.

According to a further preferred embodiment of the present invention a filter unit is arranged outside the crucible volume, in particular in the direction of the gas flow path behind the crucible gas outlet tube or as part of the crucible gas outlet tube for capturing at least $Si_2C$ sublimation vapor, $SiC_2$ sublimation vapor and Si sublimation vapor.

According to a further embodiment of the present invention additionally or alternatively a crucible gas flow unit is provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume and additionally or alternatively a filter unit for capturing at least $Si_2C$ sublimation vapor, $SiC_2$ sublimation vapor and Si sublimation vapor is provided, in particular inside the crucible volume, wherein the filter unit is highly preferably arranged between the crucible gas inlet tube and the crucible gas outlet tube.

According to a further embodiment of the present invention the gas flow path extends through the filter unit.

According to a further preferred embodiment of the present invention a filter unit is additionally or alternatively arranged outside the crucible volume, in particular in the direction of the gas flow path behind the crucible gas outlet tube or as part of the crucible gas outlet tube for capturing at least $Si_2C$ sublimation vapor, $SiC_2$ sublimation vapor and Si sublimation vapor.

According to a further preferred embodiment of the present invention a filter unit for capturing sublimation vapors is provided, wherein the filter unit preferably comprises a filter body, wherein the filter body preferably comprises a filter input surface for inputting $Si_2C$ vapor, $SiC_2$ vapor, Si vapor and one or multiple process gases, in particular argon and/or nitrogen, into the filter body and an output surface for outputting filtered process gases, wherein a filter element is preferably arranged between the filter input surface and the output surface, wherein the filter element forms a trapping section for adsorbing and condensing sublimation vapors, in particular Si vapor, wherein the filter unit preferably forms a filter outer surface, wherein the filter outer surface preferably comprises a filter outer surface covering element, wherein the filter outer surface covering element is preferably a sealing element, wherein the sealing element is preferably a filter coating, wherein the filter coating is preferably generated at the filter outer surface or attached to the filter outer surface or forms the filter outer surface.

The filter body is formed according to a further preferred embodiment of the present invention in an annular shape respectively forms an annular shape, wherein the filter outer surface preferably has a tubular shape and wherein the filter inner surface has a tubular shape, wherein the filter outer surface and the filter inner surface extend in vertical direction, in particular in an orthogonal angle to the horizontal axis. The filter unit comprises according to a further preferred embodiment of the present invention exactly one filter element, wherein the filter element is preferably fix coupled with the filter body or forms the filter body or wherein the filter element is preferably removably coupled with the filter body. The filter unit comprises according to a further preferred embodiment of the present invention a plurality of filter elements, in particular held by means of the filter body, and/or the filter unit is preferably formed by a plurality of filter sub-units, wherein each filter sub unit preferably comprises at least one filter element or forms one filter element. The filter unit forms according to a further preferred embodiment of the present invention a seed-holder-unit-attaching-section for attaching the seed holder unit and/or the filter unit preferably forms a crucible-lid-attaching-section for attaching a wall member of the crucible housing, in particular a crucible lid. The filter unit forms according to a further preferred embodiment of the present invention multiple filter sections for capturing sublimation vapors, wherein a first filter section is preferably formed to capture Si vapor and wherein a second filter section is preferably formed to capture $Si_2C$ vapor and/or $SiC_2$ vapor, wherein the first filter section and the second filter section differ in at least one and preferably in multiple properties selected from the list of properties: mass, height, density, surface area, material, thermal stability, volume, geometry and/or capacity. The distance between the filter outer surface and the filter inner surface differs according to a further preferred embodiment of the present invention on at least multiple different vertical positions between the filter input surface and the filter output surface or wherein the distance between the filter outer surface and the filter inner surface is preferably at least constant on the majority of vertical positions between the filter input surface and the filter output surface.

The filter element forms respectively defines according to a preferred embodiment of the present invention a gas flow path from the filter input surface to the output surface. The filter element has a height S1 and wherein the gas flow path respectively the filter-unit-gasflow-path through the filter element has a length S2, wherein S2 is preferably at least 10 times longer compared to S1, in particular S2 is at least 100 times longer compared to S1 or S2 is at least or up to 1,000 times longer compared to S1 or S2 is at least or up to 10,000 times longer compared to S1. This embodiment is beneficial since this torturous path through the filter unit allows for a high incidence of contact between the sublimation vapors and the high internal surface area of the filter and this high internal surface has a capacity to absorb or to trap more than or up to 50% (mass), in particular more than or up to 50% (mass) or more than or up to 70% (mass) or more than or up to 90% (mass) or more than or up to 95% (mass) more than or up to 99% (mass), of Si vapor generated by vaporization of the source material, in particular of the source material used respectively required during one run. "One run" preferably defines the generation respectively production of one crystal, in particular SiC crystal or SiC ingot or SiC boule, in particular the entire process between start and end of SiC crystal growth process, wherein during said process a SiC crystal preferably growth on a seed wafer, wherein the SiC crystal highly preferably has a mass of more than 1 kg or more than 5 kg or more than 10 kg or more than 50 kg or more than 100 kg at the end of the crystal growth process respectively at the end of the run.

The filter unit forms according to a further preferred embodiment of the present invention a SiC trapping section for adsorbing and condensing SiC species vapor and a Si trapping section for absorbing and condensing Si species vapor. The SiC trapping section is preferably formed and/or arranged in such a manner to adsorb and condense more SiC (mass) compared to Si (mass) and/or the Si trapping section is preferably formed and/or arranged in such a manner to adsorb and condense more Si (mass) compared to SiC (mass). The SiC trapping section is preferably arranged in a first temperature region and the Si trapping section is preferably arranged in a second temperature region, wherein the average temperature during operation of the furnace apparatus in the second temperature region is higher compared to the average temperature in the first temperature region, in particular at least 5° C. or preferably at least and highly preferably at least or up to 30° C. and most preferably at least or up to 50° C. higher. The filter unit is according to a further preferred embodiment of the present invention arranged between a first part of the housing of the crucible unit and a second part, in particular a crucible lid or filter lid, of the housing of the crucible unit. At least 50% (vol.), in particular at least 80% (vol.) or at least 90% (vol.), of the first part of the housing of the crucible unit is arranged in a vertical direction below the seed holder unit, wherein a first crucible volume is present between the first part of the housing of the crucible unit and the seed holder, wherein the first crucible volume can be operated such that at least 80% or preferably 90% or more preferably 100% of the first crucible volume is above the condensation temperature $T_c$ of silicon at the prevailing pressure. Alternatively, at least 50% (vol.), in particular at least 80% (vol.) or 90% (vol.), of the second part of the housing of the crucible unit is arranged in vertical direction above the seed holder unit. A second crucible volume or filter element is preferably present between the second part of the housing of the crucible unit and the seed holder. At least 60%, or preferably 80%, or more preferably 90% of the filter element is below the condensation temperature $T_c$. Thus, the thermal conditions within the filter element of the filter unit enable condensation of Si vapor. Thus, the filter element can condense respectively trap Si in a very effective manner.

The filter unit is according to a further preferred embodiment of the present invention arranged between a first wall part of the first part of the housing and a further wall part of the second part of the housing, wherein the filter body forms a filter outer surface, wherein the filter outer surface connects the first wall part of the first part of the housing and the further wall part of the second part of the housing, wherein the filter outer surface forms a portion of the outer surface of crucible unit. This embodiment is beneficial since a separate and disposable filter unit can be used yet forms an integral part of the crucible unit during operation and allows the crucible unit to have a fully sealed crucible housing.

The filter unit forms according to a further preferred embodiment of the present invention an overlapping region, wherein the overlapping region overlaps in vertical direction at least partially and preferably mainly and most preferably entirely a backside surface of the seed holder unit. The overlapping region preferably comprises or forms a heat dissipating means for dissipating heat radiated via the backside surface of the seed holder unit.

The filter outer surface comprises according to a further preferred embodiment of the present invention a filter surface covering element. The filter surface covering element is preferably a sealing element, wherein the sealing element is preferably a coating, wherein the coating is preferably generated at the filter surface or attached to the filter surface or forms the filter surface. The coating preferably comprises a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99,9% (mass), wherein the coating withstands temperatures above 2.000° C., in particular at least or up to 3,000° C. or at least up to 3,000° C. or up to 3,500° C. or at least up to 3,500° C. or up to 4,000° C. or at least up to 4,000° C.

The coating comprises a material or multiple materials selected from a group of materials at least comprising carbon, in particular pyrocarbon and glassy carbon. Thus, the coating is preferably a glassy carbon coating or a pyrocarbon coating or a glassy carbon undercoating and pyrocarbon top coating or a pyrocarbon undercoating and a glassy carbon top coating. Thus, the filter unit, in particular the outer surface of the filter unit is preferably coated with pyrocarbon and/or glassy carbon. The layer of pyrocarbon preferably has a thickness of more than or of up to 10 μm, in particular of more than or of up to 20 μm or of more than or of up to or of more than or of up to 100 μm of more than or of up to 200 μm of more than or of up to 500 μm. The layer of glassy carbon preferably has a thickness of more than or of up to 10 μm, in particular of more than or of up to 20 μm or of more than or of up to 50 μm or of more than or of up to 100 μm of more than or of up to 200 μm of more than or of up to 500 μm.

The filter body forms according to a further preferred embodiment of the present invention a filter inner surface. The filter inner surface respectively inner filter surface is preferably arranged in coaxial manner with respect to the filter outer surface. The filter body is preferably formed in a ring-shaped or annular manner. The filter outer surface has preferably a cylindrical shape and/or wherein the filter inner surface has preferably a cylindrical shape. The filter outer surface and the filter inner surface extend in a vertical direction. This embodiment is beneficial since the semiconductor industry is standardized on processing circular SiC wafers and the associated SiC crystals from which they are sliced are grown in a cylindrical shape in cylindrical crucibles. The growing crystal needs to radiate heat from its backside to the furnace housing with no heat absorbing material in between so that it can be at a lower temperature than the subliming source material and thus achieve a mass flux of sublimation species to its growth face. Thus an annularly shaped filter body is beneficial in that it can attach onto a crucible near its outer surface and a seed holder near its inner surface while still allowing the crystal backside to radiate heat directly to the furnace housing.

The filter inner surface comprises according to a further preferred embodiment of the present invention a further filter inner surface covering element. The further filter inner surface covering element is preferably a sealing element, wherein the sealing element is preferably a coating respectively a filter-coating. The coating is preferably generated at the filter surface or attached to the filter surface or forms the filter surface. The coating preferably comprises a material or a material combination that reduces leakage respectively for reducing leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular above 2200° C. or above 2,000° C., in particular at least or up to 3,000° C. or at least up to 3,000°

C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. Thus, the filter unit, in particular the inner surface of the filter unit is preferably coated with pyrocarbon and/or glassy carbon. The layer of pyrocarbon preferably has a thickness of more than or of up to 10 μm, in particular of more than or of up to 20 μm or of more than or of up to 50 μm or of more than or of up to 100 μm of more than or of up to 200 μm of more than or of up to 500 μm. The layer of glassy carbon preferably has a thickness of more than or of up to 10 μm, in particular of more than or of up to 20 μm or of more than or of up to 50 μm or of more than or of up to 100 μm of more than or of up to 200 μm of more than or of up to 500 μm.

The filter element comprises according to a further preferred embodiment of the present invention a filter element member, wherein the filter element member comprises filter particles and a binder. The filter particles comprise carbon or consist of carbon, wherein the binder holds the filter particles in fixed relative positions to each other. The filter particles withstand temperatures above 2,000° C., in particular above 2,000° C., in particular at least or up to 3,000° C. or at least up to 3,000° C. or up to 3,500° C. or at least up to 3,500° C. or up to 4,000° C. or at least up to 4,000° C. The binder withstands temperatures above 2,000° C., in particular 2,000° C., in particular at least or up to 3,000° C. or at least up to 3,000° C. or up to 3,500° C. or at least up to 3,500° C. or up to 4,000° C. or at least up to 4,000° C. This embodiment is beneficial since a filter unit is provided which withstands the conditions inside a crucible unit during operation of the furnace apparatus. Furthermore, due to the combination of filter particles and binder a surface is formed which is significantly larger compared to the outer surface of the filter unit, in particular up to or at least 10 times larger or up to or at least 100 times larger or up to or at least 1,000 times larger or up to or at least 10,000 times larger. This embodiment is further beneficial since the higher the internal surface area of the filter is the more sublimation species can be adsorbed and/or condensed in the filter and the filter unit has a capacity to absorb or to gather more than or up to 50% (mass), in particular more than or up to 50% (mass) or more than or up to 70% (mass) or more than or up to 90% (mass) or more than or up to 95% (mass) more than or up to 99% (mass), of Si vapor generated by vaporization of the source material, in particular of the source material used respectively required during one run.

The binder comprises according to a further preferred embodiment of the present invention starch or wherein the binder consists of modified starch and/or glassy carbon precursors such as phenol formaldehyde and/or furfuryl alcohol and/or polymers thereof.

This embodiment is beneficial, since such a binder withstands the high operating temperatures of the filter unit, in particular temperatures above 2,000° C., in particular at least or up to 3,000° C. or at least up to 3,000° C. or up to 3,500° C. or at least up to 3,500° C. or up to 4,000° C. or at least up to 4,000° C. The binder withstands temperatures above 2,000° C., in particular 2,000° C., in particular at least or up to 3,000° C. or at least up to 3,000° C. or up to 3,500° C. or at least up to 3,500° C. or up to 4,000° C. or at least up to 4,000° C.

The gas inlet is according to a further preferred embodiment of the present invention arranged between the receiving space and the seed holder unit, wherein the gas inlet is preferably in vertical direction arranged closer to the receiving space compared to the seed holder unit, in particular the vertical distance between the seed holder unit and the gas inlet is preferably more than 2 times the vertical distance between the receiving space and the gas inlet, in particular more than 5 times the vertical distance between the receiving space and the gas inlet or more than 8 times the vertical distance between the receiving space and the gas inlet or more than 10 times the vertical distance between the receiving space and the gas inlet or more than 20 times the vertical distance between the receiving space and the gas inlet. This embodiment is beneficial since a gas flow can be established which allows the inputted gas or gases to mix completely with the vaporizing source material and the resulting mixture to arrive at the seed wafer respective at the growth front of the crystal at a homogenous composition.

The gas inlet is covered according to a further preferred embodiment of the present invention by a gas guiding member respectively a gas distribution member. The gas distribution member preferably extends parallel to a bottom surface of the crucible unit, in particular the inner bottom surface of the crucible unit. Additionally, or alternatively the gas distribution member extends in a horizontal plane. This embodiment is beneficial since the introduced gas can be distributed in a homogeneous manner to the annular receiving space and therefore to the source material present in the receiving space or to the vaporized source material which flows out of the receiving space. The vaporized source material moves by thermally driven diffusion. Additionally, or alternatively the vaporized source material moves by convection from gas, in particular Ar and/or $N_2$, injected.

The gas distribution member is arranged according to a further preferred embodiment of the present invention in a defined distance to the bottom surface of the crucible unit, in particular the inner bottom surface of the crucible unit. The defined distance in vertical direction between the lower surface of the gas distribution member and the bottom surface of the crucible unit is preferably less than 0.5× vertical distance between the receiving space and the gas inlet (this means: less than half the vertical distance between the receiving space and gas inlet) or less than 0.3× vertical distance between the receiving space and the gas inlet or less than 0.1× vertical distance between the receiving space and the gas inlet or less than 0.05× vertical distance between the receiving space and the gas inlet.

The gas distribution member is according to a further preferred embodiment of the present invention a gas guiding plate. The gas guiding plate preferably forms a lower surface and an upper surface. The lower surface and the upper surface preferably extend at least sectionally in parallel to each other. The distance between the lower surface and the upper surface is preferably less than 0.5× distance between the receiving space and the gas inlet or less than 0.3× distance between the receiving space and the gas inlet or less than 0.1× distance between the receiving space and the gas inlet or less than 0.05× distance between the receiving space and the gas inlet. This embodiment is beneficial since a thin gas distribution plate can be used. This is beneficial since the gas distribution plate does not incorporate a significant amount of material which would alter the thermal field inside the crucible volume. Furthermore, the gas distribution plate does not affect heat radiated from a bottom section covered by the gas distribution plate.

In another preferred embodiment of the present invention, the gas inlet is positioned at the inner bottom surface of the crucible. A source material plate is positioned above the inner bottom surface of the crucible such that there is a plate gap between the bottom surface of the source material plate and the inner bottom surface of the crucible. This plate gap allows any incoming gas from the gas inlet to spread evenly underneath the source material plate. The upper surface of the source material plate defines the bottom of the source material receiving area and supports the weight of the source material. The source material plate has porous sections or holes to allow gas to pass through. Gas travels through the crucible unit according to the following path:

In through the gas inlet
through the gap
through the source material plate
through the source material
around the growing crystal
through the gap between the seed holder and the growth guide
through the filter unit
out the crucible vacuum outlet tube In a typical PVT crucible with no gas inlet and outlet and hence no active gas flow, the mass flux of the sublimation species is driven primarily by thermal diffusion. Sublimation species travel in a direction away from areas of high temperature toward areas of lower temperature. The greater the temperature difference, the faster the species diffuse. If the typical PVT system was a perfectly closed system where no sublimation species were escaping the crucible volume and the source material was the coldest area, the partial pressures of the sublimation species would be reached and no further sublimation would occur. As it is, the typical PVT crucible is made of permeable graphite and the coldest areas are the seed holder and lid. Consequently substantial sublimation of the source material is achieved since Si vapor escapes the crucible volume through the permeable graphite walls and since $Si_2C$ and $SiC_2$ vapors condense on the seed and lid. Thus the typical PVT system can be described as a partially closed system.

By contrast, the crucible unit of the present invention can be described as a partially open system. A carrier gas such as argon is actively pumped through the crucible volume by means of the gas inlet tube, the highly permeable filter, and the vacuum outlet tube. This creates a convective force which augments the thermal diffusion force and substantially increases the sublimation rate of the source material, the mass flux of sublimation species to the crystal and the growth rate of the crystal.

In a further embodiment of the present invention the source material is heated to a higher temperature than that of the typical PVT furnace. For example, it is heated to 2,500° C. compared to approximately 2,000° C. for the typical PVT furnace. At this higher temperature, more of the source material sublimes as $Si_2C$ and $SiC_2$ and less as Si. This has the dual benefit of increasing the mass flux of SiC species to the crystal thus increasing growth rate and reducing the amount of Si vapors that need to be contained and absorbed and condensed by the filter unit.

However, operating the crucible unit at higher than typical temperatures and with active carrier gas flow increases the risk of particulates from the crucible components and the source material being entrained into the gas flow and attaching to the growing crystal where they can form defects such as micropipes. To counter this possibility, the crucible components of the present invention can preferably be made from materials that are less likely to release particulates including graphite coated with tantalum carbide, or pyrocarbon and/or glassy carbon, or solid glassy carbon or solid tantalum carbide. Likewise, the source material of the present invention can preferably be in a granular format rather than a powder format, with granules of average diameter of at least 1 mm which have been washed to remove any surface fines.

The leak prevention means is according to a further preferred embodiment of the present invention a pressure unit for setting up a first pressure inside the crucible unit and a second pressure inside the furnace but outside the crucible unit, wherein the second pressure is higher than the first pressure and wherein the second pressure is below 200 Torr respectively 26664.5 Pa, in particular below 100 Torr respectively 13332.2 Pa or below 50 Torr respectively 6666.12 Pa, in particular between 0.01 Torr respectively 1,333224 Pa and 30 Torr respectively 3999.67 Pa. The second pressure is preferably up to 10 Torr respectively 1333.22 Pa or up to 20 Torr respectively 2666.45 Pa or up to 50 Torr respectively 6666.12 Pa or up to 100 Torr respectively 13332.2 Pa or up to 180 Torr respectively 23998 Pa higher compared to the first pressure. This embodiment is beneficial since due to the higher pressure around the crucible unit leakage of Si vapor is prevented.

A pipe system is according to a further preferred embodiment of the present invention part of the furnace apparatus. The pipe system preferably comprises a first pipe respectively a crucible pipe respectively a crucible gas outlet tube connecting the crucible volume with a vacuum unit and a second pipe respectively a furnace pipe connecting the part of the furnace which surrounds the crucible unit to the vacuum unit. The vacuum unit preferably comprises a control element for controlling the pressure inside the crucible volume and the pressure in the part of the furnace which surrounds the crucible unit. The vacuum unit preferably reduces pressure inside the crucible volume via the crucible pipe respectively the crucible gas outlet tube or inside the part of the furnace which surrounds the crucible unit via the furnace pipe in case the control element determines that the pressure inside the crucible volume is above a first threshold and/or in case the control element determines that the pressure inside the part of the furnace which surrounds the crucible unit is above a second threshold. This embodiment is beneficial since the pressure difference between the pressure inside the crucible volume and the pressure inside the furnace and around the crucible volume can be controlled. Thus, the control element can be configured to control pressure inside the part of the furnace which surrounds the crucible unit and/or inside the crucible volume.

According to a further preferred embodiment of the present invention a pressure unit for setting up a crucible volume pressure inside the crucible volume and a furnace volume pressure inside the furnace volume but outside the crucible housing is provided. During the growth phase of the run when the source material is subliming and the crystal is growing, the crucible volume pressure is preferably below 500 Torr respectively 66661.2 Pa, or preferably below 350 Torr respectively 46662.8 Pa, or more preferably below 300 Torr respectively 39996.7 Pa, in particular in a range between 20 Torr respectively 2666.45 Pa and 300 Torr respectively 39996.7 Pa or between 30 Torr respectively 3999.67 Pa and 250 Torr respectively 33330.6 Pa, and wherein during this time, the furnace volume pressure is higher than the crucible volume pressure, wherein the furnace volume pressure is preferably more than 1 Torr respectively 133,322 Pa or highly preferably more than 5 Torr respectively 666,612 Pa or most preferably more than 10 Torr respectively 1333.22 Pa or more than 20 Torr respectively 2666.45 Pa higher compared to the crucible volume pressure.

Thus, the pressure unit is preferably configured to cause crucible volume pressure below 66661.2 Pa or in a range between 2666.45 Pa and 39996.7 Pa, and to cause furnace volume pressure of more than 133,322 Pa or highly preferably more than 666,612 Pa higher compared to the crucible volume pressure.

The furnace apparatus comprises according to a further preferred embodiment of the present invention two or more than two leak prevention means of the group of leak prevention means. This embodiment is beneficial since multiple leak prevention means can be more effective than one. The furnace apparatus comprises at least the covering element and/or the density increasing element and the filter unit for capturing gaseous Si or since the furnace apparatus comprises at least the covering element and/or the density increasing element and the pressure unit for setting up the first pressure inside the crucible unit and the second pressure inside the furnace but outside the crucible unit or since the furnace apparatus comprises at least the pressure unit for setting up the first pressure inside the crucible unit and the second pressure inside the furnace but outside the crucible unit and the filter unit.

However, it is also possible that the furnace apparatus comprises at least the covering element and/or the density increasing element and the filter unit for capturing gaseous Si and the pressure unit for setting up the first pressure inside the crucible unit and the second pressure inside the furnace but outside the crucible unit This embodiment is beneficial since leakage of Si vapor can be prevented in several ways, thus it is possible to set up the furnace apparatus according to the present invention to fulfill requirements in dependency of different needs.

The heating unit comprises according to a further preferred embodiment of the present invention at least one, in particular horizontal, heating element, wherein the heating element is arranged in vertical direction below the receiving space. Thus, the heating element preferably underlaps at least partially and preferably mainly or completely the receiving space. This embodiment is beneficial since the receiving space and the part of the crucible volume or crucible housing surrounded by the receiving space can be heated from below the crucible volume thus creating an axial thermal gradient within the crucible volume. This is beneficial since the height of the receiving space and the height of the part of the crucible volume or crucible housing surrounded by the receiving space are the same in case of a seed wafer having a small diameter or in case of a larger diameter. Thus, the source material can be heated in a homogeneous manner. The heating unit preferably also comprises at least one further, in particular vertical, heating element, wherein the further heating element is preferably arranged around the crucible unit, in particular around a side wall of the crucible unit. The heating element and/or the further heating element is preferably arranged inside the furnace but outside the crucible unit, in particular outside the crucible volume.

The receiving space is formed according to a further preferred embodiment of the present invention in a wall portion of the crucible unit or arranged on a wall or bottom section inside the crucible unit. The receiving space preferably extends around a central axis, wherein the central axis preferably extends coaxially to a central axis of the seed holder unit. The receiving space is preferably arranged from the center axis or in a defined distance from the central axis.

A gas pipe or gas conducting means for introducing gas into the crucible unit is provided according to a further preferred embodiment of the present invention. The gas pipe or gas conducting means respectively a section of the gas pipe or gas conducting means or a gas inlet attached to the gas pipe or gas conducting means or a part of the gas pipe or gas conducting means is at least partially and preferably mainly or completely surrounded by the receiving space. The gas pipe or gas conducting means preferably extends at least partially in the direction of the central axis. The gas pipe or gas conducting means preferably enters the crucible volume through a bottom part of the crucible unit respectively through a bottom part of the crucible housing of the crucible unit. This embodiment is beneficial since via one gas pipe or gas conducting means gas can be provided to the crucible volume such that convective gas flow can be established in the same direction as thermal diffusion gas flow. Furthermore, since the gas inlet is surrounded by the receiving space the gas introduced via the gas inlet can be distributed to the different parts of the receiving space, in particular homogeneously. Thus, a mixture of introduced gas and vaporized source material can be generated, in particular in a homogeneously manner.

The receiving space has according to a further preferred embodiment of the present invention an annular shape. The receiving space is preferably shaped or formed as a trench, in particular a circular trench, or by multiple recesses, in particular circular recesses. Said multiple recesses are preferably arranged along a predefined contour, wherein the predefined contour is preferably formed circular. This embodiment is beneficial since the seed wafer preferably has a circular shape. Thus, the vaporized source material approaches the growth face of the seed wafer or a growth surface of the growing crystal in a proportional manner.

The defined distance between the receiving space and the central axis is according to a further preferred embodiment of the present invention up to 30% or up to 20% or up to 10% or up to 5% or up to 1% shorter than the radius of the defined seed wafer. Alternatively, the defined distance between the receiving space and the central axis is up to 1% or up to 5% or up to 10% or up to 20% or up to 30% longer than the radius of the defined seed wafer. Alternatively, the defined distance between the receiving space and the central axis matches with the radius of the defined seed wafer. This embodiment is beneficial since it further supports homogeneous distribution of vaporized source material over the growth face of the seed wafer or over a growth surface of the growing crystal.

In another preferred embodiment of the present invention, the defined distance between the receiving space and the center axis is zero and thus the source material fills the entire bottom of the crucible.

The receiving space surrounds according to a further preferred embodiment of the present invention a bottom section of the housing respectively surrounds a section above the bottom of the housing. The bottom section is a solid material section. The solid material section respectively a crucible solid bottom section preferably has a height (in vertical direction) respectively a wall thickness which is higher than 0.3× the smallest distance between the receiving space and the central axis or which is higher than 0.5× the smallest distance between the receiving space and the central axis or 0.7× the smallest distance between the receiving space and the central axis or which is higher than 0.9× the smallest distance between the receiving space and the central axis or 1.1× the smallest distance between the receiving space and the central axis or which is higher than 1.5× the smallest distance between the receiving space and the central axis. This embodiment is beneficial since the bottom section respectively the surrounded bottom section can be heated by the heating unit. In case the bottom section is heated it heats the space between the seed wafer and also the seed wafer. Since the bottom section is preferably a solid block of material respectively a crucible solid bottom section heating of the space between the seed wafer and the bottom section and heating the seed wafer or the growth face of the growing crystal happens in a homogeneous manner. The bottom section preferably has an outer surface section which is preferably a surface section of the crucible housing and an inner surface section, wherein the inner surface section is preferably parallel to the outer surface section. This is beneficial since the bottom section can be homogeneously heated. The inner surface section of the bottom section is preferably a flat surface, wherein the flat surface is preferably arranged in horizontal plane. The inner surface section is preferably arranged in parallel to the surface of the seed wafer. This embodiment is beneficial since the space between the seed wafer and the bottom section and the seed wafer and/or the growth face of the growing crystal can be heated in a homogeneous manner.

Thus, the bottom section comprises an inner surface, wherein the inner surface of the bottom section is arranged inside the crucible volume and preferably in parallel to the seed holder unit. The center of the inner surface and the center of the seed holder unit are preferably arranged on the same vertical axis, wherein a distance between the inner surface of the bottom section is preferably arranged in a predefined distance to the seed holder unit. The distance is preferably higher than 0.5× the smallest distance between the receiving space and the central axis or higher than 0.7× the smallest distance between the receiving space and the central axis or higher than 0.8× the smallest distance between the receiving space and the central axis or higher than 1× the smallest distance between the receiving space and the central axis or higher than 1.2× the smallest distance between the receiving space and the central axis or higher than 1.5× the smallest distance between the receiving space and the central axis or higher than 2× the smallest distance between the receiving space and the central axis or higher than 2.5× the smallest distance between the receiving space and the central axis. This embodiment is beneficial since large (wide and/or long) crystals can be grown.

The filter unit is arranged in vertical direction above the receiving space. This embodiment is beneficial since the vaporized source material and/or the introduced gas flows from a lower crucible section to an upper crucible section, thus the filter unit is preferably arranged in the gas flow path.

The filter unit and the receiving space are according to a further preferred embodiment of the present invention preferably arranged coaxial. This embodiment is beneficial since vaporized source material and/or introduced gas, respectively a mixture of vaporized source material and introduced gas, can pass the side wall, which is preferably of a cylinder shape, in a homogeneous manner. Thus, aggregations of vaporized source material and/or introduced gas can be prevented. This is beneficial since it allows the crystal to grow in a homogeneous manner. Homogeneous growth preferably means that the growth speed is on all surface parts of the growth face of the crystal are within a defined range and/or the accumulation of defects and/or doping is uniformly distributed, wherein the term "uniformly distributed" defines an admissible ranged of deviations.

An outer diameter of the filter unit corresponds according to a further preferred embodiment of the present invention to an outer diameter of the receiving space and/or wherein an inner diameter of the filter unit preferably corresponds to an inner diameter of the receiving space. This embodiment is beneficial since the shape of the housing does not cause significant complexity and therefore allows cost effective manufacturing. The outer diameter of the filter unit is preferably at least or up to 1.05× larger compared to the outer diameter of the receiving space or wherein the outer diameter of the filter unit is preferably at least or up to 1.1× larger compared to the outer diameter of the receiving space or wherein the outer diameter of the filter unit is preferably at least or up to 1.3× larger compared to the outer diameter of the receiving space or wherein the outer diameter of the filter unit is preferably at least or up to 1.5× larger compared to the outer diameter of the receiving space. Alternatively the outer diameter of the receiving space is preferably at least or up to 1.05× larger compared to the outer diameter of the filter unit or wherein the outer diameter of the receiving space is preferably at least or up to 1.1× larger compared to the outer diameter of the filter unit or wherein the outer diameter of the receiving space is preferably at least or up to 1.3× larger compared to the outer diameter of the filter unit or wherein the outer diameter of the receiving space is preferably at least or up to 1.5× larger compared to the outer diameter of the filter unit. Additionally or alternatively the inner diameter of the receiving space is preferably at least or up to 1.05× larger compared to the inner diameter of the filter unit or wherein the inner diameter of the receiving space is preferably at least or up to 1.1× larger compared to the inner diameter of the filter unit or wherein the inner diameter of the receiving space is preferably at least or up to 1.3× larger compared to the inner diameter of the filter unit or wherein the inner diameter of the receiving space is preferably at least or up to 1.5× larger compared to the inner diameter of the filter unit. Alternatively the inner diameter of the filter unit is preferably at least or up to 1.05× larger compared to the inner diameter of the receiving space or wherein the inner diameter of the filter unit is preferably at least or up to 1.1× larger compared to the inner diameter of the receiving space or wherein the inner diameter of the filter unit is preferably at least or up to 1.3× larger compared to the inner diameter of the receiving space or wherein the inner diameter of the filter unit is preferably at least or up to 1.5× larger compared to the inner diameter of the receiving space.

A growth guide element is arranged respectively provided according to a further preferred embodiment of the present invention in vertical direction above the receiving space to guide vaporized source material and/or introduced gas into a space between the seed holder unit and the inner bottom surface of the crucible unit. This embodiment is beneficial since the growth guide element enhances crystal growth efficiency, quality, and shape. On the one hand the growth guide element guides the vaporized source material to the seed wafer respectively the growing crystal to increase the amount of monocrystal grown relative to the amount of source material vaporized by minimizing parasitic polycrystalline deposition on the upper areas of the crucible unit. On the other hand, the growth guide element creates a zone of no deposition which prevents the polycrystalline growth from contacting the monocrystalline growth and causing defects in the latter. In some cases, the growth guide can also be used to achieve diameter expansion of the crystal by affecting its growth direction. The growth guide element comprises according to a further preferred embodiment of the present invention a first wall section respectively a growth guide first section and a second wall section respectively a growth guide second section. The growth guide first section is preferably shaped to match with a corresponding wall section of the crucible housing. Matching preferably means in this context that the wall section of the crucible housing and the growth guide element are preferably coupled by means of a form closure and/or press fit connection. The growth guide second section is preferably formed to manipulate the shape of a growing crystal. The growth guide first section and the growth guide second section are according to a further preferred embodiment of the present invention arranged coaxially. The growth guide first section is arranged in a first diameter to the center axis and wherein the growth guide second section is arranged in a second diameter to the center axis, wherein the first diameter is larger compared to the second diameter. The growth guide first section and the growth guide second section are connected with each other by means of a third wall section respectively a growth guide third section, wherein the growth guide third section at least partially extends in horizontal direction. The growth guide first section and the growth guide third section form an arc shaped section respectively a growth guide fourth section and/or wherein the growth guide second section and the growth guide third section are arranged in an angle between 60° and 120°, in particular in an angle between 70° and 110°, in particular in an angle of 90°. The growth guide fourth section can have e.g. a convex or concave or conical shape. The first wall section, the growth guide second section and the growth guide third section are preferably integral parts of the growth guide. The growth guide preferably comprises graphite. This embodiment is beneficial since the growth guide element has a simple but effective shape. Thus, the growth guide element can be manufactured in a cost-effective manner.

The outer diameter of the filter unit is according to a further preferred embodiment of the present invention at least or up to 1.05× larger compared to the first diameter of the growth guide element or wherein the outer diameter of the filter unit is preferably at least or up to 1.1× larger compared to the first diameter of the growth guide or wherein the outer diameter of the filter unit is preferably at least or up to 1.3× larger compared to the first diameter of the growth guide or wherein the outer diameter of the filter unit is preferably at least or up to 1.5× larger compared to the first diameter of the growth guide and/or wherein the second diameter of the growth guide is preferably at least or up to 1.05× larger compared to the inner diameter of the filter unit or wherein the second diameter of the growth guide is preferably at least or up to 1.1× larger compared to the inner diameter of the filter unit or wherein the second diameter of the growth guide is preferably at least or up to 1.3× larger compared to the inner diameter of the filter unit or wherein the second diameter of the growth guide is preferably at least or up to 1.5× larger compared to the inner diameter of the filter unit.

Wherein the growth guide upper vertical end of the growth guide second section and the seed holder unit form a gas flow passage, wherein the smallest distance between the growth guide upper vertical end of the growth guide second section and the seed holder unit is smaller than 0.3× second diameter of the growth guide or smaller than 0.1× second diameter of the growth guide or smaller than 0.08× second diameter of the growth guide or smaller than 0.05× second diameter of the growth guide or smaller than 0.03× second diameter of the growth guide or smaller than 0.01× second diameter of the growth guide. The gap between the growth guide upper vertical end and the seed is preferably 1 mm, or 2 mm, or 3 mm, or 4 mm, or 5 mm.

The coating is according to a further preferred embodiment of the present invention preferably applied to the receiving space, in particular the surface of the receiving space inside the crucible volume and/or to the growth guide element respectively growth guide plate respectively gas distribution plate. The coating preferably comprises a material or a material combination that reduces permeability of Si vapor to $10^{-3}$ $m^2/s$, or preferably $10^{-11}$ $m^2/s$, or more preferably $10^{-12}$ $m^2/s$, through the wall parts defining the receiving space and/or through the wall parts defining the growth guide element.

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. This embodiment is beneficial since a modified receiving space and/or growth guide element has at least two layers of material, wherein one layer forms the structure of the receiving space and/or the growth guide element and wherein the other layer reduces or avoids permeability of Si vapor at the required operating temperatures of the crucible unit. The coating highly preferably comprises a material or multiple materials selected from a group of materials at least comprising carbon, in particular pyrocarbon and glassy carbon. Thus, the receiving space and/or the growth guide element is preferably coated with pyrocarbon and/or glassy carbon. The layer of pyrocarbon preferably has a thickness of more than or of up to 10 μm, in particular of more than or of up to 20 μm or of more than or of up to 50 μm or of more than or of up to 100 μm of more than or of up to 200 μm of more than or of up to 500 μm. The layer of glass carbon preferably has a thickness of more than or of up to 10 μm, in particular of more than or of up to 20 μm or of more than or of up to 50 μm or of more than or of up to 100 μm of more than or of up to 200 μm of more than or of up to 500 μm. The coating is generated according to a further preferred embodiment by chemical vapor deposition or wherein the coating is generated by painting, in particular of a precursor material, in particular phenol formaldehyde, and pyrolyzing after painting. This embodiment is beneficial since the coating can be generated in a reliable manner and this approach is more economical than making the housing entirely out of the covering material.

The heating unit comprises according to a further preferred embodiment of the present invention at least one heating element. The heating element is preferably arranged in vertical direction below the receiving space and/or below a bottom section of the crucible unit, wherein the bottom section of the crucible unit is surrounded by the receiving space. This embodiment is beneficial since the receiving space and/or the bottoms section surrounded by the receiving space can be heated by the heating element such that an axial thermal gradient can be formed. The heating element preferably at least partially and preferably to more than 50% or to more than 70% or up to 90% or completely underlaps the receiving space and/or the bottom section surrounded by the receiving space. This embodiment is beneficial since a homogeneous radial temperature distribution can be generated, in particular planes of homogeneous temperature can be generated in the radial direction with a temperature gradient going from hot to less hot in the upward axial direction.

The furnace apparatus comprises according to a further preferred embodiment of the present invention a gas flow unit. The gas flow unit preferably comprises a gas inlet for conducting gas into the crucible unit respectively into the crucible volume and a gas outlet for removing gas from the crucible unit respectively from the crucible volume. The gas inlet is preferably arranged closer to the bottom of the crucible unit compared to the gas outlet. Both the gas inlet and the gas outlet are preferably arranged inside the crucible volume. This embodiment is beneficial since the conditions inside the crucible volume and/or the vapor composition and/or fluid flow (direction and/or speed) inside the crucible can be affected respectively controlled.

The gas outlet comprises according to a further preferred embodiment of the present invention a gas conducting means, in particular a pipe. The gas outlet preferably comprises a sensor, in particular a temperature and/or pressure sensor, wherein the sensor is preferably arranged inside the conducting means, in particular a pipe, or as part of the conducting means, in particular a pipe, or attached to an outside wall of the conducting means, in particular a pipe. This embodiment is beneficial since the temperature conditions and/or pressure conditions can be monitored.

Additionally, or alternatively the gas inlet comprises according to a further preferred embodiment of the present invention a gas conducting means, in particular a pipe. The gas inlet preferably comprises a sensor, in particular a temperature and/or pressure sensor, wherein the sensor is preferably arranged inside the conducting means, in particular a pipe, or as part of the conducting means, in particular a pipe, or attached to an outside wall of the conducting means, in particular a pipe. This embodiment is beneficial since the temperature conditions and/or pressure conditions can be monitored.

The sensor in the gas inlet and/or gas outlet is according to a further preferred embodiment of the present invention a pyrometer. This embodiment is beneficial since the pyrometer is a remote-sensing device that can measure temperatures from a safe distance and the operating temperatures of the crucible unit are typically too high for measurement with a direct-sensing device such as a thermocouple.

The sensor in the gas inlet and/or gas outlet is according to a further preferred embodiment of the present invention in connection with a control unit respectively the control element. This embodiment is beneficial since the control unit respectively the control element receives sensor signals or sensor data. Thus, the control unit respectively the control element can output conditions inside the crucible unit, in particular in dependency of a time stamp, to an operator for supervising the production respectively growth process. Additionally, or alternatively the control unit respectively the control element can be equipped with control rules to control the furnace apparatus in dependency of the control rules, the time and/or the sensor output.

The receiving space is formed according to a further preferred embodiment of the present invention by one or at least one continuous trench or multiple recesses. The trench or the recesses preferably at least partially and preferably substantially or preferably completely surround a surface arranged or provided or materialized inside the crucible unit, in particular an inner surface of a wall and/or bottom section of the crucible unit, wherein the receiving space preferably has an annular shape. The heating element preferably underlaps at least 30% or at least 40% or at least 50% or at least 60% or at least 70% or at least 80% or at least 90% or at least 95% of a bottom surface of the receiving space and at least 20% or at least 30% or at least 40% or at least 50% or at least 60% or at least 70% or at least 80% or at least 90% or at least 95% of the surface which is at least partially surrounded by the receiving space. The surface which is at least partially surrounded by the receiving space preferably belongs to a solid wall respectively a crucible bottom wall respectively bottom section which extends at least a distance V1 in vertical direction wherein the receiving space extends a distance V2 in vertical direction between a receiving space bottom surface and a top of the lowest side wall member of the receiving space, wherein V2>V1 (this means: distance V2 is larger compared to distance V1), in particular V2>1.1×V1 or V2>1.2×V1 or V2>1.5×V1 or V2>2 xV1, or V2=V1 or V2<V1, in particular V2<1.1×V1 or V2<1.2×V1 or V2<1.5×V1 or V2<2 xV1.

Thus, the receiving space preferably surrounds a bottom section of the housing, in particular comprising the surface surrounded by the receiving space. The bottom section is preferably a solid material section. The crucible solid bottom section has preferably a height (in vertical direction) which is higher than 0.3× the smallest distance between the receiving space and the central axis or which is higher than 0.5× the smallest distance between the receiving space and the central axis or 0.7× the smallest distance between the receiving space and the central axis or which is higher than 0.9× the smallest distance between the receiving space and the central axis or 1.1× the smallest distance between the receiving space and the central axis or which is higher than 1.5× the smallest distance between the receiving space and the central axis.

The bottom section comprises according to a further preferred embodiment of the present invention an inner surface respectively the surface surrounded by the receiving space. The inner surface of the bottom section is arranged inside the crucible volume and preferably in parallel to the seed holder unit. The center of the inner surface and the center of the seed holder and/or the center of a seed wafer held by the seed holder unit are preferably arranged on the same vertical axis. The inner surface of the bottom section is preferably arranged in a predefined distance to the seed holder unit. The distance is higher preferably than 0.5× the smallest distance between the receiving space and the central axis or higher than 0.7× the smallest distance between the receiving space and the central axis or higher than 0.8× the smallest distance between the receiving space and the central axis or higher than 1× the smallest distance between the receiving space and the central axis or higher than 1.2× the smallest distance between the receiving space and the central axis or higher than 1.5× the smallest distance between the receiving space and the central axis or higher than 2× the smallest distance between the receiving space and the central axis or higher than 2.5× the smallest distance between the receiving space and the central axis. This embodiment is beneficial since the crucible volume has at least in sections and preferably mainly or completely an axisymmetric shape which supports homogeneous distribution of vaporized source material to the seed wafer or growing crystal.

The surface surrounded by the receiving space has according to a further preferred embodiment of the present invention at least a size of 0.5× the size of the top surface of the defined seed wafer or has at least a size of 0.8× the size of the top surface of the defined seed wafer or has at least a size of 0.9× the size of the top surface of the defined seed wafer or has at least a size of 1× the size of the top surface of the defined seed wafer or has at least a size of 1.1× the size of the top surface of the defined seed wafer. Additionally, or alternatively the center of the surface surrounded by the receiving space and the center of the top surface of the defined seed wafer are preferably arranged on the same vertical axis. Additionally, or alternatively the surface surrounded by the receiving space and the top surface of the defined seed wafer are preferably arranged in parallel to each other. This embodiment is beneficial since a distribution of heat via the surface surrounded by the receiving space can be carried out in a homogeneous manner.

In another preferred embodiment of the present invention, the defined distance between the receiving space and the center axis is zero and thus the source material fills the entire bottom of the crucible. A control unit respectively the control element is provided according to a further preferred embodiment of the present invention for controlling the pressure level inside the crucible unit and/or furnace and/or for controlling gas flow into the crucible unit and/or for controlling the heating unit. The heating unit is preferably controlled to establish an isotherm temperature profile parallel to the holder unit respectively orthogonal to the vertical direction respectively horizontal. This embodiment is beneficial since the control unit respectively the control element might use predefined rules and/or sensor data or sensor signals to monitor the growth process and to modify operation parameters of one or multiple of the before mentioned units to control crystal growth.

A filter unit is provided according to a further preferred embodiment of the present invention. The filter unit preferably surrounds the seed holder unit and/or wherein the filter unit is preferably at least partially arranged above the seed holder unit, in particular at least 60% (vol.) of the filter unit are arranged above the seed holder unit. The filter unit comprises a filter body, wherein the filter body comprises a filter input surface for inputting gas comprising Si vapor into the filter body and an output surface for outputting filtered gas, wherein the filter input surface is preferably arranged in vertical direction on a level below the level of the output surface. At least one or exactly one filter element is arranged between the filter input surface and the output surface. It is possible that the filter element forms the filter input surface and/or the output surface. The filter element preferably forms a trapping section for adsorbing and condensing Si vapor. This embodiment is beneficial since Si vapor can be captured inside the filter element and therefore reduces damage to furnace unit components that can caused by Si vapor. The trapping section preferably comprises at least or up to 50% (vol.) of the filter element volume or at least or up to 80% (vol.) of the filter element volume or at least or up to 90% (vol.) of the filter element volume. Thus, it is possible that 1%-50% (vol) or 10%-50% (vol.) or 1%-30% (vol.) of the filter element volume is a vapor section respectively a section in which the vaporized source material is present in a vapor configuration.

The filter element forms according to a further preferred embodiment of the present invention a gas flow path from the filter input surface to the output surface. The filter element preferably has a height S1 and the gas flow path through the filter element has a length S2, wherein S2 is at least 10 time longer compared to S1, in particular S2 is 100 times longer compared to S1 or S2 is 1,000 times longer compared to S1. This embodiment is beneficial since the filter element comprises sufficient internal surface area to adsorb and condense all Si vapor generated during one run respectively during growth of one crystal, in particular SiC crystal. Thus, the filter element preferably forms a porous high surface area for trapping Si sublimation vapor during PVT growth, in particular of SiC single crystals, in particular SiC of a second type compared to the SiC source material. The filter element preferably comprises a material having a surface are of at least 1 $m^2/g$, or preferably of at least 10 $m^2/g$, or highly preferably of at least 100 $m^2/g$ or most preferably of at least 1000 $m^2/g$. The filter unit is according to a further preferred embodiment of the present invention arranged between a first part of the housing of the crucible unit and a second part of the housing of the crucible unit. At least 50% (vol.), in particular at least 80% (vol.) or 90% (vol.), of the first part of the housing of the crucible unit is arranged in vertical direction below the seed holder unit. A first crucible volume is present between the first part of the housing of the crucible unit and the seed holder, wherein the first crucible volume can be operated such that at least 80% or preferably 90% or more preferably 100% of the first crucible volume is above the condensation temperature $T_c$ of silicon at the prevailing pressure. Additionally, up to 50% (vol.) or up to 20% (vol.) or up to 10% (vol.) of the first part of the housing of the crucible unit is arranged in vertical direction above the seed holder unit. Alternatively, at least 50% (vol.), in particular at least 80% (vol.) or 90% (vol.), of the second part of the housing of the crucible unit is arranged in vertical direction above the seed holder unit. A second crucible volume is preferably present between the second part of the housing of the crucible unit and the seed holder. At least 60%, or preferably 80%, or more preferably 90% of the filter element is below the condensation temperature $T_c$. This embodiment is beneficial since the source material is vapor respectively vaporized if at or above $T_c$ and is condensate respectively condenses if at or below $T_c$. Thus, the fact that Si vapor condenses below a specific temperature can be used to trap condensed Si in the filter element. Therefore, the filter element is highly effective.

The filter unit is arranged according to a further preferred embodiment of the present invention between a first wall part of the first part of the housing and a further wall part of the second part of the housing. The filter body preferably forms a filter outer surface. The filter outer surface preferably connects the first wall part of the first part of the housing and the further wall part of the second part of the housing. The filter outer surface preferably forms a portion of the outer surface of crucible unit. This embodiment is beneficial since the filter unit can be arranged in such a manner that it increases the volume of the crucible unit without requiring one or multiple additional crucible housing components.

The filter outer surface comprises according to a further preferred embodiment of the present invention a filter outer surface covering element. The filter outer surface covering element is preferably a sealing element. The sealing element is preferably a coating. The coating is preferably generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. This embodiment is beneficial since the filter unit can also form an outer barrier of the crucible unit. Thus, the filter unit preferably absorbs respectively captures Si and preferably also prevents Si vapor leakage. The ash content of the filter element is preferably below 5% (mass) or below 1% (mass). This means that the less than 5% or less than 1% of the mass of the filter element is ash.

The filter body forms according to a further preferred embodiment of the present invention a filter inner surface. The filter inner surface is preferably arranged in coaxial manner with respect to the filter outer surface. The filter body is preferably formed in a ring-shaped manner. The filter outer surface has preferably a cylindrical shape and/or the filter inner surface has preferably a cylindrical shape. The filter outer surface and/or the filter inner surface has the longest extension in vertical direction or in circumferential direction. This embodiment is beneficial since the filter unit can be positioned in a simple manner due to its shape. Additionally, or alternatively the filter inner surface surrounds a space above the seed holder unit. The space surrounded by the seed holder unit can act as cooling space for cooling the filter element and/or for cooling the seed holder unit. A cooling unit can be provided wherein the cooling unit preferably comprises at least one cooling pipe for guiding a cooling liquid. Said cooling pipe can be arranged to at least partially or at least mainly (more than 50% in circumferential direction) or completely surrounds the crucible unit. Additionally, or alternatively the cooling pipe can be arranged inside the crucible volume in particular in the space surrounded by the filter inner surface. However, it is also possible that the cooling pipe extends from the outside of the crucible unit through a wall of the crucible unit and/or a wall of the filter unit into the crucible volume, in particular into the space which is surrounded by the filter inner surface. It is additionally possible that the cooling pipe extends to the outside of the furnace. This embodiment is beneficial since the temperature inside the crucible unit can be controlled in an advantageous manner. Furthermore, it is possible to setup a temperature distribution profile inside the crucible volume having a much steeper gradient compared to a situation without a cooling unit.

The filter inner surface comprises according to a further preferred embodiment of the present invention a further filter inner surface covering element. The further filter inner surface covering element is preferably a sealing element. The sealing element is preferably a coating, wherein the coating is preferably generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. This solution is beneficial since leakage of Si vapor into the space surrounded by the filter inner surface is prevented.

The filter element is preferably made of an active carbon block and/or one or multiple, in particular various, graphite foams including those made from carbonized bread and/or graphite rigid insulation and/or graphite flexible insulation.

The filter element comprises according to a further preferred embodiment of the present invention a filter element member. The filter element member preferably comprises filter particles and a binder. The filter particles preferably comprise carbon or consist of carbon. The binder preferably holds the filter particles in fixed relative positions to each other. The filter particles preferably withstand temperatures above 2,000° C., in particular at least or up to 3,000° C. or at least up to 3,000° C. or up to 3,500° C. or at least up to 3,500° C. or up to 4,000° C. or at least up to 4,000° C. The binder preferably withstands temperatures above 1800° C., in particular above 2,000° C., in particular up to or above 2,000° C., in particular at least or up to 3,000° C. or at least up to 3,000° C. or up to 3,500° C. or at least up to 3,500° C. or up to 4,000° C. or at least up to 4,000° C. This solution is beneficial since the solid filter element can maintain its structural integrity at the high operating temperatures of the crucible unit. The filter unit, in particular the filter element, is preferably a single use unit respectively element.

The binder comprises according to a further preferred embodiment of the present invention starch or wherein the binder consists of modified starch and/or glassy carbon precursors such as phenol formaldehyde and/or furfuryl alcohol and/or polymers thereof.

The furnace apparatus comprises according to a further preferred embodiment of the present invention a gas flow unit. The gas flow unit preferably comprises a gas inlet for conducting gas into the crucible unit and a gas outlet for removing gas from the crucible unit into the furnace or through the furnace to the outside of the furnace. The gas inlet is preferably arranged in gas flow direction before the filter unit, in particular before the filter input surface, in particular in gas flow direction before the receiving space, and wherein the gas outlet is arranged in gas flow direction after the filter unit. A filter-unit-gas-flow-path preferably extends from the filter input surface through the filter element to the filter output surface. Thus, a gas inlet is preferably arranged in a transformation zone within the crucible unit. The transformation zone preferably also comprises the seed holder unit and the receiving space. A source material can be transformed from a solid configuration into a vapor configuration and from the vapor configuration into a solid target body. The source material can be arranged inside the receiving space and wherein the solid target body can be held by the seed holder unit. The solid target body is a crystal, in particular a SiC crystal. Gas introduced via the gas inlet preferably mixes with the source material in the vapor configuration and/or during solidification. The gas outlet is preferably arranged in a trapping zone, wherein the trapping zone also comprises the output surface of the filter unit, wherein the gas composition in the trapping zone is preferably free of Si vapor respectively does not comprise Si vapor. The temperature in the trapping zone is preferably below the solidification temperature of gaseous Si respectively Si vapor. This embodiment is beneficial since the crystal growth process can be manipulated. It is e.g. possible to add one or multiple gases for doping the crystal. Additionally, or alternatively it is possible to modify, in particular to accelerate, the vapor transport from the receiving space to the seed wafer or crystal. Additionally, or alternatively the gas can be provided in a defined temperature or temperature range.

An inert gas, in particular argon, or a mixture of gases, in particular argon and nitrogen, can be introduced respectively is introduced via the gas inlet into the crucible unit, respectively into the crucible volume respectively into the transformation zone. The flowrate of the inert gas can be adjusted to optimize crystal growth parameters. The inert gas flow rate should be high enough to prevent any backward diffusion of sublimation species into the inlet tube and also to provide sufficient convective assistance to mass flux of sublimation species toward the crystal. However, the inert gas flow rate should not be so high as to cause entrainment of particulates which may incorporate into the crystal and cause defects, or be so high as to cause undesirable mass flux patterns that might for example cause plugging of the gap between the crystal and the growth guide. Suitable flowrates can be 100 $cm^3$/min or 200 $cm^3$/min, or 500 $cm^3$/min or 1,000 $cm^3$/min, or 2,000 $cm^3$/min, or 5,000 $cm^3$/min.

The size of the crucible housing can be configured respectively is modifiable according to a further preferred embodiment of the present invention. The crucible housing surrounds a first volume VI in a crystal growth configuration and the crucible housing surrounds a second volume VII in a coating regeneration configuration. The crystal growth configuration represents a configuration respectively a setting which is present during growth of a crystal respectively during solidification of vaporized source material at a seed wafer or at a growth front of a crystal growing at the seed wafer. The regeneration configuration represents a setting which is present in case no source material, seed holder, and seed wafer are provided and no crystal growth occurs. In the regeneration configuration the filter unit is preferably not part of the crucible unit and a lid which is arranged in the crystal growth configuration on top of the filter unit is preferably in contact with a side wall section of the crucible housing which is during the crystal growth configuration in contact with the lower end of the filter unit. Volume VI is preferably larger compared to volume VII, wherein volume VI is at least 10% or at least or up to 20% or at least or up to 30% or at least or up to 40% or at least or up to 50% or at least or up to 60% or at least or up to 70% or at least or up to 80% or at least or up to 100% or at least or up to 120% or at least or up to 150% or at least or up to 200% or at least or up to 250% larger than volume VII. This embodiment is beneficial since the crucible unit can be reconditioned after usage, in particular after one run or after several runs, in particular up to or at least three, up to or at least five or up to or at least ten runs. Thus, the overall service life of the crucible unit is very long. Thus, since also the heating unit can be used multiple times, a very cost-effective furnace apparatus is provided.

The housing preferably comprises in the crystal growth configuration at least one further wall member compared to the coating regeneration configuration. The further wall member is preferably a filter unit respectively the filter unit. The filter unit is removed in the coating regeneration configuration. A lower housing wall member of the housing, which is in the crystal growth configuration in contact with the filter unit and an upper housing wall member of the housing, which is in the crystal growth configuration in contact with the filter unit, are in contact with each other in the coating regeneration configuration. At least one gasket is preferably arranged between the lower housing wall member and the upper housing wall member in the coating regeneration configuration. In the crystal growth configuration at least one gasket is preferably arranged between the filter unit and the upper housing wall member and wherein at least one gasket is preferably arranged between the filter unit and the lower housing wall member. This embodiment is beneficial since leakage of gas respectively vapor is prevented in each configuration.

The crucible unit comprises according to a further preferred embodiment of the present invention in the coating regeneration configuration one or at least one receiving-space-gas-guiding-member. The receiving-space-gas-guiding-member extends into the receiving space to guide gas into the receiving space. This embodiment is beneficial since the gas which is introduced during the coating regeneration configuration more thoroughly contacts with the surface of the receiving space.

The gas inlet is according to a further preferred embodiment of the present invention arranged in a transformation zone within the crucible unit. The transformation zone preferably comprises the seed holder unit and/or the receiving space. This embodiment is beneficial since flow of vaporized source material and/or the composition of gas flowing upwards respectively from the receiving space to the seed wafer or growing crystal can be modified.

The receiving-space-gas-guiding-member preferably rests at least partially on the gas distribution member respectively wherein the gas distribution member preferably holds the receiving-space-gas-guiding-member, in particular by means of a form closure connection. This embodiment is beneficial since installation can be carried out in a fast and simple manner.

The receiving-space-gas-guiding-member preferably has an annular or circular shape. This embodiment is beneficial since the amount of vaporized source material better matches with the amount of vaporized material that solidifies at the seed wafer of crystal, compared to a different shape, like a rectangular receiving space shape. The receiving-space-gas-guiding-member preferably comprises carbon or consists of carbon and/or graphite.

The growth guide first section and the growth guide third section form according to a further preferred embodiment of the present invention, in particular on the underside, an growth guide fourth section and/or wherein the growth guide second section and the growth guide third section are arranged in an angle between 60° and 120°, in particular in an angle between 70° and 110°, in particular in an angle of 90°.

A grow-plate-gas-guide-member is preferably provided, for guiding gas to a surface on the upper side of the growth guide third section of the growth guide element. The grow-plate-gas-guide-member preferably has an annular or circular shape. The grow-plate-gas-guide-member is preferably arranged at the top respectively upper wall part of the housing. The grow-plate-gas-guide-member preferably comprises carbon or consists of carbon and/or graphite.

Thus, a method and reactor or furnace apparatus respectively apparatus for PVT growth of SiC single crystals preferably comprises of: Providing a furnace volume capable of housing a crucible unit, heaters, and insulation and/or providing a crucible unit with a lid inside the vacuum chamber and/or having a seed holder incorporated into or attached to the lid and/or having a SiC single crystal seed attached to the seed holder and/or having an axial heater positioned below the crucible unit such that radially flat temperature isotherms can be produced in the growing crystal and/or placing source material in the crucible unit such that there is no source material between the axial heat source and the seed and/or creating a vacuum in the crucible unit, heating and subliming the source material, and growing the crystal.

According to a further preferred embodiment of the present invention a gas-flowpath-boundary is formed or defined or provided or materialized between the crucible gas inlet tube and the crucible gas outlet tube for forming or defining or providing or materializing a gas flow path within the crucible housing.

According to a further preferred embodiment of the present invention the seed holder unit is arranged between the crucible gas inlet tube and the crucible gas outlet tube and forms a seed-holder-unit-gas-flow-path-boundary-section of the gas-flow-path boundary.

According to a further preferred embodiment of the present invention the receiving space is arranged or located between the crucible gas inlet tube and the seed holder unit for conducting gas flow around the receiving space and/or through the receiving space.

According to a further preferred embodiment of the present invention a source material holding plate respectively the gas distribution plate is provided (the terms "gas distribution plate" and "source material holding plate" can be preferably used synonymously), wherein the source material holding plate comprises an upper surface forming a bottom section of the receiving space and a lower surface forming a source-material-holding-plate-gas-flow-path-boundary-section.

According to a further preferred embodiment of the present invention the source-material-holding-plate comprises multiple through holes, wherein the multiple through holes extend from the upper surface of the source-material-holding-plate through a main body of the source-material-holding-plate to the lower surface of source-material-holding-plate.

According to a further preferred embodiment of the present invention at least the majority of the multiple through holes or each of the multiple through holes has a diameter of less than 12 mm, in particular less than 10 mm and preferably less than 6 mm and highly preferably less than 2 mm and most preferably of 1 mm or less than 1 mm. According to a further embodiment of the present invention the source-material-holding-plate preferably is a one-piece element or comprises multiple components, wherein said multiple components can be detachable coupled.

According to a further preferred embodiment of the present invention the number of through holes through the main body of the source-material-holding-plate, depends on the surface size of the upper surface of the source-material-holding-plate, wherein at least one though hole is provided per 10 $cm^2$ surface size of the upper surface.

According to a further preferred embodiment of the present invention the number of through holes per 10 $cm^2$ is higher in a radially outer section of the source-material-holding-plate compared to a radially inner section of the source-material-holding-plate, wherein the radially inner section extends up to 20% or 30% or 40% or 50% of the radial extension of the source-material-holding-plate, wherein the radially outer section of the source-material-holding-plate extends between the radially inner section and the radial end of the source-material-holding-plate.

According to a further preferred embodiment of the present invention the radially inner section of the source-material-holding-plate comprises no through holes.

According to a further preferred embodiment of the present invention the lower surface of the source-material-holding-plate forms together with a bottom wall section of the crucible housing a gas-guide-gap or gas-guide-channel for guiding gas from the crucible gas inlet tube to the receiving space or around the receiving space, in particular to the through holes of the source-material-holding-plate. The gas-guide-gap or gas-guide-channel preferably extends preferably mainly or completely in a horizontal plane.

According to a further preferred embodiment of the present invention the filter unit is arranged between the crucible gas outlet tube and the seed holder unit, wherein the filter unit forms a filter-unit-gas-flow-path-boundary-section for forming or defining or providing or materializing the filter gas flow path, wherein the filter gas flow path extends between a filter input surface and a filter output surface. The filter input surface, in particular a center of the filter input surface, is preferably arranged closer to the seed holder unit compared to the filter output surface, in particular a center of the filter output surface. Additionally or alternatively the filter output surface, in particular a center of the filter output surface, is arranged closer to the crucible gas outlet tube compared to the filter input surface, in particular a center of the filter input surface.

According to a further preferred embodiment of the present invention the growth guide forms a growth-guide-gas-path-section-boundary for guiding gas flow into the direction of the seed holder unit. The growth guide and the seed holder unit form a gas-flow passage, wherein gas flow velocity through the gas flow passage is preferably set-up between 1 cm/s and and highly preferably between 2 cm/s and 6 cm/s and most preferably between 2.5 cm/s and 5.5 cm/s or 2.5 cm/s and 4.5 cm/s or 3 cm/s and 5.5 cm/s or 3.5 cm/s and 4 cm/s. The seed holder unit and the growth guide preferably are arranged in a distance to each other to form the gas flow passage. The distance between the seed holder unit and the growth guide is preferably more than 0.1% of the diameter of the seed holder unit and highly preferably more than or up to 2% of the diameter of the seed holder unit and most preferably between 0.1% and 20%, in particular between 1% and 10% or between 1% and 5%, of the diameter of the seed holder unit. The distance between the seed holder unit and the growth guide is preferably less than 20 cm or less than 15 cm or highly preferably less than 10 cm and most preferably in a range between and 10 cm.

According to a further preferred embodiment of the present invention gas flow through the furnace unit preferably takes the following route: Provided through the crucible gas inlet tube and introduced into the crucible housing via the crucible gas inlet tube then guided through the gas flow gap then guided through the source material plate holes the guided between and around the particles of the source material then guided from the source material to the seed wafer or crystal growth face as the case may be, then guided across the seed wafer or crystal growth face as the case may be, then guided toward the gap between the seed holder and the growth guide then through the gap between the seed holder and the growth guide, then guided towards the filter unit, then through the filter unit, then across the bottom surface of the filter lid to the crucible vacuum outlet tube, then through the crucible vacuum outlet tube, then out of the crucible housing through the crucible vacuum outlet.

According to a preferred embodiment of the present invention the seed holder unit is coupled to the filter unit and held by the filter unit.

According to a preferred embodiment of the present invention the seed holder unit and the filter unit are glued together or are pressed together or are screwed together.

According to a preferred embodiment of the present invention the filter unit comprises one filter element, wherein the filter element or filter unit preferably has a ring-shaped form. The ring shaped form preferably has an outer surface and an inner surface, wherein the inner surface preferably forms a through hole. The inner surface and the outer surface can be of the same type, in particular circular, or of different type, in particular circular and rectangular or of different (preferably cross-sectional) shapes, wherein the inner surface and or the outer surface can be different in dependency of the height of the filter unit. E.g. the outer form can have a cylindrical shape and the inner form can have a shape differing from the cylindrical shape. Furthermore, the diameter of the inner and/or outer surface can be different at different heights of the filter unit.

The filter body forms according to a further preferred embodiment of the present invention one receiving slot for receiving one filter element or multiple receiving slots for receiving multiple filter elements. The one filter element is preferably a disposable filter element or the multiple filter elements are preferably disposable filter elements. The filter body is preferably reusable. Disposable preferably describes that the filter element is replaced after a defined number of runs, in particular after one, two or three or up to five or up to ten runs. Reusable preferably describes that the filter body is used for more runs compared to a filter element. The filter body is preferably made of carbon, in particular graphite, or consists of graphite.

A blind-hole-center-axis or a through-hole-center-axis is preferably arranged in parallel or coaxial to a seed-holder-unit-center-axis. A blind-hole-center-axis or a through-hole-center-axis is preferably arranged in a distance of less than 50% of the diameter or average diameter or largest diameter of the seed holder unit to the seed-holder-unit-center-axis and preferably in a distance of less than 30% of the diameter of the seed holder unit to the seed-holder-unit-center-axis and highly preferably in a distance of less than 15% of the diameter or average diameter or largest diameter of the seed holder unit to the seed-holder-unit-center-axis and most preferably in a distance of less than 5% of the diameter of the seed holder unit to the seed-holder-unit-center-axis.

The blind hole or through hole preferably has a diameter or average diameter or largest diameter of more than 20% of the diameter or average diameter or largest diameter of the seed holder unit and preferably of more than 50% of the diameter of the seed holder unit and highly preferably of more than 80% of the diameter of the seed holder unit and most preferably of up to, exactly or more than 100% of the diameter of the seed holder unit.

The diameter or average diameter or largest diameter of the outer surface of the filter unit is preferably more than 110% of the diameter or average diameter or largest diameter of the seed holder unit or highly preferably more or up to 125% of the diameter or average diameter or largest diameter of the seed holder unit or most preferably more or up to 150% of the diameter or average diameter or largest diameter of the seed holder unit.

The blind hole of the filter unit preferably extends from the side of the filter input surface into the direction of the filter output surface more or up to 10% of the distance or average distance between the input surface of the filter unit and the output surface of the filter unit or preferably more or up to 20% of the distance or average distance between the input surface of the filter unit and the output surface of the filter unit or highly preferably more or up to 50% of the distance or average distance between the input surface of the filter unit and the output surface of the filter unit or most preferably more or up to 70% of the distance or average distance between the input surface of the filter unit and the output surface of the filter unit.

The blind hole of the filter unit preferably extends from the side of the filter input surface into the direction of the filter output surface preferably between 5% and 10% of the distance or average distance between the input surface of the filter unit and the output surface of the filter unit or preferably between 5% and 30% of the distance or average distance between the input surface of the filter unit and the output surface of the filter unit or highly preferably between 10% and 90% of the distance or average distance between the input surface of the filter unit and the output surface of the filter unit or most preferably between 15% and 95% of the distance or average distance between the input surface of the filter unit and the output surface of the filter unit.

According to a further preferred embodiment of the present invention the heat dissipating means is a filter through hole, a blind hole or a filter-cooling-unit.

Thus, the filter unit preferably comprises a filter-cooling-unit for cooling a filter-unit-input-surface-section of the filter unit input surface.

The filter-cooling-unit preferably comprises a filter-cooling-unit-gas-inlet and a filter-cooling-unit-gas-outlet and a filter-unit-cooling-gas-guide for guiding gas introduced via the filter-cooling-unit-gas-inlet along and/or through the filter unit, in particular the filter body and/or filter element/s, to remove thermal energy from at least the filter-unit-input-surface-section. The filter-unit-input-surface-section preferably at least partially overlaps in axial direction of the seed holder unit the backside of the seed holder. The filter-unit-input-surface-section preferably overlaps, in particular in vertical direction, at least 30% of the backside surface of the seed holder unit and highly preferably at least 70% of the backside surface of the seed holder unit and most preferably between 75% and 100% or at least or up to 100% of the backside surface of the seed holder unit.

The filter-cooling-unit-gas-inlet is preferably coupled via a first-cooling-gas-pipe with a cooling-gas-source and the filter-cooling-unit-gas-outlet is preferably coupled via a second-cooling-gas-pipe with a cooling-gas-receiving-space, in particular the cooling-gas-source, for feeding back the heated cooling gas. The first-cooling-gas-pipe and the second-cooling-gas-pipe preferably extend through the crucible lid to the furnace and highly preferably though a furnace wall to the outside of the furnace apparatus.

According to a further preferred embodiment of the present invention the filter unit is arranged insider a crucible housing, in particular entirely surrounded by crucible walls, wherein the filter body forms a filter outer surface and preferably a filter inner surface, wherein the filter inner surface preferably forms a filter blind hole or a filter through hole.

According to a further preferred embodiment of the present invention a pressure unit for setting up a crucible volume pressure inside the crucible volume provided, wherein the pressure unit is configured to cause crucible volume pressure below 66661.2 Pa or in a range between 2666.45 Pa and 39996.7 Pa. This embodiment is beneficial since due to the pressure above 2666.45 Pa a dense gas flow is generated that causes an improved mass flux from the source material to the seed wafer. The pressure unit is preferably configured to a establish a furnace volume pressure inside the furnace volume but outside the crucible housing, wherein the pressure unit is configured to set up the furnace volume pressure higher compared to the crucible volume pressure, in particular more than 20 Pa or preferably more than 133,322 Pa or highly preferably more than 666,612 Pa higher compared to the crucible volume pressure.

According to a highly preferred embodiment of the present invention a pressure unit for setting up a crucible volume pressure inside the crucible volume is provided. The pressure unit is preferably configured to cause a crucible volume pressure (P1) above 2666.45 Pa and preferably above 5000 Pa or in a range between 2666.45 Pa and 50000.00 Pa, in particularly during a production run. The pressure above 2666.45 Pa and preferably above 5000 Pa or in a range between 2666.45 Pa and 50000.00 Pa, is highly preferably generated via the crucible gas inlet tube and/or via the crucible gas outlet tube, in particular by means of a carrier gas supply into the crucible volume, in particular by means of a gas pump, and/or a gas removal from the crucible volume, in particular by means of a vacuum gas pump. The pressure unit is preferably also configured to cause furnace volume pressure (P2) identical or higher compared to crucible volume pressure, in particular of more than 20 Pa or preferably of more than 133,322 Pa or highly preferably of more than 666,612 Pa higher compared to the crucible volume pressure.

The above-mentioned object is alternatively solved by a furnace apparatus respectively a reactor, in particular a reactor for growing crystals, in particular for growing SiC crystals. Said reactor respectively furnace apparatus preferably comprises a furnace, wherein the furnace respectively furnace unit comprises a furnace volume, and at least one crucible unit or more than one crucible unit or exactly one crucible unit. The crucible unit is preferably arranged inside the furnace volume, wherein the crucible unit comprises a crucible housing, wherein the crucible housing forms a housing, wherein the housing has an outer surface and an inner surface, wherein the inner surface at least partially forms a crucible volume, wherein a receiving space for receiving a source material is arranged or formed inside the crucible volume, wherein a seed holder unit for holding a defined seed wafer 18 is arranged inside the crucible volume. The furnace apparatus preferably also comprises at least one heating unit for heating the source material. The receiving space for receiving the source material is at least in parts arranged between the heating unit and the seed holder unit. The furnace apparatus further comprises at least one leak prevention means for preventing leakage of gaseous silicon during operation from the inside of the crucible unit to a part of the furnace volume surrounding the crucible unit. The barrier means is selected from a group of leak prevention means, wherein the group of leak prevention means at least comprises: a covering element for covering of surface parts and/or a density increasing element for increasing the density of a volume section of the crucible housing of the crucible unit, a filter unit for capturing gaseous Si and/or a pressure unit for setting up a first pressure inside the crucible unit and a second pressure inside the furnace but outside the crucible unit, wherein the second pressure is higher than the first pressure. The leak prevention means reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The crucible housing preferably comprises carbon, in particular at least 50% (mass) of the crucible housing are made of carbon and preferably at least 80% (mass) of the crucible housing are made of carbon and highly preferably at least 90% (mass) of the crucible housing are made of carbon or the crucible housing complete consists of carbon, in particular the crucible housing comprises at least 90% (mass) graphite or consists of graphite, to withstand temperatures above 2,000° C., in particular at least or up to 3,000° C. or at least up to 3,000° C. or up to 3,500° C. or at least up to 3,500° C. or up to 4,000° C. or at least up to 4,000° C. The crucible housing itself is preferably impermeable to silicon gas (Si vapor). The leak prevention means is preferably a covering element for covering the surface of the housing, in particular the inner surface and/or the outer surface, or for covering surface parts of the housing, in particular surface parts of the inner surface of the housing and/or surface parts of the outer surface of the housing. The covering element is preferably a sealing element, wherein the sealing element is preferably a coating. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating comprises a material or multiple materials selected from a group of materials at least comprising carbon, in particular pyrocarbon and glassy carbon. The coating is preferably generated by chemical vapor deposition or wherein the coating is generated by painting, in particular on a precursor material, in particular phenol formaldehyde, and pyrolyzing after painting. The leak prevention means is preferably a density increasing element for increasing the density of a volume section of the crucible housing of the crucible unit. The density increasing element is preferably arranged or generated in the inner structure of the crucible housing. The density increasing element is preferably a sealing element, wherein the sealing element reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass). The density increasing element is preferably generated inside of the crucible housing by means of impregnation or deposition.

According to a further preferred embodiment according to any of the before mentioned embodiments and/or solutions the leak prevention means is a filter unit for capturing gaseous Si. The filter unit comprises a filter body. The filter body preferably comprises a filter input surface for inputting gas comprising Si vapor into the filter body and an output surface for outputting filtered gas. A filter element is preferably arranged between the filter input surface and the output surface. The filter element preferably forms a trapping section for adsorbing and condensing Si vapor. The filter element preferably forms a gas flow path from the filter input surface to the output surface. The filter element preferably has a height S1 and wherein the gas flow path through the filter element has a length S2, wherein S2 is at least 10 time longer compared to S1, in particular S2 is 100 times longer compared to S1 or S2 is 1,000 times longer compared to S1. The filter unit is preferably arranged between a first part of the housing of the crucible unit and a second part of the housing of the crucible unit. At least 50% (vol.), in particular at least 80% (vol.) or 90% (vol.), of the first part of the housing of the crucible unit is preferably arranged in vertical direction below the seed holder unit. A first crucible volume is preferably present between the first part of the housing of the crucible unit and the seed holder, wherein the first crucible volume can be operated such that at least 80% or preferably 90% or more preferably 100% of the first crucible volume is above the condensation temperature $T_c$, of silicon at the prevailing pressure. Additionally, up to 50% (vol.) or up to 20% (vol.) or up to 10% (vol.) of the first part of the housing of the crucible unit is arranged in vertical direction above the seed holder unit. Alternatively, at least 50% (vol.), in particular at least 80% (vol.) or 90% (vol.), of the second part of the housing of the crucible unit is arranged in vertical direction above the seed holder unit. A second crucible volume is preferably present between the second part of the housing of the crucible unit and the seed holder. At least 60%, or preferably 80%, or more preferably 90% of the filter element is below the condensation temperature $T_c$.

The filter unit is preferably arranged between a first wall part of the first part of the housing and a further wall part of the second part of the housing, wherein the filter body forms a filter outer surface. The filter outer surface preferably connects the first wall part of the first part of the housing and the further wall part of the second part of the housing, wherein the filter outer surface forms a portion of the outer surface of crucible unit. The filter outer surface preferably comprises a filter outer surface covering element. The filter outer surface covering element is a sealing element. The sealing element is preferably a coating. The coating is preferably generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. The filter body preferably forms a filter inner surface, wherein the filter inner surface is arranged in coaxial manner with respect to the filter outer surface. The filter body is preferably formed in a ring-shaped manner. The filter outer surface has preferably a cylindrical shape. Additionally, or alternatively the filter inner surface has preferably a cylindrical shape. The filter outer surface and the filter inner surface preferably extend in vertical direction. The filter inner surface preferably comprises a further filter inner surface covering element. The further filter inner surface covering element is preferably a sealing element. The sealing element is preferably a coating, wherein the coating is generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. The filter element preferably comprises a filter element member. The filter element member preferably comprises filter particles and a binder. The filter particles preferably comprise carbon or consist of carbon, wherein the binder holds the filter particles in fixed relative positions to each other. The filter particles preferably withstand temperatures above 2,000° C., in particular at least or up to 3,000° C. or at least up to 3,000° C. or up to 3,500° C. or at least up to 3,500° C. or up to 4,000° C. or at least up to 4,000° C. The binder preferably withstands temperatures above 2,000° C., in particular at least or up to 3,000° C. or at least up to 3,000° C. or up to 3,500° C. or at least up to 3,500° C. or up to 4,000° C. or at least up to 4,000° C.

Wherein the binder comprises starch or wherein the binder consists of modified starch and/or glassy carbon precursors such as phenol formaldehyde and/or furfuryl alcohol and/or polymers thereof.

According to a further preferred embodiment according to any of the before mentioned embodiments and/or solutions the furnace apparatus preferably comprises a gas flow unit. The gas flow unit preferably comprises a gas inlet for conducting gas into the crucible unit and a gas outlet for removing gas from the crucible unit. The gas inlet is preferably arranged in gas flow direction before the filter unit. Additionally, or alternatively the gas outlet is arranged in gas flow direction after the filter unit. The gas inlet is preferably arranged in a transformation zone within the crucible unit. The transformation zone preferably also comprises the seed holder unit and the receiving space. A source material can be transformed from a solid configuration into a vapor configuration and from the vapor configuration into a solid target body, wherein the source material can be arranged inside the receiving space and wherein the solid target body can be held by the seed holder unit, wherein gas introduced via the gas inlet mixes and/or reacts with the source material in the vapor configuration. The gas outlet is preferably arranged in a trapping zone. The trapping zone preferably also comprises the output surface of the filter unit. The gas composition in the trapping zone is free of Si vapor. The temperature in the trapping zone is preferably below the solidification temperature of gaseous Si respectively Si vapor, in particular at a pressure below 100 Torr respectively 13332.2 Pa or below 50 Torr respectively 6666.12 Pa.

An inert gas, in particular argon, or a mixture of gases, in particular argon and nitrogen, can be introduced according to a further preferred embodiment via the gas inlet into the crucible unit, respectively into the transformation zone. Thus, a gas source comprising the gas or multiple gases or the mixture of gas is preferably also provided.

The gas inlet is preferably arranged between the receiving space and the seed holder unit, wherein the gas inlet is preferably in vertical direction arranged closer to the receiving space compared to the seed holder unit, in particular the vertical distance between the seed holder unit and the gas inlet is preferably more than 2 times the vertical distance between the receiving space and the gas inlet, in particular more than 5 times the vertical distance between the receiving space and the gas inlet or more than 8 times the vertical distance between the receiving space and the gas inlet or more than 10 times the vertical distance between the receiving space and the gas inlet or more than 20 times the vertical distance between the receiving space and the gas inlet. The gas inlet is preferably covered by a gas distribution member. The gas distribution member preferably extends parallel to a bottom surface of the crucible unit, in particular the inner bottom surface of the crucible unit. The gas distribution member is preferably arranged in a defined distance to the bottom surface of the crucible unit, in particular the inner bottom surface of the crucible unit. The defined distance in vertical direction between the lower surface of the gas distribution member and the bottom surface of the crucible unit is preferably less than 0.5× distance between the receiving space and the gas inlet or less than 0.3× distance between the receiving space and the gas inlet or less than 0.1× distance between the receiving space and the gas inlet or less than 0.05× distance between the receiving space and the gas inlet. The gas distribution member is preferably a gas guiding plate. The gas guiding plate preferably forms a lower surface and an upper surface, wherein the lower surface and the upper surface preferably extend at least sectionally in parallel to each other, wherein the distance between the lower surface and the upper surface is preferably less than 0.5× distance between the receiving space and the gas inlet or less than 0.3× distance between the receiving space and the gas inlet or less than 0.1× distance between the receiving space and the gas inlet or less than 0.05× distance between the receiving space and the gas inlet.

According to a further preferred embodiment according to any of the before mentioned embodiments and/or solutions the leak prevention means is a pressure unit for setting up a first pressure inside the crucible unit and a second pressure inside the furnace but outside the crucible unit. The second pressure is preferably higher than the first pressure. The second pressure is preferably below 200 Torr respectively 26664.5 Pa, in particular below 100 Torr respectively 13332.2 Pa or below 50 Torr respectively 6666.12 Pa. The second pressure is preferably at least 0.5 Torr respectively 66.6612 Pa or at least 1 Torr respectively 133,322 Pa or at least 5 Torr respectively 666,612 Pa or at least 10 Torr respectively 1333.22 Pa higher compared to the first pressure.

A pipe system is preferably part of the furnace apparatus. The pipe system preferably comprises a crucible pipe connecting the crucible volume with a vacuum unit and a furnace pipe connecting the part of the furnace which surrounds the crucible unit to the vacuum unit. The vacuum unit preferably comprises a control element for controlling the pressure inside the crucible volume and the pressure in the part of the furnace which surrounds the crucible unit. The vacuum unit preferably reduces pressure inside the crucible volume via the crucible pipe or inside the part of the furnace which surrounds the crucible unit via the furnace pipe in case the control element determines that the pressure inside the crucible volume is above a first threshold and/or in case the control element determines that the pressure inside the part of the furnace which surrounds the crucible unit is above a second threshold.

According to a further preferred embodiment according to any of the before mentioned embodiments and/or solutions the furnace apparatus comprises two or more than two leak prevention means of the group of leak prevention means.

The above-mentioned object is also solved by a method for operating a furnace apparatus or a reactor, in particular a reactor or furnace apparatus for growing crystals, in particular for growing SiC crystals. The furnace apparatus, which is uses in said method, preferably comprises a furnace respectively furnace unit, wherein the furnace preferably comprises a furnace volume, preferably at least one crucible unit, wherein the crucible unit is preferably arranged inside the furnace volume, wherein the crucible unit preferably comprises a crucible housing, wherein the crucible housing preferably forms a housing, wherein the housing preferably has an outer surface and an inner surface, wherein the inner surface preferably at least partially forms a crucible volume, wherein a receiving space for receiving a source material is preferably arranged or formed inside the crucible volume, wherein a seed holder unit for holding a defined seed wafer 18 is preferably provided, in particular arranged inside the crucible volume, and wherein at least one heating unit for heating the source material is preferably provided. The receiving space for receiving the source material is preferably at least in parts arranged between the heating unit and the seed holder unit. The furnace apparatus further preferably comprises at least one leak prevention means for preventing leakage of gaseous silicon during operation from the inside of the crucible unit to a part of the furnace volume surrounding the crucible unit. The leak prevention means is preferably selected from a group of leak prevention means, wherein the group of leak prevention means at least comprises: a covering element for covering of surface parts and/or a density increasing element for increasing the density of a volume section of the crucible housing of the crucible unit, a filter unit for capturing gaseous Si and/or, a pressure unit for setting up a first pressure inside the crucible unit and a second pressure inside the furnace but outside the crucible unit, wherein the second pressure is preferably higher than the first pressure. The leak prevention means preferably reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The method preferably comprises the steps of: vaporizing the source material, mixing the vaporized source material with a gas inserted via a gas inlet to create a vapor-gas mixture, guiding the vapor-gas mixture to a seed wafer, allowing a crystal to grow from the seed wafer via deposition from the vapor-gas mixture, guiding the remaining vapor-gas mixture to a gas outlet, and preventing leakage of vaporized source material by means of the covering element, and/or the density increasing element, and/or the filter unit by trapping gaseous Si, and/or the pressure unit by setting up the first pressure inside the crucible volume and the second higher pressure inside the furnace volume.

According to a further preferred embodiment according to any of the before mentioned embodiments and/or solutions a control unit respectively the control element is provided for controlling the pressure level inside the crucible unit and/or furnace and/or for controlling gas flow into the crucible unit and/or for controlling the heating unit. The heating unit is preferably controlled to establish an isotherm temperature profile parallel to the holder unit respectively orthogonal to the vertical direction respectively horizontal.

Thus, also a method for maintaining a constant temperature during the growth cycle on the growth face of crystal in the furnace apparatus respectively an apparatus for PVT growth of single crystals, in particular SiC single crystals, is provided. The method preferably comprises the steps or consist of the steps: Having two similar sections of insulation with windows cut into them, positioning the two sections of insulation on top of each other and in between the crystal seed holder and furnace volume wall, aligning the windows in the two sections of insulation such that they initially do not overlap, rotating the sections of insulation relative to each other as the crystal grows to gradually have the windows overlap thus allowing the seed holder to radiate more heat to the furnace volume wall and thus allowing the growth face of the growing crystal to be maintained at a constant temperature.

The above-mentioned object is also solved by a method for operating a furnace apparatus or a reactor, in particular a reactor or a furnace apparatus for growing crystals, in particular for growing SiC crystals. The furnace apparatus, which is uses in said method, preferably comprises a furnace respectively furnace unit, wherein the furnace preferably comprises a furnace volume, wherein the furnace apparatus also comprises at least one crucible unit, wherein the crucible unit is preferably arranged inside the furnace volume, wherein the crucible unit preferably comprises a crucible housing, wherein the crucible housing preferably forms a housing, wherein the housing preferably has an outer surface and an inner surface, wherein the inner surface at least partially forms a crucible volume. The furnace apparatus also comprises a receiving space for receiving a source material. The receiving space is preferably arranged or formed inside the crucible volume. The furnace apparatus preferably also comprises a seed holder unit for holding a defined seed wafer, in particular arranged inside the crucible volume. The furnace apparatus preferably also comprises at least one heating unit for heating the source material. The receiving space for receiving the source material is preferably at least in parts arranged between the heating unit and the seed holder unit. The heating unit preferably comprises at least one heating element, wherein the heating element is preferably arranged in vertical direction below the receiving space. The furnace apparatus preferably also comprises a control unit respectively the control element for controlling the pressure level inside the crucible unit and/or furnace and/or for controlling gas flow into the crucible unit and/or for controlling the heating unit. The heating unit is preferably controlled to establish an isotherm temperature profile parallel to the holder unit respectively orthogonal to the vertical direction respectively horizontal. The method at least comprises the steps: Reducing pressure inside the crucible unit by means of a vacuum pump, measuring pressure inside the crucible unit by means of a sensor, heating the crucible unit by means of the heating unit, measuring temperature inside the crucible unit by means of the sensor or by means of a further sensor, controlling the vacuum pump and/or the heating unit by means of the control unit respectively the control element, wherein the control unit respectively the control element preferably controls pressure in dependency of signals or data provided by the sensor and/or wherein the control unit respectively the control element preferably controls temperature in dependency of signals or data provided by the sensor or by a further sensor.

According to a further preferred embodiment according to any of the before mentioned embodiments and/or solutions the heating unit preferably comprises at least one heating element, in particular resistance heating element, wherein the heating element is preferably arranged in vertical direction below the receiving space. The receiving space is preferably formed in a wall portion of the crucible unit or arranged on a wall or bottom section inside the crucible unit. The receiving space preferably extends around a central axis. The central axis preferably extends coaxial to a central axis of the seed holder unit. The receiving space is preferably arranged in a defined distance to the central axis and/or a gas pipe for introducing gas into the crucible unit is provided. The gas pipe is preferably at least partially surrounded by the receiving space. The gas pipe preferably extends at least partially in the direction of the central axis.

According to a further preferred embodiment according to any of the before mentioned embodiments and/or solutions the furnace apparatus preferably comprises a gas flow unit. The gas flow unit preferably comprises a gas inlet for conducting gas into the crucible unit and/or a gas outlet for removing gas from the crucible unit. The gas inlet is preferably arranged closer to the bottom of the crucible unit compared to the gas outlet. Both the gas inlet and the gas outlet are preferably arranged inside the crucible volume. The gas outlet preferably comprises a gas conducting means, in particular a pipe. The gas outlet preferably comprises a sensor, in particular a temperature and/or pressure sensor. The sensor is preferably arranged inside the conducting means, in particular pipe, or as part of the conducting means, in particular pipe, or attached to an outside wall of the conducting means, in particular pipe. The gas inlet preferably comprises a gas conducting means, in particular a pipe. The gas inlet preferably comprises a sensor, in particular a temperature and/or pressure sensor. The sensor is preferably arranged inside the conducting means, in particular pipe, or as part of the conducting means, in particular pipe, or attached to an outside wall of the conducting means, in particular pipe. The sensor in the gas inlet and/or gas outlet is preferably a pyrometer. The sensor in the gas inlet and/or gas outlet is preferably in physical connection and/or data connection with a control unit respectively control element.

The above-mentioned object is also solved by a furnace apparatus or a reactor for growing crystals, in particular SiC crystals. The furnace apparatus preferably comprises a furnace and at least one or exactly one or more than one crucible unit, wherein the crucible unit is arranged inside the furnace. The crucible unit preferably comprises a receiving space for receiving a source material and/or a seed holder unit for holding a seed wafer and/or at least one heating unit for heating the source material. The receiving space for receiving the source material is preferably at least in parts arranged between the heating unit and the seed holder unit respectively in vertical direction on a level below the level of the seed holder unit and above a level of the heating unit. The heating unit preferably comprises at least one heating element. The heating element is preferably arranged in vertical direction below the receiving space. The receiving space is preferably formed in a wall portion of the crucible unit or arranged on a wall or bottom section inside the crucible unit. The receiving space is preferably formed by one continuous trench or multiple recesses. The trench or the recesses preferably at least partially and preferably substantially or preferably completely surround a surface arranged or present inside the crucible unit, in particular an inner surface of a wall and/or bottom section of the crucible unit. The receiving space preferably has an annular shape. A central section of the at least partially surrounded wall or bottom section or surface section is preferably surrounded by the receiving space. A central section center axis of the central section and a seed holder center axis of the seed holder unit are preferably arranged in coaxial manner. The central section preferably overlays at least 20% and preferably at least 50% or 80% or 100% of a surface of the seed wafer 18 held by the seed holder unit. The surface of the seed wafer 18 is preferably arranged parallel to the central section. The central axis preferably extends coaxial to a central axis of the seed holder unit. The receiving space is preferably arranged in a defined distance to the central axis and/or a gas pipe for introducing gas into the crucible unit is provided. The gas pipe is at least partially surrounded by the receiving space. The gas pipe preferably extends at least partially in the direction of the central axis.

The present invention can also refer to a filter unit, in particular for usage inside a crucible unit inside a furnace apparatus. The filter unit preferably comprises a filter body, wherein the filter body comprises a filter input surface for inputting a gas, in particular comprising or consisting of Si vapor, into the filter body and an output surface for outputting filtered gas, in particular doping and/or carrier gas. A filter element is preferably arranged between the filter input surface and the output surface. The filter element preferably forms a trapping section for adsorbing and condensing Si vapor. The filter element preferably forms a gas flow path from the filter input surface to the output surface, wherein the filter element has a height S1 and wherein the gas flow path through the filter element has a length S2, wherein S2 is at least 10 time longer compared to S1, in particular S2 is 100 times longer compared to S1 or S2 is 1,000 times longer compared to S1.

The filter outer surface preferably comprises a filter outer surface covering element. The filter outer surface covering element is preferably a sealing element. The sealing element is preferably a coating. The coating is preferably generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. The filter body preferably forms a filter inner surface. The filter inner surface is preferably arranged in coaxial manner with respect to the filter outer surface. The filter body is preferably formed in a ring-shaped manner. The filter outer surface has preferably a cylindrical shape and wherein the filter inner surface has preferably a cylindrical shape. The filter outer surface and the filter inner surface preferably extend in vertical direction. The filter inner surface preferably comprises a further filter inner surface covering element. The further filter inner surface covering element is preferably a sealing element. The sealing element is preferably a coating. The coating is preferably generated at the filter surface or attached to the filter surface or forms the filter surface. The coating preferably comprises of a material or a material combination that reduces leakage from the crucible volume through the crucible housing to the furnace volume of sublimation vapors, in particular Si vapor, generated during one run, in particular by at least 50% (mass) or by at least 80% (mass) or by at least 90% (mass) or by more than 99% (mass) or by at least 99.9% (mass).

The coating preferably withstands temperatures above 2,000° C., in particular at least or up to 3,000° C. or at least up to 3,000° C. or up to 3,500° C. or at least up to 3,500° C. or up to 4,000° C. or at least up to 4,000° C. The coating preferably comprises a material or multiple materials selected from a group of materials at least comprising carbon, in particular pyrocarbon and glassy carbon. The filter element preferably comprises a filter element member. The filter element member preferably comprises filter particles and a binder. The filter particles preferably comprise carbon or consist of carbon. The binder preferably holds the filter particles in fixed relative positions to each other. The filter particles preferably withstand temperatures above 2,000° C., in particular at least or up to 3,000° C. or at least up to 3,000° C. or up to 3,500° C. or at least up to 3,500° C. or up to 4,000° C. or at least up to 4,000° C. The binder preferably withstands temperatures above 2,000° C., in particular at least or up to 3,000° C. or at least up to 3,000° C. or up to 3,500° C. or at least up to 3,500° C. or up to 4,000° C. or at least up to 4,000° C.

The filter element comprises according to a further preferred embodiment of the present invention filter particles and a filter binder, wherein the filter particles comprise carbon, wherein the filter binder holds the filter particles in fixed relative positions to each other.

The above-mentioned object is additionally or alternatively solved by a method and/or furnace apparatus respectively apparatus for PVT growth of single crystals, in particular SiC single crystals. Said method and/or furnace apparatus comprising of: Providing a furnace volume capable of housing a crucible unit, heaters, and insulation and/or providing a crucible unit with a lid and/or having a seed holder incorporated into or attached to the lid and/or having a SiC single crystal seed attached to the seed holder and/or having a gas flow tube for introducing carrier and doping gases into the crucible unit and/or locating the gas flow tube in the bottom center of the crucible unit and having it extend into the crucible unit to slightly above the level of the source material placed annularly around it and/or having a gas distribution plate at top of the gas flow tube such that the upward flow of gases in the tube is redirected radially outward at a level just above the top surface of the source material and/or having a curved growth guide that redirects the outward radial flow of the gases back inward radially and/or creating a vacuum in the crucible unit, heating and subliming the source material, and activating the gas flow such that any particulates entrained in the sublimation vapors are deposited on surface of the growth guide by centrifugal force and/or growing the crystal.

The above-mentioned object is also solved by a furnace apparatus for growing SiC crystals. The furnace apparatus according to the present invention preferably comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a solid SiC source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit. This solution is characterized in that a crucible gas flow unit is provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume and additionally or alternatively a filter unit for capturing at least $Si_2C$ sublimation vapor, $SiC_2$ sublimation vapor and Si sublimation vapor is provided, in particular inside the crucible volume, wherein the filter unit is highly preferably arranged between the crucible gas inlet tube and the crucible gas outlet tube.

This solution is beneficial since sublimated vapor can be carried through the crucible by means of a carrier gas causing higher deposition rates and due to the filter unit exit of $Si_2C$ sublimation vapor, $SiC_2$ sublimation vapor and Si sublimation vapor through the crucible gas outlet tube can be avoided since the gas flow path preferably extends through the filter unit. The filter unit preferably comprises a filter body, wherein the filter body comprises a filter input surface for inputting sublimated vapor comprising $Si_2C$ vapor, $SiC_2$ vapor, Si vapor and carrier and/or doping gases, in particular argon and/or nitrogen, into the filter body and an output surface for outputting filtered carrier and doping gases, wherein a filter element is preferably arranged between the filter input surface and the output surface. The filter element highly preferably forms a trapping section for adsorbing and condensing Si vapor. Additionally or alternatively the filter element forms a filter-unit-gas-flow-path from the filter input surface to the output surface, wherein the filter gas flow path is part of the gas flow path between the crucible gas inlet tube and the crucible gas outlet tube. The filter element preferably has a height S1 and wherein the filter-unit-gas-flow-path through the filter element has a length S2, wherein S2 is at least 2 times, in particular 10 time longer compared to S1, wherein S1 is preferably more than 10 cm and highly preferably more than 20 cm or up to 100 cm or 200 cm. Alternatively the filter unit forms a filter-unit-gas-flow-path respectively the filter-unit-gas-flow-path from the filter input surface to the output surface, wherein the filter gas flow path is part of the gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 time longer compared to S1. The filter unit is preferably arranged between a crucible lower housing and a crucible upper housing, wherein the filter body forms a filter outer surface, wherein the filter outer surface connects the crucible lower housing and the crucible upper housing wherein the filter outer surface forms a portion of the outer surface of crucible housing. The filter outer surface preferably comprises a filter outer surface covering element, wherein the filter outer surface covering element preferably is a sealing element, wherein the sealing element preferably is a coating, wherein the coating preferably is generated at the filter surface or attached to the filter surface or forms the filter surface. The filter body preferably forms a filter inner surface, wherein the filter inner surface preferably forms a filter through hole. The filter inner surface preferably comprises a further filter inner surface covering element, wherein the further filter inner surface covering element preferably is a sealing element, wherein the sealing element preferably is a coating, wherein the coating is preferably generated at the filter surface or attached to the filter surface or forms the filter surface. The filter through hole is preferably arranged above the seed holder unit, wherein a through-hole-center-axis of the filter through hole is preferably arranged parallel, in particular coaxial, to a seed-holder-unit-axis. The through-hole-center-axis is preferably arranged in a distance of less than 50% of the diameter or average diameter or largest diameter of the seed holder unit to the seed-holder-unit-center-axis and the filter through hole preferably has a diameter or average diameter or largest diameter of more than 20% of the diameter or average diameter or largest diameter of the seed holder unit. The receiving space is preferably located between the crucible gas inlet tube and the seed holder unit for conducting gas flow around the receiving space and/or through the receiving space. A source material holding plate is preferably provided, wherein the source material holding plate comprises an upper surface preferably forming a bottom section of the receiving space and a lower surface preferably forming a source-material-holding-plate-gas-flow-path-boundary-section. The source-material-holding-plate preferably comprises multiple through holes, wherein the multiple through holes extend from the upper surface of the source-material-holding-plate through a main body of the source-material-holding-plate to the lower surface of source-material-holding-plate, wherein at least the majority of the multiple through holes has a diameter of less than 12 mm, in particular less than 10 mm and preferably less than 6 mm and highly preferably less than 2 mm and most preferably of 1 mm or less than 1 mm. The number of through holes through the main body of the source-material-holding-plate preferably depend on the surface size of the upper surface of the source-material-holding-plate, wherein at least one though hole is provided per 10 $cm^2$ surface size of the upper surface. The number of through holes per 10 $cm^2$ is preferably higher in a radially outer section of the source-material-holding-plate compared to a radially inner section of the source-material-holding-plate, wherein the radially inner section preferably extends up to 20% or 30% or 40% or 50% of the radial extension of the source-material-holding-plate, wherein the radially outer section of the source-material-holding-plate preferably extends between the radially inner section and the radial end of the source-material-holding-plate. The lower surface of the source-material-holding-plate preferably forms together with a bottom wall section of the crucible housing a gas-guide-gap or gas-guide-channel for guiding gas from the crucible gas inlet tube to the receiving space or around the receiving space, in particular to the through holes of the source-material-holding-plate. The furnace apparatus preferably comprises a pressure unit for setting up a crucible volume pressure inside the crucible volume. The pressure unit is preferably configured to cause a crucible volume pressure (P1) above 2666.45 Pa and preferably above 5000 Pa or in a range between 2666.45 Pa and 50000.00 Pa, in particularly during a production run. The pressure unit is preferably also configured to cause furnace volume pressure (P2) identical or higher compared to crucible volume pressure, in particular of more than Pa or preferably of more than 133,322 Pa or highly preferably of more than 666,612 Pa higher compared to the crucible volume pressure.

The above mentioned object is also solved by a furnace apparatus, in particular a furnace apparatus for growing crystals, in particular for growing SiC crystals, wherein this furnace apparatus preferably comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit, wherein the furnace apparatus further comprises at least one leak prevention means for preventing leakage of gaseous silicon during operation from the crucible volume through the crucible housing into the furnace volume. This furnace apparatus is preferably characterized in that the leak prevention means is a covering element for covering of surface parts of the crucible housing of the crucible unit, wherein the crucible housing comprises carbon, wherein at least 50% (mass) of the crucible housing is made of carbon, wherein the covering element is a sealing element, wherein the sealing element is a coating, wherein the coating comprises pyrocarbon and/or glassy carbon.

This solution is beneficial since the life cycle of the furnace apparatus is increase respectively the service down times and service costs are reduced, since the heating unit does not become damaged due to leaking Si vapor. The coating is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the coating is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. The crucible housing preferably comprises carbon and/or CVD tantalum carbide, in particular for withstanding temperatures above 2,000° C., wherein at least 80% (mass) of the crucible housing is made of carbon and/or CVD tantalum carbide and preferably at least 90% (mass) of the crucible housing is made of carbon and/or CVD tantalum carbide or the crucible housing most preferably completely consists of carbon and/or CVD tantalum carbide, in particular the crucible housing comprises at least 90% (mass) graphite or consists of graphite. The coating is preferably generated by chemical vapor deposition or wherein the coating is generated by painting, in particular of a glassy carbon precursor material, in particular phenol formaldehyde or furfuryl alcohol, and pyrolyzing after painting. The covering element preferably reduces leakage from the crucible volume through the crucible housing to the furnace volume of Si vapor generated during one run by more than 90% (mass) or wherein the covering element limits leakage from the crucible volume through the crucible housing to the furnace volume of Si vapor generated during one run to less than 1% (mass) of the generated Si vapor or to less than 0.5% (mass) of the generated Si vapor or to less than 0.1 (mass) of the generated Si vapor or to less than 0.05% (mass) of the generated Si vapor, in particularly to less than 0.1 kg or less than 0.05 kg or less than 0.01 kg or less than 0,005 kg. The furnace apparatus preferably comprises a pressure unit for setting up a crucible volume pressure inside the crucible volume. The pressure unit is preferably configured to cause a crucible volume pressure (P1) above 2666.45 Pa and preferably above 5000 Pa or in a range between 2666.45 Pa and 50000.00 Pa, in particularly during a production run. The pressure unit is preferably also configured to cause furnace volume pressure (P2) identical or higher compared to crucible volume pressure, in particular of more than 20 Pa or preferably of more than 133,322 Pa or highly preferably of more than 666,612 Pa higher compared to the crucible volume pressure.

A pipe system is preferably part of the furnace apparatus, wherein the pipe system comprises a crucible gas outlet tube connecting the crucible volume with a vacuum unit and a furnace pipe connecting the furnace volume to the vacuum unit, wherein the vacuum unit preferably comprises a control element for controlling the pressure inside the crucible volume and the pressure in the furnace volume, wherein the vacuum unit is preferably configured to reduces pressure inside the crucible volume via crucible gas outlet tube or inside the furnace volume via the furnace pipe in case the control element determines that the pressure inside the crucible volume is above a first threshold and/or in case the control element determines that the pressure inside the furnace volume is above a second threshold. A crucible gas flow unit is preferably provided for causing gas flow along a gas flow path inside the crucible volume, wherein the gas flow unit preferably comprises a crucible gas inlet tube for conducting gas into the crucible volume and a crucible gas outlet tube for removing gas conducted into the crucible volume via the crucible gas inlet tube from the crucible volume. Furthermore, a filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor. The filter unit is preferably arranged between a crucible lower housing and a crucible upper housing, wherein the filter body forms a filter outer surface, wherein the filter outer surface preferably connects the crucible lower housing and the crucible upper housing, wherein the filter outer surface preferably forms a portion of the outer surface of crucible housing. The filter outer surface preferably comprises a filter outer surface covering element, wherein the filter outer surface covering element is preferably a sealing element, wherein the sealing element is preferably a filter coating, wherein the filter coating is preferably generated at the filter surface or attached to the filter surface or forms the filter surface. The filter coating of the outer surface preferably comprises a material or multiple materials selected from a group of materials at least comprising pyrocarbon and glassy carbon, wherein the filter coating of the filter outer surface is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter outer surface is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. The filter inner surface preferably comprises a further filter inner surface covering element, wherein the further filter inner surface covering element preferably is a sealing element, wherein the sealing element preferably is a filter coating, wherein the filter coating preferably is generated at the filter surface or attached to the filter surface or forms the filter surface. The filter coating of the filter inner surface preferably comprises a material or multiple materials selected from a group of materials at least comprising pyrocarbon and glassy carbon, wherein the filter coating of the filter inner surface is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter inner surface is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

The above mentioned object is also solved by a furnace apparatus for growing SiC crystals, wherein this furnace apparatus preferably comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a solid SiC source material is arranged or formed inside the crucible volume, wherein a seed holder unit for holding a defined seed wafer is arranged inside the crucible volume, wherein the seed holder unit comprises a seed wafer attaching surface, wherein the furnace housing inner wall and the crucible housing outer wall define a furnace volume, at least one heating unit for heating the source material, wherein the receiving space for receiving the source material is at least in parts arranged above the heating unit and below the seed holder unit. This solution is characterized in that a filter unit is arranged above the seed holder unit, wherein the filter unit forms an overlapping region, wherein the overlapping region overlaps in vertical direction at least partially and preferably mainly and most preferably entirely a backside surface of the seed holder unit, wherein the seed wafer attaching surface forms the seed holder unit front side and wherein the backside surface is formed on a side of the seed holder unit which is opposite to the seed wafer attaching surface, wherein the overlapping region comprises or forms a heat dissipating means for dissipating heat radiated via the backside surface of the seed holder unit. This solution is beneficial since heat radiated via the backside of the seed holder unit can be dissipated. This causes a beneficial temperature distribution over the growing crystal causing positive effects on crystal growth ration. The heat dissipating means preferably is a filter through hole. The filter unit preferably has a ring-shaped form, wherein the filter unit has an outer surface and an inner surface, wherein the inner surface forms the filter through hole. The filter through hole is preferably arranged above the seed holder unit, wherein a through-hole-center-axis of the filter through hole is preferably arranged parallel, in particular coaxial, to a seed-holder-unit-axis. The through-hole-center-axis is preferably arranged in a distance of less than 50% of the diameter or average diameter or largest diameter of the seed holder unit to the seed-holder-unit-center-axis and/or the filter through hole preferably has a diameter or average diameter or largest diameter of more than 20% of the diameter or average diameter or largest diameter of the seed holder unit. The heat dissipating means is preferably a filter blind hole. The filter unit preferably has a ring-shaped form, wherein the filter unit has an outer surface and an inner surface, wherein the inner surface forms the filter blind hole. The filter blind hole is preferably arranged above the seed holder unit, wherein a blind-hole-center-axis of the filter blind hole is preferably arranged parallel, in particular coaxial, to a seed-holder-unit-axis. The blind-hole-center-axis is preferably arranged in a distance of less than 50% of the diameter or average diameter or largest diameter of the seed holder unit to the seed-holder-unit-center-axis and/or the blind hole preferably has a diameter or average diameter or largest diameter of more than 20% of the diameter or average diameter or largest diameter of the seed holder unit. The diameter or average diameter or largest diameter of the outer surface of the filter unit is preferably more than 110% of the diameter or average diameter or largest diameter of the seed holder unit. The blind hole of the filter unit preferably extends from the side of a filter input surface into the direction of a filter output surface more or up to 10% of the distance or average distance between the filter input surface of the filter unit and the output surface of the filter unit. The heat dissipating means preferably is a filter-unit-cooling-unit, wherein the filter-unit-cooling-unit preferably forms a cooling-fluid-path for guiding a cooling fluid through the filter unit. The filter output surface of the filter unit preferably comprises a filter-cooling-unit-gas-inlet for guiding cooling-fluid into the filter unit and/or the filter output surface of the filter unit comprises a filter-cooling-unit-gas-outlet for guiding the cooling-fluid out of the filter unit. A crucible gas flow unit is preferably provided for causing gas flow along a gas flow path inside the crucible volume, wherein the gas flow unit preferably comprises a crucible gas inlet tube for conducting gas into the crucible volume and a crucible gas outlet tube for removing gas conducted into the crucible volume via the crucible gas inlet tube from the crucible volume and wherein the filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor. The filter unit preferably forms a filter-unit-gas-flow-path from the filter input surface to the output surface, wherein the filter gas flow path is part of the gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 time longer compared to S1. A pressure unit for setting up a crucible volume pressure inside the crucible volume is highly preferably provided, wherein the pressure unit is configured to cause crucible volume pressure above 2666.45 Pa and preferably above 5000 Pa or in a range between 2666.45 Pa and 50000.00 Pa.

The above mentioned object is also solved by a furnace apparatus, in particular a furnace apparatus for growing crystals, in particular for growing SiC crystals, wherein the furnace apparatus preferably comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit, wherein a filter unit for capturing sublimation vapors is provided, wherein the filter unit comprises a filter body, wherein the filter body comprises a filter input surface for inputting $Si_2C$ vapor, $SiC_2$ vapor, Si vapor and one or multiple process gases, in particular argon and/or nitrogen, into the filter body and an output surface for outputting filtered process gases, wherein a filter element is arranged between the filter input surface and the output surface, wherein the filter element forms a trapping section for adsorbing and condensing Si vapor, wherein the filter unit forms a filter outer surface, wherein the filter outer surface comprises a filter outer surface covering element, wherein the filter outer surface covering element is a sealing element, wherein the sealing element is a filter coating, wherein the filter coating is generated at the filter outer surface or attached to the filter outer surface or forms the filter outer surface. This solution is beneficial since the filter unit provides two effects to reduce Si contamination of the heating unit, therefore the overall lifetime of the furnace apparatus can be increase. The filter coating of the outer surface preferably comprises a material or multiple materials selected from a group of materials at least comprising pyrocarbon and glassy carbon. The filter coating of the filter outer surface is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter outer surface is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. The filter unit preferably forms a filter inner surface, wherein the filter inner surface preferably comprises a filter inner surface covering element, wherein the filter inner surface covering element preferably is a sealing element, wherein the sealing element preferably is a filter coating, wherein the filter coating preferably is generated at the filter inner surface or attached to the filter inner surface or forms the filter inner surface. The filter unit preferably is arranged between a crucible lower housing and a crucible upper housing, wherein the filter body preferably forms a filter outer surface, wherein the filter outer surface preferably connects the crucible lower housing and the crucible upper housing, wherein the filter outer surface preferably forms a portion of the outer surface of crucible housing.

The above mentioned object is also solved by a furnace apparatus, in particular a furnace apparatus for growing crystals, in particular for growing SiC crystals, wherein the furnace apparatus preferably comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit, wherein a filter unit for capturing sublimation vapors is provided, wherein the filter unit comprises a filter body, wherein the filter body comprises a filter input surface for inputting $Si_2C$ vapor, $SiC_2$ vapor, Si vapor and one or multiple process gases, in particular argon and/or nitrogen, into the filter body and an output surface for outputting filtered process gases, wherein a filter element is arranged between the filter input surface and the output surface, wherein the filter element forms a trapping section for adsorbing and condensing Si vapor, wherein the filter unit forms a filter inner surface, wherein the filter inner surface comprises a filter inner surface covering element, wherein the filter inner surface covering element is a sealing element, wherein the sealing element is a filter coating, wherein the filter coating is generated at the filter inner surface or attached to the filter inner surface or forms the filter inner surface. This solution is beneficial since the inner surface forms a boundary of a space inside the crucible. Thus, due to the formed boundary sublimation vapor, in particular Si vapor, and/or carrier gas and/or doping gas, cannot enter the surrounded space via the filter inner surface. Therefore, an area above the seed holder unit can be free of solid material and therefore allows improved heat radiation via the backside of the seed holder unit respectively improved heat dissipation. The filter coating of the inner surface preferably comprises a material or multiple materials selected from a group of materials at least comprising pyrocarbon and glassy carbon. The filter coating of the filter inner surface is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter inner surface is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. The filter unit preferably forms a filter outer surface, wherein the filter outer surface comprises a filter outer surface covering element, wherein the filter outer surface covering element preferably is a sealing element, wherein the sealing element preferably is a filter coating, wherein the filter coating preferably is generated at the filter outer surface or attached to the filter outer surface or forms the filter outer surface. The filter inner surface preferably forms a filter through hole or a filter blind hole. The filter through hole or the filter blind hole preferably overlaps in vertical direction at least 30% of a backside surface of the seed holder unit and highly preferably at least 70% of the backside surface of the seed holder unit and most preferably between 75% and 100% or at least or up to 100% of the backside surface of the seed holder unit. A crucible gas flow unit is preferably provided for causing gas flow along a gas flow path inside the crucible volume, wherein the gas flow unit preferably comprises a crucible gas inlet tube for conducting gas into the crucible volume and a crucible gas outlet tube for removing gas conducted into the crucible volume via the crucible gas inlet tube from the crucible volume and the filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor. The filter unit preferably forms a filter-unit-gas-flow-path from the filter input surface to the output surface, wherein the filter gas flow path is preferably part of the gas flow path between the crucible gas inlet tube and the crucible gas outlet tube. The filter unit preferably has a height S1 and wherein the filter-unit-gas-flow-path through the filter unit preferably has a length S2, wherein S2 preferably is at least 2 times, in particular at least 10 times, longer compared to S1. A pressure unit for setting up a crucible volume pressure inside the crucible volume is highly preferably provided, wherein the pressure unit is configured to cause crucible volume pressure above 2666.45 Pa and preferably above 5000 Pa or in a range between 2666.45 Pa and 50000.00 Pa.

The above mentioned object is also solved by a furnace apparatus, in particular a furnace apparatus for growing crystals, in particular for growing SiC crystals, wherein this furnace apparatus comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit. This solution is characterized in that a filter unit for capturing sublimation vapors is provided, wherein the filter unit comprises a filter body, wherein the filter body comprises a filter input surface for inputting gas comprising $Si_2C$ vapor, $SiC_2$ vapor, Si vapor and process gases such as argon and nitrogen into the filter body and an output surface for outputting filtered process gases, wherein a filter element is arranged or formed between the filter input surface and the output surface, wherein the filter element forms a trapping section for adsorbing and condensing at least Si vapor, the filter body forms a filter inner surface, wherein the filter inner surface forms a filter through hole or a filter blind hole and wherein the filter inner surface is arranged in a distance to the filter outer surface. This solution is beneficial since the geometrical properties of the filter unit allow enhanced SiC production and preferably also a flexible design of the filter unit. The filter unit comprises according to a further preferred embodiment of the present invention exactly one filter element, wherein the filter element is preferably fix coupled with the filter body or forms the filter body or wherein the filter element is preferably removably coupled with the filter body. The filter unit comprises according to a further preferred embodiment of the present invention a plurality of filter elements, in particular held by means of the filter body, and/or the filter unit is preferably formed by a plurality of filter sub-units, wherein each filter sub unit preferably comprises at least one filter element or forms one filter element. The filter unit forms according to a further preferred embodiment of the present invention a seed-holder-unit-attaching-section for attaching the seed holder unit and/or the filter unit preferably forms a crucible-lid-attaching-section for attaching a wall member of the crucible housing, in particular a crucible lid. The filter unit forms according to a further preferred embodiment of the present invention multiple filter sections for capturing sublimation vapors, wherein a first filter section is preferably formed to capture Si vapor and wherein a second filter section is preferably formed to capture $Si_2C$ vapor and/or $SiC_2$ vapor, wherein the first filter section and the second filter section differ in at least one and preferably in multiple properties selected from the list of properties: mass, height, density, surface area, material, thermal stability, volume, geometry and/or capacity. The filter through hole is preferably arranged above the seed holder unit, wherein a through-hole-center-axis of the filter through hole is preferably arranged parallel, in particular coaxial, to a seed-holder-unit-axis. The through-hole-center-axis is arranged in a distance of less than 50% of the diameter or average diameter or largest diameter of the seed holder unit to the seed-holder-unit-center-axis and the through hole preferably has a diameter or average diameter or largest diameter of more than 20% of the diameter or average diameter or largest diameter of the seed holder unit. The filter blind hole is preferably arranged above the seed holder unit, wherein a blind-hole-center-axis of the filter blind hole is preferably arranged parallel, in particular coaxial, to a seed-holder-unit-axis. The blind-hole-center-axis is preferably arranged in a distance of less than 50% of the diameter or average diameter or largest diameter of the seed holder unit to the seed-holder-unit-center-axis and the blind hole preferably has a diameter or average diameter or largest diameter of more than 20% of the diameter or average diameter or largest diameter of the seed holder unit. The diameter or average diameter or largest diameter of the outer surface of the filter unit is preferably more than 110% of the diameter or average diameter or largest diameter of the seed holder unit. A crucible gas flow unit is preferably provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume and the filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor. The filter unit preferably forms a filter-unit-gas-flow-path from the filter input surface to the output surface, wherein the filter gas flow path is preferably part of the gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 times, longer compared to S1. The distance between the filter outer surface and the filter inner surface differs according to a further preferred embodiment of the present invention on at least multiple different vertical positions between the filter input surface and the filter output surface or wherein the distance between the filter outer surface and the filter inner surface is preferably at least constant on the majority of vertical positions between the filter input surface and the filter output surface. The filter body is formed according to a further preferred embodiment of the present invention in an annular shape respectively forms an annular shape, wherein the filter outer surface preferably has a tubular shape and wherein the filter inner surface has a tubular shape, wherein the filter outer surface and the filter inner surface extend in vertical direction, in particular in an orthogonal angle to the horizontal axis. The filter outer surface preferably comprises a filter outer surface covering element, wherein the filter outer surface covering element is a sealing element, wherein the sealing element is a filter coating, wherein the filter coating is generated at the filter outer surface or attached to the filter outer surface or forms the filter outer surface and/or wherein the filter inner surface) comprises a filter inner surface covering element, wherein the filter inner surface covering element is a sealing element, wherein the sealing element is a filter coating, wherein the filter coating is generated at the filter inner surface or attached to the filter inner surface or forms the filter inner surface. The filter coating is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. A pressure unit for setting up a crucible volume pressure inside the crucible volume is highly preferably provided, wherein the pressure unit is configured to cause crucible volume pressure above 2666.45 Pa and preferably above 5000 Pa or in a range between 2666.45 Pa and 50000.00 Pa.

The above mentioned object is also solved by a furnace apparatus, in particular a furnace apparatus for growing crystals, in particular for growing SiC crystals, wherein this furnace apparatus comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged above the heating unit and below the seed holder unit. This furnace apparatus is characterized in that the furnace apparatus comprises a crucible gas flow unit, wherein the crucible gas flow unit comprises a crucible gas inlet tube for conducting gas into the crucible volume, wherein the crucible gas inlet tube is arranged in vertical direction below the receiving space. This solution is beneficial since due to the crucible gas inlet tube a gas flow and a gas pressure can be generated inside the crucible. Both, the gas flow through or around the receiving space and the gas pressure affect crystal growth in a beneficial manner, since both effects cause higher mass transfer from the receiving space to the seed wafer respectively to the growing crystal. The receiving space is preferably located between the crucible gas inlet tube and the seed holder unit for conducting gas flow around the receiving space and/or through the receiving space. A source-material-holding-plate is preferably provided, wherein the source-material-holding-plate preferably comprises an upper surface forming a bottom section of the receiving space and a lower surface preferably forming a source-material-holding-plate-gas-flow-path-boundary-section. The source-material-holding-plate preferably comprises multiple through holes, wherein the multiple through holes preferably extend from the upper surface of the source-material-holding-plate through a main body of the source-material-holding-plate to the lower surface of source-material-holding-plate, wherein at least the majority of the multiple through holes has a diameter of less than 12 mm, in particular less than 10 mm and preferably less than 6 mm and highly preferably less than 2 mm and most preferably of 1 mm or less than 1 mm. The number of through holes through the main body of the source-material-holding-plate preferably depends on the surface size of the upper surface of the source-material-holding-plate, wherein at least one though hole is preferably provided per 10 $cm^2$ surface size of the upper surface. The number of through holes per 10 $cm^2$ is preferably higher in a radially outer section of the source-material-holding-plate compared to a radially inner section of the source-material-holding-plate, wherein the radially inner section preferably extends up to 20% or 30% or 40% or 50% of the radial extension of the source-material-holding-plate, wherein the radially outer section of the source-material-holding-plate preferably extends between the radially inner section and the radial end of the source-material-holding-plate. The lower surface of the source-material-holding-plate preferably forms together with a bottom wall section of the crucible housing a gas-guide-gap or gas-guide-channel for guiding gas from the crucible gas inlet tube to the receiving space or around the receiving space, in particular to the through holes of the source-material-holding-plate. The furnace apparatus preferably comprises a pressure unit for setting up a crucible volume pressure inside the crucible volume. The pressure unit is preferably configured to cause a crucible volume pressure above 2666.45 Pa and preferably above 5000 Pa or in a range between 2666.45 Pa and 50000.00 Pa, in particularly during a production run. The pressure unit is preferably also configured to cause furnace volume pressure identical or higher compared to crucible volume pressure, in particular of more than 20 Pa or preferably of more than 133,322 Pa or highly preferably of more than 666,612 Pa higher compared to the crucible volume pressure.

A pipe system is preferably part of the furnace apparatus, wherein the pipe system preferably comprises a crucible pipe preferably connecting the crucible volume with a vacuum unit and a furnace pipe preferably connecting the furnace volume to the vacuum unit, wherein the vacuum unit preferably comprises a control element for controlling the pressure inside the crucible volume and the pressure in the furnace volume, wherein the vacuum unit preferably reduces pressure inside the crucible volume via the crucible pipe or inside the furnace volume via the furnace pipe in case the control element determines that the pressure inside the crucible volume is above a first threshold and/or in case the control element determines that the pressure inside the furnace volume is above a second threshold. A crucible vacuum outlet tube for removing gas from the crucible volume is preferably provided, wherein the crucible gas inlet tube is preferably arranged in gas flow direction before a filter unit and wherein the crucible vacuum outlet tube is preferably arranged in gas flow direction after a filter unit. The filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor. The filter unit preferably forms a filter-unit-gas-flow-path from the filter input surface to the filter output surface, wherein the filter gas flow path is preferably part of the gas flow path between the crucible gas inlet tube and the crucible gas outlet tube, wherein the filter unit preferably has a height Si and wherein the filter-unit-gas-flow-path through the filter unit preferably has a length S2, wherein S2 is at least 2 times, in particular 10 times, longer compared to S1. The filter unit forms a filter outer surface, wherein the filter outer surface preferably comprises a filter outer surface covering element, wherein the filter outer surface covering element preferably is a sealing element, wherein the sealing element preferably is a filter coating, wherein the filter coating preferably is generated at the filter outer surface or attached to the filter outer surface or forms the filter outer surface. The filter coating of the filter outer surface preferably is formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter outer surface preferably is formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm. A covering element for covering of surface parts of the crucible housing of the crucible unit is preferably provided, wherein the crucible housing preferably comprises carbon, wherein at least 50% (mass) of the crucible housing is preferably made of carbon, wherein the covering element is preferably a sealing element, wherein the sealing element is preferably a coating, wherein the coating preferably comprises pyrocarbon and/or glassy carbon. The coating is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the coating is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

The above mentioned object is also solved by a furnace apparatus for growing a crystal, in particular for growing SiC crystals. This solution preferably comprises at least a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material. The receiving space for receiving the source material is at least in parts arranged above the heating unit and below the seed holder unit. This solution is characterized in that a pressure unit for setting up a crucible volume pressure inside the crucible volume is provided. The pressure unit is preferably configured to cause a crucible volume pressure above 2666.45 Pa and preferably above 5000 Pa or in a range between 2666.45 Pa and 50000.00 Pa, in particularly during a production run. The pressure unit is preferably also configured to cause furnace volume pressure identical or higher compared to crucible volume pressure, in particular of more than 20 Pa or preferably of more than 133,322 Pa or highly preferably of more than 666,612 Pa higher compared to the crucible volume pressure. This embodiment is beneficial since due to the pressure above 2666.45 Pa a dense gas flow is generated that causes an improved mass flux from the source material to the seed wafer.

Alternatively this furnace apparatus is characterized in that a pressure unit for setting up a crucible volume pressure inside the crucible volume and a furnace volume pressure inside the furnace volume but outside the crucible housing is provided. This solution is beneficial since due to the higher pressure inside the furnace volume compared to the pressure inside the crucible housing leakage of sublimation vapors, in particular Si vapor, is prevented. This causes a substantially increase in the life span of the heating unit respectively a significant reduction in service costs.

The pressure unit is preferably additionally or alternatively configured to cause crucible volume pressure below 66661.2 Pa or in a range between 2666.45 Pa and 39996.7 Pa, and to cause furnace volume pressure of more than 133,322 Pa or highly preferably more than 666,612 Pa higher compared to the crucible volume pressure. A pipe system is preferably part of the pressure unit, wherein the pipe system comprises a crucible pipe connecting the crucible volume via a crucible vacuum outlet tube with a vacuum unit and a furnace pipe connecting the furnace volume to the vacuum unit, wherein the vacuum unit comprises a control element for controlling the pressure inside the crucible volume and the pressure in the furnace volume, wherein the vacuum unit is configured to reduce pressure inside the crucible volume via the crucible pipe or inside the furnace volume via the furnace pipe in case the control element determines that the pressure inside the crucible volume is above a first threshold and/or in case the control element determines that the pressure inside the furnace volume is above or below a second threshold, wherein the second threshold represents a higher pressure compared to the first threshold. A crucible gas inlet tube for conducting gas into the crucible volume is preferably provided. The crucible gas inlet tube is preferably arranged in vertical direction below the receiving space. The receiving space is preferably located between the crucible gas inlet tube and the seed holder unit for conducting gas flow around the receiving space and/or through the receiving space. A source material holding plate is preferably provided, wherein the source material holding plate preferably comprises an upper surface forming a bottom section of the receiving space and a lower surface forming a source-material-holding-plate-gas-flow-path-boundary-section. A growth guide is preferably arranged inside the crucible housing, wherein the growth guide preferably forms a growth-guide-gas-path-section-boundary for guiding gas flow into the direction of the seed holder unit. The growth guide and the seed holder unit preferably form a gas-flow passage, wherein the control element is preferably configured to set up a gas flow velocity through the gas flow passage, in particular by controlling gas supply into the crucible housing via crucible gas inlet tube and/or by controlling gas removal from the crucible housing via the crucible gas outlet tube, wherein gas flow through the gas flow passage is preferably between 1 cm/s and 10 cm/s and preferably between 2 cm/s and 6 cm/s. The seed holder unit and the growth guide are preferably arranged in a distance to each other to form the gas flow passage, wherein the distance between the seed holder unit and the growth guide is preferably more than 0.1% of the diameter of the seed holder unit and highly preferably more than or up to 2% of the diameter of the seed holder unit or less than 10 cm and most preferably in a range between 0.5 cm and 10 cm. A filter unit is preferably arranged inside the crucible volume between the crucible gas inlet tube and the crucible gas outlet tube for capturing at least $Si_2C$ sublimation vapor, $SiC_2$ sublimation vapor and Si sublimation vapor, wherein a gas flow path extends through the filter unit. The filter element preferably comprises filter particles and a filter binder, wherein the filter particles preferably comprise carbon, wherein the filter binder preferably holds the filter particles in fixed relative positions to each other.

The filter unit preferably forms a filter outer surface, wherein the filter outer surface preferably comprises a filter outer surface covering element, wherein the filter outer surface covering element is a sealing element, wherein the sealing element is a filter coating, wherein the filter coating is generated at the filter outer surface or attached to the filter outer surface or forms the filter outer surface. The filter coating of the filter outer surface is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating of the filter outer surface is formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

The crucible housing preferably comprises carbon, wherein at least 50% (mass) of the crucible housing is preferably made of carbon, wherein the covering element is a sealing element, wherein the sealing element is a coating, wherein the coating comprises pyrocarbon and/or glassy carbon. The coating preferably is formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the coating is formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

The above-mentioned object is also solved by a furnace apparatus for growing a crystal, in particular for growing SiC crystals. This furnace apparatus preferably comprises at least a furnace unit, wherein the furnace unit preferably comprises a furnace housing with an outer surface and an inner surface, at least one crucible unit, wherein the crucible unit is preferably arranged inside the furnace housing, wherein the crucible unit preferably comprises a crucible housing, wherein the crucible housing preferably has an outer surface and an inner surface, wherein the inner surface at least partially defines a crucible volume, wherein a receiving space for receiving a source material is preferably arranged or formed inside the crucible volume, wherein a seed holder unit for holding a defined seed wafer is preferably arranged inside the crucible volume, wherein the furnace housing inner wall and the crucible housing outer wall preferably define a furnace volume, at least one heating unit for heating the source material, wherein the receiving space for receiving the source material is preferably at least in parts arranged above the heating unit and below the seed holder unit. This furnace apparatus is characterized in that the furnace apparatus preferably comprises a crucible gas flow unit for causing a gas flow inside the crucible volume, wherein the crucible gas flow unit preferably comprises a crucible gas inlet tube for conducting gas into the crucible volume and a crucible gas outlet tube for conducting gas out of the crucible volume. A growth guide is preferably arranged inside the crucible housing, wherein the growth guide preferably forms a growth-guide-gas-path-section-boundary for guiding the gas flow into the direction of the seed holder unit, wherein the growth guide and the seed holder unit preferably form a gas-flow passage, wherein a control element is preferably provided for setting up a gas flow velocity between 1 cm/s and 10 cm/s and preferably between 2 cm/s and 6 cm/s through the gas flow passage, in particular by controlling gas supply into the crucible housing via crucible gas inlet tube and/or by controlling gas removal from the crucible housing via the crucible gas outlet tube. This solution is beneficial since a velocity between 1 cm/s and 10 cm/s allows high deposition rates without causing clogging of the gas flow path. Furthermore, at a velocity between 1 cm/s and 10 cm/s source material losses are only marginal. The receiving space is preferably located between the crucible gas inlet tube and the seed holder unit for conducting gas flow around the receiving space and/or through the receiving space. A source-material-holding-plate is preferably provided, wherein the source-material-holding-plate comprises an upper surface forming a bottom section of the receiving space and a lower surface forming a source-material-holding-plate-gas-flow-path-boundary-section. The source-material-holding-plate preferably comprises multiple through holes, wherein the multiple through holes extend from the upper surface of the source-material-holding-plate through a main body of the source-material-holding-plate to the lower surface of source-material-holding-plate, wherein at least the majority of the multiple through holes has a diameter of less than 12 mm, in particular less than 10 mm and preferably less than 6 mm and highly preferably less than 2 mm and most preferably of 1 mm or less than 1 mm. A filter unit is preferably arranged inside the crucible volume between the seed holder unit and the crucible gas outlet tube for capturing at least $Si_2C$ sublimation vapor, $SiC_2$ sublimation vapor and Si sublimation vapor. The filter unit preferably forms a filter-unit-gas-flow-path from a filter input surface to a filter output surface, wherein the filter gas flow path is part of a gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 times, longer compared to S1. A pressure unit for setting up a crucible volume pressure inside the crucible volume is preferably provided, wherein the pressure unit is configured to cause crucible volume pressure above 2666.45 Pa and preferably above 5000 Pa or in a range between 2666.45 Pa and 50000.00 Pa.

The above mentioned object is also solved by a method for producing at least one SiC crystal, the method preferably comprises at least the steps: Providing a furnace apparatus for growing a crystal, in particular for growing SiC crystals, wherein the furnace apparatus preferably comprises a furnace unit, wherein the furnace unit preferably comprises a furnace housing with an outer surface and an inner surface, at least one crucible unit, wherein the crucible unit is preferably arranged inside the furnace housing, wherein the crucible unit comprises a crucible housing, wherein the crucible housing preferably has an outer surface and an inner surface, wherein the inner surface at least partially defines a crucible volume, wherein a receiving space for receiving a source material is preferably arranged or formed inside the crucible volume, wherein a seed holder unit for holding a defined seed wafer is preferably arranged inside the crucible volume, wherein the furnace housing inner wall and the crucible housing outer wall preferably define a furnace volume, at least one heating unit for heating the source material, wherein the receiving space for receiving the source material is preferably at least in parts arranged above the heating unit and below the seed holder unit, a crucible gas flow unit for causing a gas flow inside the crucible volume, wherein the crucible gas flow unit comprises preferably a crucible gas inlet tube for conducting gas into the crucible volume and preferably a crucible gas outlet tube for conducting gas out of the crucible volume, a growth guide is preferably arranged inside the crucible housing, wherein the growth guide preferably forms a growthguide-gas-path-section-boundary for guiding the gas flow into the direction of the seed holder unit, wherein the growth guide and the seed holder unit preferably form a gas-flow passage, positioning of solid source material in the receiving space, establishing gas flow through the crucible volume by conducting at least a carrier gas into the crucible volume through the crucible gas inlet tube and by conducting at least the carrier gas out of the crucible volume through the crucible gas outlet tube, establishing a defined gas flow velocity through the gas-flow passage by controlling gas flow through the crucible gas inlet tube into the crucible volume and/or establishing the defined gas flow velocity through the gas-flow passage by controlling gas flow through the crucible gas outlet tube out of the crucible volume, wherein the defined gas flow velocity is preferably between 1 cm/s and 10 cm/s and preferably between 2 cm/s and 6 cm/s. The receiving space is preferably located between the crucible gas inlet tube and the seed holder unit. The method preferably also comprises the step of conducting gas flow around the receiving space and/or through the receiving space. A source-material-holding-plate is preferably provided, wherein the source-material-holding-plate comprises an upper surface forming a bottom section of the receiving space and a lower surface forming a source-material-holding-plate-gas-flowpath-boundary-section, wherein the source-material-holding-plate comprises multiple through holes, wherein the multiple through holes extend from the upper surface of the source-material-holding-plate through a main body of the source-material-holding-plate to the lower surface of source-material-holding-plate, wherein at least the majority of the multiple through holes has a diameter of less than 12 mm, in particular less than 10 mm and preferably less than 6 mm and highly preferably less than 2 mm and most preferably of 1 mm or less than 1 mm. The method preferably also comprises the step of guiding the gas provided via the crucible gas inlet tube through the multiple through holes of the source-material-holding-plate into the receiving space. At least 50% (mass) or preferably at least 70% (mass) or highly preferably at least 80% (mass) or most preferably at least 90% (mass) of the source material is provided as fragments having a volume of more than 0.5 $cm^3$ or preferably of more than 1 $cm^3$ or highly preferably of more than 1.5 $cm^3$ or most preferably of more than 2 $cm^3$ or of more than 5 $cm^3$, wherein the fragments of source material are preferably arranged as accumulated cluster, or at least 50% (mass) or preferably at least 70% (mass) or highly preferably at least 80% (mass) or most preferably at least 90% (mass) of the source material is provided as one or multiple solid bodies, wherein the one solid body has a volume above 10 $cm^3$ or above 20 $cm^3$ or wherein each of the multiple solid bodies has a volume 10 $cm^3$ or above 20 $cm^3$. The method preferably also comprises the step of guiding the gas provided via the crucible gas inlet tube through the multiple through holes of the source-material-holding-plate and through the cluster of source material fragments or around the solid body or around the multiple solid bodies. The source material preferably comprises less than 99.9999% (ppm wt) and preferably less than 99.99999% (ppm wt) and highly preferably less than 99.999999% (ppm wt) and most preferably less than 99.999999% (ppm wt) of one, multiple or all of the following substances B (Bor), Al (Aluminium), P (Phosphor), Ti (Titan), V (Vanadium), Fe (Eisen), Ni (Nickel). A filter unit is preferably arranged inside the crucible volume between the seed holder unit and the crucible gas outlet tube for capturing at least $Si_2C$ sublimation vapor, $SiC_2$ sublimation vapor and Si sublimation vapor, wherein the filter unit preferably forms a filter-unit-gas-flow-path from a filter input surface to a filter output surface, wherein the filter gas flow path is part of a gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 times, longer compared to S1. The method preferably also comprises the step of guiding gas from the gas flow passage to the filter input surface and from the filter input surface through the filter unit to a filter output surface and from the filter output surface to the crucible gas outlet tube. The method preferably also comprises the step of generating a crucible volume pressure (P1) inside the crucible volume above 2666.45 Pa and preferably above 5000 Pa or in a range between 2666.45 Pa and 50000.00 Pa.

The above mentioned object is also solved by a method for the production of at least one SiC crystal. This method preferably comprises at least the steps: Providing a CVD reactor for the production of SiC of a first type, introducing at least one source gas, in particular a first source gas, in particular SiCl3(CH3), into a process chamber, the source gas comprising Si and C, introducing at least one carrier gas into the process chamber, the carrier gas preferably comprising H, electrically energizing at least one separator element disposed in the process chamber to heat the separator element, wherein the surface of the deposition element is heated to a temperature in the range between 1300° C. and 1700° C., depositing SiC of the first type onto the separator element, in particular at a deposition rate of more than 200 μm/h, removing the deposited SiC of the first type from the PVT reactor and transforming the removed SiC into fragmented SiC of the first type or into one or multiple solid bodies SiC of the first type. This method preferably also comprises the steps: Providing a PVT reactor for the production of SiC of a second type, wherein the PVT reactor comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the seed wafer holder holds a seed wafer, wherein the furnace housing inner wall and the crucible housing outer wall define a furnace volume, at least one heating unit for heating the source material, wherein the receiving space for receiving the source material is at least in parts arranged above the heating unit and below the seed holder unit, adding the fragmented SiC of the first type or adding one or multiple solid bodies SiC of the first type as source material into the receiving space and sublimating the SiC of the first type and depositing the sublimated SiC on the seed wafer, in particular to form SiC of the second type or as SiC of the second type. This method is beneficial since highly pure SiC can be produced in short time, therefore SiC of high quality can be produced. At least 50% (mass) or preferably at least 70% (mass) or highly preferably at least 80% (mass) or most preferably at least 90% (mass) of the fragmented SiC of the first type is provided as fragments having a volume of more than 0.5 $cm^3$ or preferably of more than 1 $cm^3$ or highly preferably of more than 1.5 $cm^3$ or most preferably of more than 2 $cm^3$ or of more than 5 $cm^3$ or at least 50% (mass) or preferably at least 70% (mass) or highly preferably at least 80% (mass) or most preferably at least 90% (mass) of the source material is provided as the one or as the multiple solid bodies, wherein the one solid body has a volume above 10 $cm^3$ or above 20 $cm^3$ or wherein each of the multiple solid bodies has a volume 10 $cm^3$ or above 20 $cm^3$.

Due to usage of fragments of SiC of the first type as source material danger of contaminating the growing crystal with source material dust is very small due to the mass of the individual fragments. The fragmented SiC of the first type preferably comprises less than 99.9999% (ppm wt) and preferably less than 99.99999% (ppm wt) and highly preferably less than 99.999999% (ppm wt) and most preferably less than 99.999999% (ppm wt) of one, multiple or all of the following substances B (Bor), Al (Aluminium), P (Phosphor), Ti (Titan), V (Vanadium), Fe (Eisen), Ni (Nickel). The gases introduced into the CVD reactor preferably comprise less than 99.9999% (ppm wt) and preferably less than 99.99999% (ppm wt) and highly preferably less than 99.999999% (ppm wt) and most preferably less than 99.999999% (ppm wt) of one, multiple or all of the following substances B (Bor), Al (Aluminium), P (Phosphor), Ti (Titan), V (Vanadium), Fe (Eisen), Ni (Nickel). A crucible gas flow unit for causing a gas flow inside the crucible volume is preferably provided, wherein the crucible gas flow unit preferably comprises a crucible gas inlet tube for conducting gas into the crucible volume and a crucible gas outlet tube for conducting gas out of the crucible volume. A growth guide is preferably arranged inside the crucible housing, wherein the growth guide preferably forms a growth-guide-gas-path-section-boundary for guiding the gas flow into the direction of the seed holder unit, wherein the growth guide and the seed holder unit preferably form a gas-flow passage. This method preferably also comprises the step of establishing gas flow through the crucible volume by conducting at least a carrier gas into the crucible volume through the crucible gas inlet tube and by conducting at least the carrier gas out of the crucible volume through the crucible gas outlet tube, and/or establishing a defined gas flow velocity through the gas-flow passage by controlling gas flow through the crucible gas inlet tube into the crucible volume and/or establishing the defined gas flow velocity through the gas-flow passage by controlling gas flow through the crucible gas outlet tube out of the crucible volume, wherein the defined gas flow velocity is preferably between 1 cm/s and 10 cm/s and preferably between 2 cm/s and 6 cm/s. The receiving space is preferably located between the crucible gas inlet tube and the seed holder unit. This method preferably also comprises the step of conducting gas flow around the receiving space and/or through the receiving space. A filter unit is preferably arranged inside the crucible volume between the seed holder unit and the crucible gas outlet tube for capturing at least $Si_2C$ sublimation vapor, $SiC_2$ sublimation vapor and Si sublimation vapor, wherein the filter unit preferably forms a filter-unit-gas-flow-path from a filter input surface to a filter output surface, wherein the filter gas flow path is preferably part of a gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 times, longer compared to S1. This method preferably also or alternatively comprises the step of guiding gas from the gas flow passage to the filter input surface and from the filter input surface through the filter unit to a filter output surface and from the filter output surface to the crucible gas outlet tube. According to a highly preferred embodiment of the present invention a pressure unit for setting up a crucible volume pressure inside the crucible volume is provided. A pressure unit is preferably provided, wherein the pressure unit is highly preferably configured to cause a crucible volume pressure above 2666.45 Pa and preferably above 5000 Pa or in a range between 2666.45 Pa and 50000.00 Pa, in particularly during a production run. The pressure unit is preferably also configured to cause furnace volume pressure identical or higher compared to crucible volume pressure, in particular of more than 20 Pa or preferably of more than 133,322 Pa or highly preferably of more than 666,612 Pa higher compared to the crucible volume pressure. The method preferably also comprises the step of generating a crucible volume pressure inside the crucible volume above 2666.45 Pa and preferably above 5000 Pa or in a range between 2666.45 Pa and 50000.00 Pa.

The above-mentioned object is also solved by a method for producing SiC material. This method preferably comprises at least the steps: Providing at least one furnace apparatus according to the present invention, in particular according to the claims; Arranging source material in a receiving space within the crucible housing; Heating the source material; and preferably Feeding a carrier gas into the crucible housing.

This solution is beneficial since SiC material with improved properties can be produced.

According to a further preferred embodiment of the present invention the method comprises the step of removing the carrier gas from the crucible housing via a crucible gas outlet tube. This embodiment is beneficial since a gas flow can be generated within the respectively through the crucible. Due to the gas flow higher deposition rates and advanced crystal growth can be caused.

According to a further preferred embodiment of the present invention at least 50% (mass) or preferably at least 70% (mass) or highly preferably at least 80% (mass) or most preferably at least 90% (mass) of the source material is provided as fragments having a volume of more than 0.5 $cm^3$ or preferably of more than 1 $cm^3$ or highly preferably of more than 1.5 $cm^3$ or most preferably of more than 2 $cm^3$ or of more than 5 $cm^3$ or at least 50% (mass) or preferably at least 70% (mass) or highly preferably at least 80% (mass) or most preferably at least 90% (mass) of the source material is provided as one or multiple solid bodies, wherein the one solid body has a volume above 10 $cm^3$ or above 20 $cm^3$ or wherein each of the multiple solid bodies has a volume 10 $cm^3$ or above 20 $cm^3$.

This embodiment is beneficial since due to the high mass of the individual fragments dust of solid particles can be avoided. Since dust of solid particles can be avoided the overall quality of the produced SiC crystal is improved.

According to a further preferred embodiment of the present invention the source material is solid SiC material, wherein the source material comprises less than 99.9999% (ppm wt) and preferably less than 99.99999% (ppm wt) and highly preferably less than 99.999999% (ppm wt) and most preferably less than 99.999999% (ppm wt) of one, multiple or all of the following substances B (Bor), Al (Aluminium), P (Phosphor), Ti (Titan), V (Vanadium), Fe (Eisen), Ni (Nickel). This embodiment is beneficial since the purity of the produced SiC crystal is improved over the prior art.

According to a further preferred embodiment of the present invention the method comprises the step: Generating a crucible volume pressure inside the crucible volume above 2666.45 Pa and preferably above 5000 Pa or in a range between 2666.45 Pa and 50000.00 Pa.

According to a further preferred embodiment of the present invention the method can comprise the step: Generating a furnace volume pressure inside the furnace volume but outside the crucible housing, wherein the furnace volume pressure is higher than the crucible volume pressure, wherein furnace volume pressure is preferably more than 133,322 Pa or highly preferably more than 666,612 Pa higher compared to the crucible volume pressure.

According to a further preferred embodiment of the present invention the method comprises the steps: Feeding a carrier gas into the crucible housing via a crucible gas inlet tube and/or, in particular then, guiding the carrier gas through a filter unit arranged inside the crucible housing and/or, in particular then, removing the carrier gas from the crucible housing via a crucible gas outlet tube.

Further benefits, goals and features of the present invention will be described by the following specification of the attached figures, in which components of the invention are exemplarily illustrated. Components of the devices and methods according to the inventions, which match at least essentially with respect to their function, can be marked with the same reference sign, wherein such components do not have to be marked or described in all figures.

For a more complete understanding of the present invention and advantages thereof, reference is now made to the following description taken in conjunction with the accompanying drawings. The invention is explained in more detail below using an exemplary embodiment which is specified in the schematic figures of the drawings, in which:

DETAILED DESCRIPTION

Figure 1:
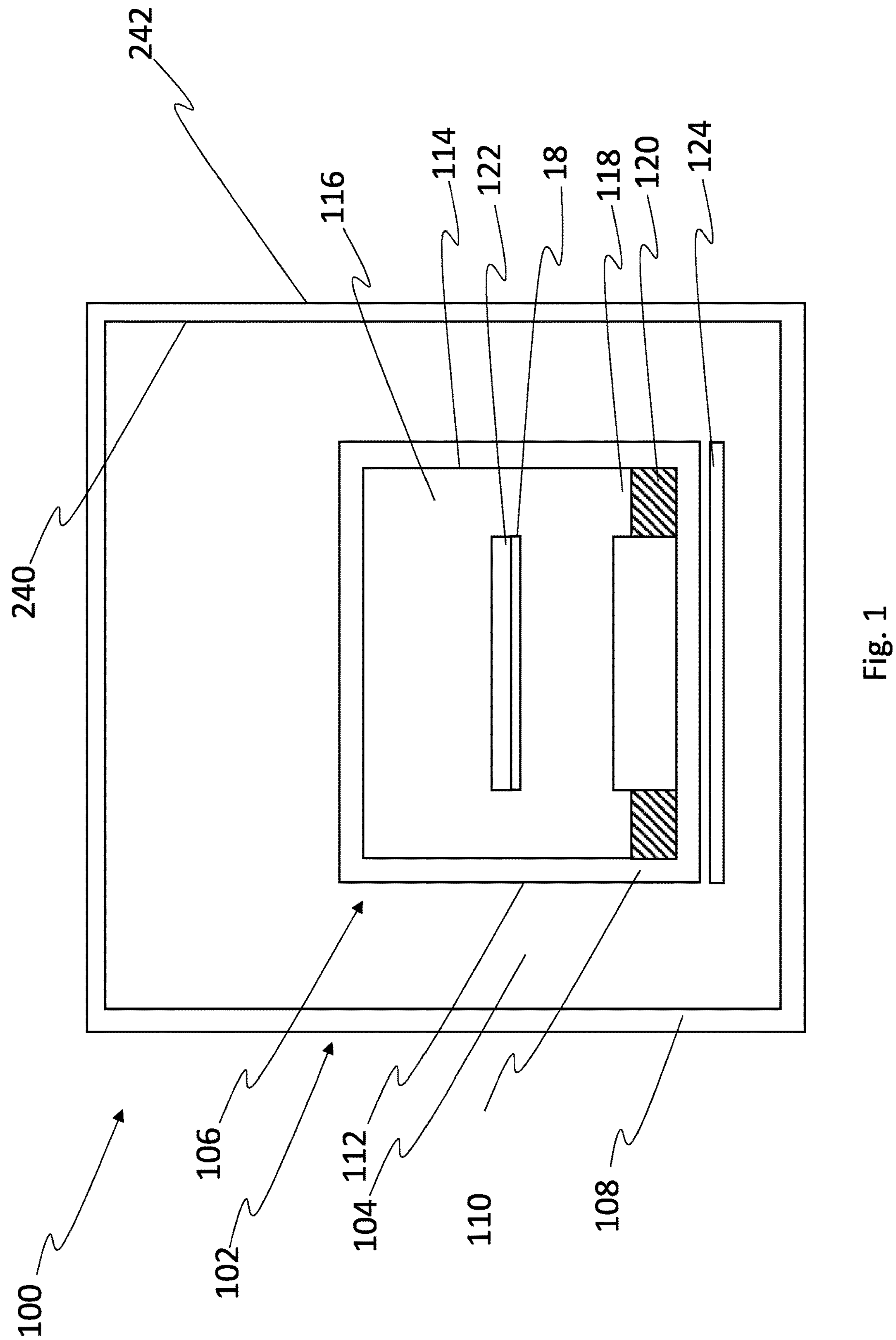
FIG. 1 shows a basic configuration of the furnace apparatus according to the present invention.

FIG. 1 shows a furnace apparatus 100, in particular a furnace apparatus 100 for growing crystals, and in particular for growing SiC crystals. The furnace apparatus 100 preferably comprises a furnace unit 102 which incorporates at least one crucible unit 106. The furnace unit 102 is defined by a furnace housing 108 which has a furnace housing inner surface 240 and a furnace housing outer surface 242. The crucible unit 106 is defined by a crucible housing 110 which has a crucible housing outer surface 112 and a crucible housing inner surface 114. The crucible housing inner surface 114 at least partially defines a crucible volume 116. The furnace housing inner surface 240 and the crucible housing outer surface 112 define a furnace volume 104. The furnace apparatus 100 also comprises a receiving space 118 for receiving a source material 120. The receiving space 118 is arranged or formed inside the crucible volume 116 and/or as part of the crucible housing 110. Furthermore, a seed holder unit 122 for holding a defined seed wafer 18 is arranged inside the crucible volume 116. The furnace unit 102 also comprises at least one heating unit 124 for heating the source material 120.

The receiving space 118 for receiving the source material 120 is preferably arranged on a level below the seed holder unit 122 and on a level above the heating unit 124. Additionally, or alternatively the receiving space 118 for receiving the source material 120 is preferably arranged such that there is no source material 120 directly between the heating unit 124 and the seed holder unit 122.

The crucible housing 110 preferably comprises carbon, in particular at least 50% (mass) of the crucible housing 110 is made of carbon and preferably at least 80% (mass) of the crucible housing 110 is made of carbon and more preferably at least 90% (mass) of the crucible housing 110 is made of carbon or the crucible housing 110 complete consists of carbon, in particular the crucible housing 110 comprises at least 90% (mass) graphite or consists of graphite, to withstand temperatures above 2,000° C., in particular at least or up to 3,000° C. or at least up to 3,000° C. or up to 3,500° C. or at least up to 3,500° C. or up to 4,000° C. or at least up to 4,000° C., wherein the crucible housing 110 is minimally permeable to silicon gas (Si vapor).

Figures 2A, 2B, 2C, 2D, 2E, 2F:
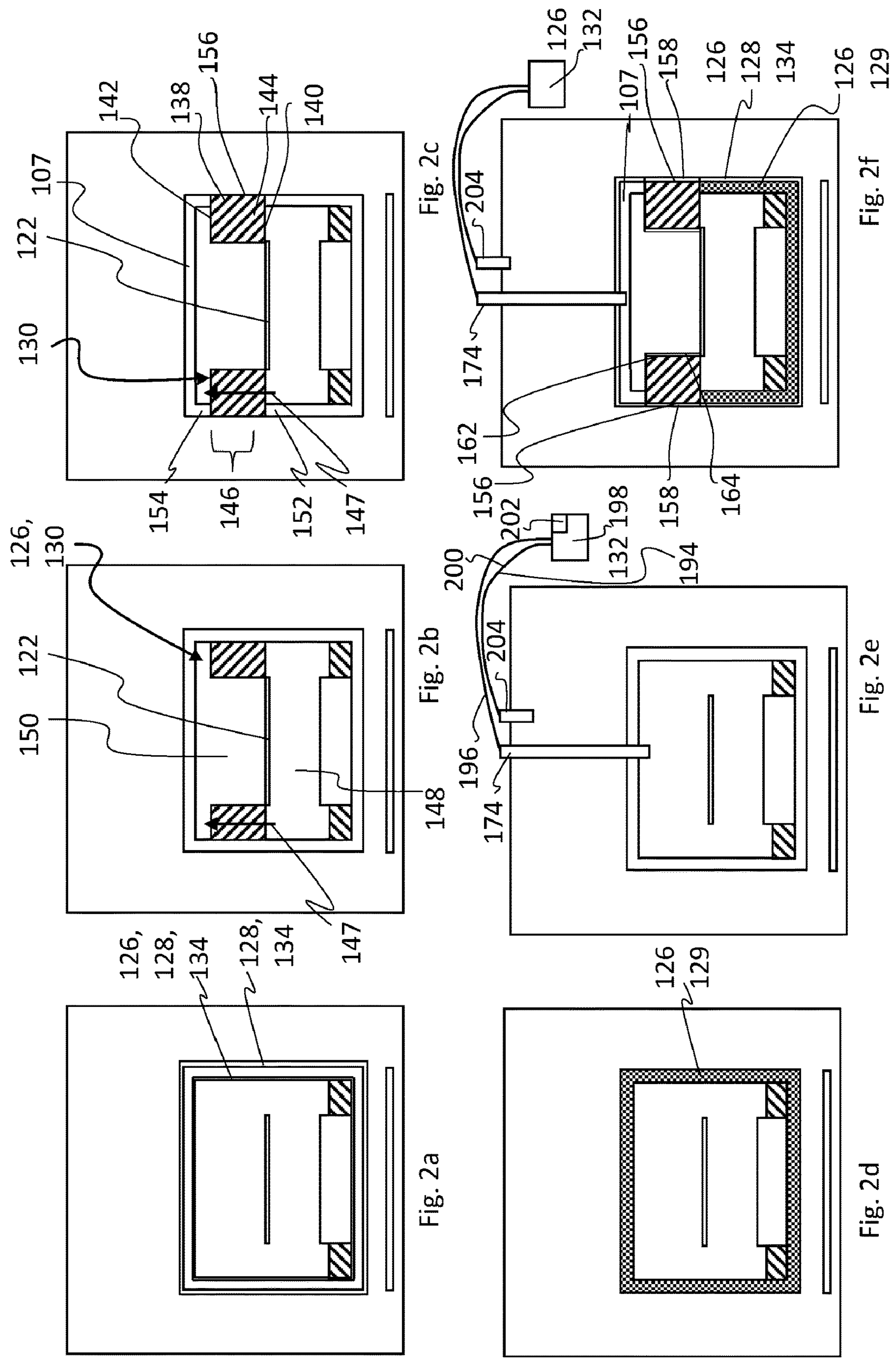
FIG. 2*a* shows an example of a furnace apparatus according to the invention having at least one leak prevention means.
FIG. 2*b* shows an example of a furnace apparatus according to the invention having at least one leak prevention means.
FIG. 2*c* shows an example of a furnace apparatus according to the invention having at least one leak prevention means.
FIG. 2*d* shows an example of a furnace apparatus according to the invention having at least one leak prevention means.
FIG. 2*e* shows an example of a furnace apparatus according to the invention having at least one leak prevention means.
FIG. 2*f* shows an example of a furnace apparatus according to the invention having at least one leak prevention means.

FIGS. 2*a-f* show different schematic examples for a furnace apparatus 100 having at least one leak prevention means 126. Thus, the furnace apparatus 100 preferably comprises at least one or more than one leak prevention means 126 for preventing leakage of gaseous silicon during operation, in particular during crystal growth, from the crucible volume 116 to the furnace volume 104. The leak prevention means 126 is selected from a group of leak prevention means 128, 130, 132. FIG. 2*a* shows an example of a leak prevention means 126 which is formed or materialized as covering element 128 for covering of surface parts 112, 114.

FIG. 2*a* shows that the covering element 128 can be applied to the crucible housing inner surface 114 and/or to the crucible housing outer surface 112. However, it is also possible that some sections of the crucible housing inner surface 114 comprise the covering element 128 and/or some sections of the crucible housing outer surface 112 comprise the covering element 128.

The covering element 128 is a sealing element 134, wherein the sealing element 134 is a coating 134. The coating 134 comprises a material or a material combination that reduces leakage from the crucible volume 116 through the crucible housing 110 to the furnace volume 104 of sublimation vapors, in particular Si vapor, generated during one run, in particular by at least 50% (mass) or by at least 80% (mass) or by at least 90% (mass) or by more than 99% (mass) or by at least 99.9% (mass).

The coating 134 withstands temperatures above 2,000° C., in particular at least or up to 3,000° C. or at least up to 3,000° C. or up to 3,500° C. or at least up to 3,500° C. or up to 4,000° C. or at least up to 4,000° C. The coating 134 comprises a material or multiple materials selected from a group of materials at least comprising: carbon, in particular pyrocarbon and glassy carbon. In the case where the coating 134 is pyrocarbon, it can be generated by chemical vapor deposition. In the case where the coating is glassy carbon, it can be generated by brush or spray application of a suitable precursor such as phenol formaldehyde resin which is then pyrolyzed into glassy carbon.

FIG. 2*d* shows an additional or alternative example of leak prevention means 126, according to which a density increasing element 129 for increasing the density of a volume section of the crucible housing 110 of the crucible unit 106 is shown.

FIGS. 2*b* and 2*c* show that a filter unit 130 for capturing gaseous Si is additionally or alternatively provided as leak prevention means 126. The filter unit 130 comprises a filter body 138. The filter body 138 comprises a filter input surface 140 for inputting gas, in particular comprising Si vapor, into the filter body 138 and a filter output surface 142 for outputting filtered gas. A filter element 144 is arranged between the filter input surface 140 and the output surface 142, wherein the filter element 144 forms a trapping section 146 for adsorbing and condensing Si vapor on the internal surfaces of the filter element 144.

According to FIG. 2*b* the filter unit 130 is completely arranged inside the crucible housing 110. According to FIG. 2*c* a filter outer surface 156 (cf. FIG. 2*f*) of the filter unit 130 forms an outer wall section respectively a surface section of the crucible housing 110. The covering element 128 can be applied to the filter outer surface 156 or the covering element 128 can be provided or arranged on the filter outer surface.

In both cases (FIGS. 2*b* and 2*c*) the filter element 144 incorporates a gas flow path 147 from the filter input surface 140 to the filter output surface 142, wherein the filter element 144 has a height S1 and wherein the gas flow path 147 through the filter element 144 has a length S2, wherein S2 is at least 10 time longer compared to S1, in particular S2 is 100 times longer compared to S1 or S2 is 1,000 times longer compared to S1.

According to FIGS. 2*b* and 2*c* the filter unit 130 is arranged between a crucible lower volume 148 and a crucible upper volume 150, or in the crucible upper volume 150. At least 50% (vol.), in particular at least 80% (vol.), or 90% (vol.) of the crucible lower volume 148 is arranged below the seed holder unit 122, and can be operated such that at least 80% or preferably 90% or more preferably 100% of the first crucible volume is above the condensation temperature $T_c$, of silicon at the prevailing pressure. Additionally, up to 50% (vol.) or up to 20% (vol.) or up to 10% (vol.) of the first part of the housing of the crucible unit is arranged in vertical direction above the seed holder unit. Alternatively, at least 50% (vol.), in particular at least 80% (vol.) or 90% (vol.), of the crucible upper volume 150 is arranged above the seed holder unit 122. At least 60%, or preferably at least or up to 80%, or more preferably up to 90% of the filter element 144 is below the condensation temperature $T_c$, in particular during a production run and/or highly preferably as long as at least 80% or preferably 90% or more preferably 100% of the crucible lower volume is heated to a temperature above the condensation temperature $T_c$, of silicon, in particular at the prevailing pressure.

In general, the source material is preferably heated to a temperature above 1900° C., in particularly at pressure below 100 Torr respectively 13332.2 Pa. The crystal growth face needs to be colder than source material by any amount, however the more the better. The trapping section 146 of the filter unit 130 is preferably below the boiling point of silicon at below 100 Torr respectively 13332.2 Pa, in particular at 1 Torr respectively 133,322 Pa, vacuum, which is approx. 2,000 C. As shown in FIG. 2*c* the filter unit 130 can be arranged between a crucible lower housing 152 and a further crucible upper housing 154, wherein the filter body 138 forms a filter outer surface 156, wherein the filter outer surface 156 connects the crucible lower housing 152 and the crucible upper housing 154, and wherein the filter outer surface 156 forms a portion of the outer surface 112 of crucible housing 110.

FIG. 2*e* shows another embodiment of the invention according to which a pressure unit 132 for setting up a crucible volume pressure P1, and a furnace volume pressure P2 is provided. The furnace volume pressure P2 is preferably higher than the crucible volume pressure P1 to assure that Si vapor cannot leak from the crucible volume 116 into the crucible housing 110 and the furnace volume 104. A crucible vacuum outlet tube 174 respectively crucible gas outlet tube is provided for guiding gases from the crucible volume 116 to outside of the furnace unit 102. A furnace vacuum outlet 204 is provided for guiding gases from the furnace volume 104 to outside of the furnace unit 102. The crucible vacuum outlet 174 and/or the furnace vacuum outlet 204 are preferably connected to a pressure unit 132 respectively vacuum unit 132 for generating a pressure of less than 0.1 Torr respectively 13.3322 Pa inside the furnace volume 104 and inside the crucible volume 116.

FIG. 2*f* shows a combined example based on FIGS. 2*a*, 2*c* and 2*e*. However, alternative combinations are also possible.

The filter outer surface 156 preferably comprises a filter outer surface covering element 158 (cf. FIG. 2*f*), wherein the filter outer surface covering element 158 is a sealing element 134, wherein the sealing element 134 is a coating 134, wherein the coating 134 is generated at the filter outer surface 156 or attached to the filter outer surface 156 or forms the filter outer surface 156. The coating 134 comprises a material or a material combination that reduces leakage from the crucible volume 116 through the crucible housing 110 to the furnace volume 104 of sublimation vapors, in particular Si vapor, generated during one run, in particular by at least 50% (mass) or by at least 80% (mass) or by at least 90% (mass) or by more than 99% (mass) or by at least 99.9% (mass).

The coating 134 withstands temperatures above 2,000° C., in particular at least or up to 3,000° C. or at least up to 3,000° C. or up to 3,500° C. or at least up to 3,500° C. or up to 4,000° C. or at least up to 4,000° C. The coating 134 comprises a material or multiple materials selected from a group of materials at least comprising carbon, in particular pyrocarbon and glassy carbon.

The filter body 138 (cf. FIG. 2*f*) is preferably tubular in shape with a tubular filter outer surface 156 that has a filter outer diameter D1 and a tubular filter inner surface 162 that has a filter inner diameter D2, wherein filter outer diameter D1 is substantially larger than filter inner diameter D2. The annular volume within the filter outer surface 156, filter inner surface 162, filter inlet surface 140, and the filter outlet surface 142 forms the filter body 138.

The filter inner surface 162 comprises a further filter inner surface covering element 164, wherein the further filter inner surface covering element 164 is a sealing element 134, wherein the sealing element 134 is a coating 134, wherein the coating 134 is generated at the filter outer surface 156 or attached to the filter outer surface 156 or forms the filter outer surface 156. The coating 134 comprises a material or a material combination that reduces permeability of Si vapor to $10^{-3}$ $m^2/s$, or preferably $10^{-11}$ $m^2/s$, or more preferably $10^{-12}$ $m^2/s$, from the filter body 138 to the crucible upper volume 150.

The coating 134 withstands temperatures above 2,000° C., in particular at least or up to 3,000° C. or at least up to 3,000° C. or up to 3,500° C. or at least up to 3,500° C. or up to 4,000° C. or at least up to 4,000° C. The coating 134 comprises a material or multiple materials selected from a group of materials at least comprising carbon, in particular pyrocarbon and glassy carbon.

The filter element 144 comprises a filter element member 160, wherein the filter element member 160 comprises filter particles 167 and a filter binder 168, wherein the filter particles 167 comprise carbon or consist of carbon, wherein the filter binder 168 holds the filter particles 167 in fixed relative positions to each other. The filter particles 167 withstand temperatures above 2,000° C., in particular at least or up to 3,000° C. or at least up to 3,000° C. or up to 3,500° C. or at least up to 3,500° C. or up to 4,000° C. or at least up to 4,000° C. and the filter binder 168 withstands temperatures above 2,000° C., in particular at least or up to 3,000° C. or at least up to 3,000° C. or up to 3,500° C. or at least up to 3,500° C. or up to 4,000° C. or at least up to 4,000° C.

the filter binder 168 comprises starch or the filter binder 168 consists of starch or modified starch.

The leak prevention means 126 prevents leakage, from the crucible volume 116 through the crucible housing 110 to the furnace volume 104, of at least 70%, or preferably at least 80%, or preferably at least 90%, or preferably at least 99%, or preferably at least 99.9%, or preferably at least 99.99% of the Si vapor produced during one run.

Thus, FIGS. 2*a-f* also disclose a method for operating a furnace apparatus 100, in particular a furnace apparatus for growing crystals, in particular for growing SiC crystals, wherein the furnace apparatus 100 comprises a furnace unit 102, wherein the furnace unit 102 comprises a furnace housing 108, at least one crucible unit 106, wherein the crucible unit 106 is arranged inside the furnace housing 108, wherein the crucible unit 106 comprises a crucible housing 110, wherein the housing 110 has an outer surface 112 and an inner surface 114, wherein the inner surface 114 at least partially forms a crucible volume 116. Furthermore, a receiving space 118 for receiving a source material 120 is arranged or formed inside the crucible volume 116. Additionally, or alternatively a seed holder unit 122 for holding a defined seed wafer 18 is preferably provided, in particular arranged respectively arrangeable inside the crucible volume 116.

The furnace apparatus 100 preferably also comprises, in particular inside the furnace volume 104, at least one heating unit 124 for heating the source material 120. The receiving space 118 for receiving the source material 120 is preferably at least in parts arranged below the seed holder 122 and above the heating unit 124. The heating unit 124 preferably comprises at least one heating element 124, wherein the heating element 124 is preferably arranged in vertical direction below the receiving space 118. Furthermore, a filter unit 130 is provided, wherein the filter unit 130 surrounds the seed holder unit 122 and/or wherein the filter unit 130 is at least partially above the seed holder unit 122, in particular at least 60% (vol.) of the filter unit 130 is arranged above the seed holder unit 122. The filter unit 130 comprises a filter body 138, wherein the filter body 138 comprises an filter input surface 140 for inputting gas comprising SiC species vapors, Si vapor, and process gases into the filter body 138 and a filter output surface 142 for outputting filtered process gases, in particular doping and/or carrier gas, wherein a filter element 144 is arranged between the filter input surface 140 and the filter output surface 142, wherein the filter element 144 forms a trapping section 146 for adsorbing and condensing Si vapor. Thus, the filter material is preferably such that it causes Si vapors to be absorbed and condensed on a filter material surface. This embodiment is beneficial since the overall amount of Si vapor inside the crucible unit can be reduced significantly by means of the filter unit. Thus, the amount of Si vapor which might leak is also significantly reduced. Most and preferably all of the Si vapors will be preferably trapped as a condensed liquid film on the internal surfaces of the filter. Additionally, or alternatively a section in the uppermost sections of the filter is defined in which the temperature is below the melting point of Si and the condensed vapors actually solidify. The Si vapors preferably do not solidify into particles, preferably a solid film on the internal surfaces of the filter is generated. This film may be amorphous or polycrystalline. Excess of $Si_2C$ and $SiC_2$ vapors will preferably also get into the lower section of the filter and preferably precipitate there as solid polycrystalline deposits on the internal surfaces. Said method comprises at least the steps: heating the source material 120 inside the receiving space 118 by means of the heating unit 124 and reducing the pressure inside the crucible volume 116, thereby vaporizing the source material 120, guiding vaporized source material 120 into the filter unit 130 and adsorbing and condensing vaporized source material 120 inside the filter unit.

FIG. 2*d* shows an example according to which the leak prevention means 126 is a density increasing element 129 for increasing the density of a volume section of the crucible housing 110 of the crucible unit 106. The density increasing element 129 is arranged or generated in the inner structure of the crucible housing 110. The density increasing element 129 is a sealing element 134, wherein the sealing element 134 reduces leakage from the crucible volume 116 through the crucible housing 110 to the furnace volume 104 of sublimation vapors, in particular Si vapor, generated during one run, in particular by at least 50% (mass) or by at least 80% (mass) or by at least 90% (mass) or by more than 99% (mass) or by at least 99.9% (mass).

FIG. 2*e* shows an example according to which the leak prevention means 126 is a pressure unit 132 for setting up a crucible volume pressure P1 inside the crucible volume 116 and a furnace volume pressure P2 inside the furnace volume 104. During the growth phase of the run when the source material 120 is subliming and the crystal 17 is growing, the crucible volume pressure P1 is below 10 Torr respectively 1333.22 Pa, or preferably below 1 Torr respectively 133,322 Pa, or more preferably below 0.1 Torr respectively 13.3322 Pa. During this time, the furnace volume pressure P2 is higher than the crucible volume pressure P1, less than Torr respectively 6666.12 Pa, or preferably less than 20 Torr respectively 2666.45 Pa, or more preferably less than 10 Torr respectively 1333.22 Pa.

FIG. 2*e* also shows a pipe system 194. Said pipe system is part of the furnace apparatus 100, wherein the pipe system 194 comprises a crucible pipe 196 connecting the crucible volume 116 via a crucible vacuum outlet tube 174 with a vacuum unit 198 and a furnace pipe 200 connecting the furnace volume 104 via furnace vacuum outlet 204 to the vacuum unit 198. The vacuum unit 198 comprises a control element, in particular control element 202 respectively vacuum control element 202 for controlling the pressure inside the crucible volume 116 and the pressure in the furnace volume 104, wherein the vacuum unit 198 reduces pressure inside the crucible volume 116 via the crucible pipe 196 or inside the furnace volume 104 via the furnace pipe 200 in case the control element 202 determines that the pressure inside the crucible volume 116 is above a first threshold and/or in case the control element 202 determines that the pressure inside the furnace volume 104 is above a second threshold. An alternative example how the gas/es is/are provided is explained with respect to FIG. 7*c*. Control element 202 can be additionally or alternatively configured to control gas flow via the crucible gas inlet tube into the crucible housing 108 and/or temperature distribution by controlling the heating unit 124 and/or gas flow velocity through a gas flow passage 236 (cf. FIG. 15).

FIG. 2*f* shows a further example of a furnace apparatus 100. According to this example the furnace apparatus 100 comprises two or more than two leak prevention means of the group of leak prevention means 128, 130, 132.

The filter unit 130 according to FIG. 2*f* has an annular shape. A filter inner surface 162 respectively a surface of a filter surface inside the crucible volume 116 preferably comprises a further filter inner surface covering element 164 respectively a coating.

FIG. 3*a-h* schematically show different heating unit 124 arrangements inside a furnace apparatus 100.

According to FIG. 3*a*-3*d* a crucible solid bottom section 206 is indicated, wherein said crucible solid bottom section 206 is at least partially and preferably mainly or completely surrounded by the receiving space 118. Furthermore, the height of the crucible solid bottom section 206 in vertical direction respectively the distance between an inner surface section respectively crucible solid bottom section upper surface 244 and an outer surface section respectively crucible solid bottom section outer surface 246 of the crucible solid bottom section 206 is preferably larger or equal compared to a height HR of the receiving space 116.

According to FIG. 3*e-h* the receiving space 116 at least partially and preferably mainly or completely surrounds a surface section 207 of a crucible wall 208 respectively of crucible bottom. Furthermore, the height of the crucible bottom wall 208 in vertical direction respectively the distance between an inner surface section 207 and an outer surface section 246 of the crucible bottom wall 208 is preferably smaller or equal compared to a height HR of the receiving space 116.

FIGS. 3*a* to 3*h* show examples according to which the heating unit 124 is arranged inside the furnace but outside the crucible unit 106, in particular outside the crucible volume 116.

Figures 3A, 3B, 3C, 3D, 3E, 3F, 3G, 3H:
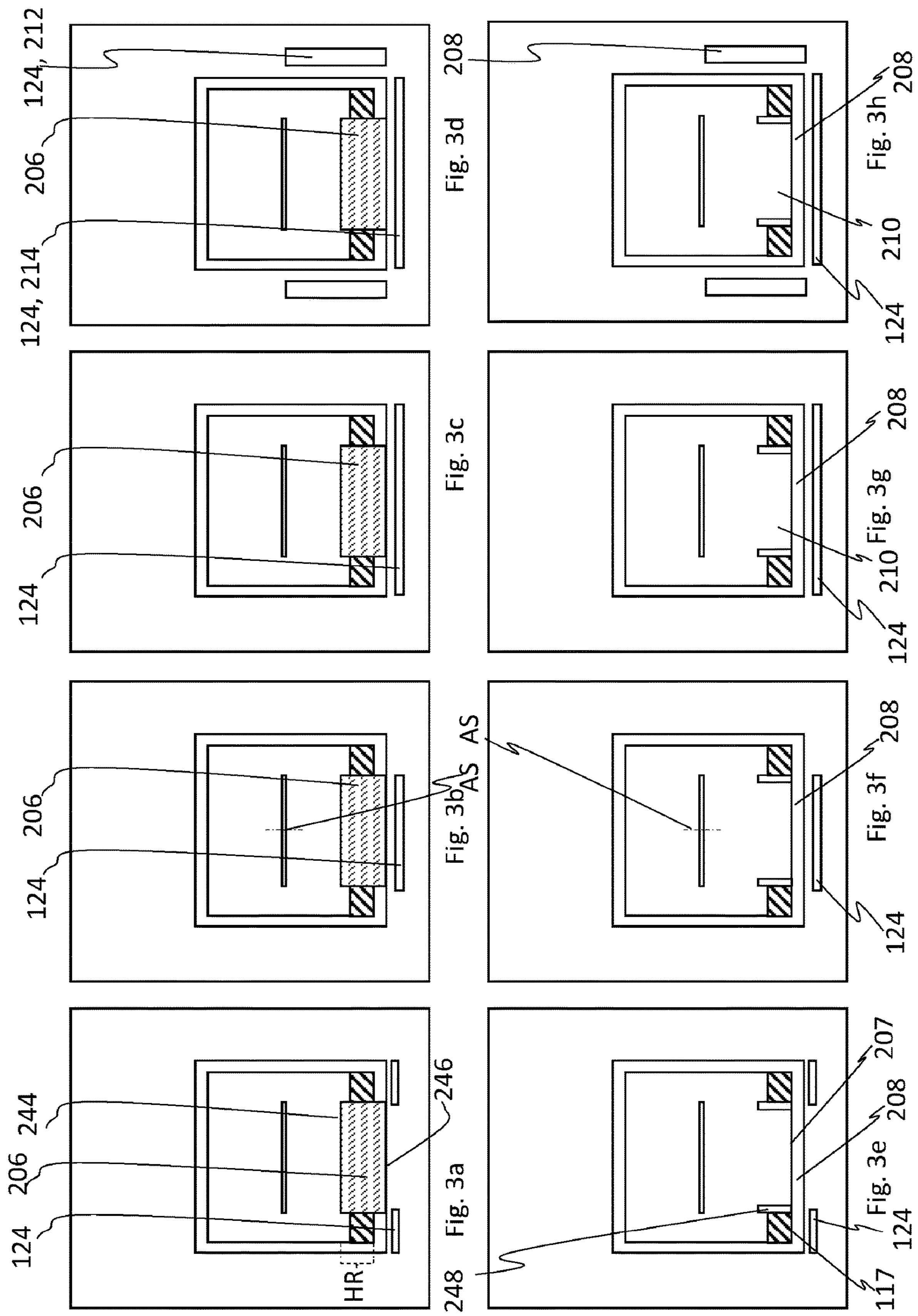
FIG. 3*a* shows an example of a furnace apparatus according to the present invention having at least a heating unit for heating a bottom section of a crucible unit inside said furnace apparatus.
FIG. 3*b* shows an example of a furnace apparatus according to the present invention having at least a heating unit for heating a bottom section of a crucible unit inside said furnace apparatus.
FIG. 3*c* shows an example of a furnace apparatus according to the present invention having at least a heating unit for heating a bottom section of a crucible unit inside said furnace apparatus.
FIG. 3*d* shows an example of a furnace apparatus according to the present invention having at least a heating unit for heating a bottom section of a crucible unit inside said furnace apparatus.
FIG. 3*e* shows an example of a furnace apparatus according to the present invention having at least a heating unit for heating a bottom section of a crucible unit inside said furnace apparatus.
FIG. 3*f* shows an example of a furnace apparatus according to the present invention having at least a heating unit for heating a bottom section of a crucible unit inside said furnace apparatus.
FIG. 3*g* shows an example of a furnace apparatus according to the present invention having at least a heating unit for heating a bottom section of a crucible unit inside said furnace apparatus.
FIG. 3*h* shows an example of a furnace apparatus according to the present invention having at least a heating unit for heating a bottom section of a crucible unit inside said furnace apparatus.

According to FIGS. 3*a* and 3*e* the heating unit 124 respectively a heating element of heating unit 124 primarily extends into the horizontal direction and partially, in particular mainly or completely, overlays the bottom surface 117 of the receiving space 118. The heating unit 124 respectively the heating element can be shaped in an annular manner. In other words: The heating unit 124 heats only or at least the bottom surface 117 of the receiving space 118.

According to FIGS. 3*b* and 3*f* the heating unit 124 respectively a heating element of heating unit 124 primarily extends into the horizontal direction and partially, in particular mainly or completely, overlays the outer surface 246 of the crucible solid bottom section 206 or the outer surface of the crucible bottom wall 208 or solid bottom. It is additionally also possible that the heating unit 124 at least partially overlays the bottom surface 117 of the receiving space. The heating unit 124 respectively the heating element can be shaped in disc like manner. In other words: The heating unit 124 heats only or at least heats the outer surface 246 of the crucible solid bottom section 206 or the outer surface of the crucible bottom wall 208 or solid bottom. The crucible solid bottom section 206 preferably is a solid element, in particular cylindrical, of crucible material directly below the seed wafer 18 or seed holder unit 122 and the source material 120 is preferably placed in the annular space between the solid element and the crucible wall.

FIGS. 3*c* and 3*g* show examples according to which the heating unit 124 overlays the complete bottom surface of the crucible volume 116. In other words: The heating unit 124 heats the entire crucible volume bottom.

FIGS. 3*d* and 3*g* show examples according to which the heating unit 124 comprises a horizontal heating element 214 for heating a bottom section of the crucible unit 106 and a vertical heating element for heating a side wall section or multiple side wall sections or all side wall sections of the crucible unit 106. It is also possible that the heating unit only comprises the vertical heating element respectively does not comprise a horizontal heating element 214.

With respect to all embodiments the horizontal heating element can be understood as bottom heating element or heating element arranged below a bottom of the crucible. Additionally, or alternatively the vertical heating element can be understood as sidewall heating element or heating element arranged besides a sidewall of the crucible.

FIG. 3*a-h* also disclose a method for operating a furnace apparatus 100, in particular a furnace apparatus for growing crystals, in particular for growing SiC crystals, wherein the furnace apparatus 100 comprises a furnace unit 102, wherein the furnace unit 102 comprises a furnace housing 108, at least one crucible unit 106, wherein the crucible unit 106 is arranged inside the furnace housing 108, wherein the crucible unit 106 comprises a crucible housing 110, wherein the housing 110 has an outer surface 112 and an inner surface 114, wherein the inner surface 114 at least partially forms a crucible volume 116. Furthermore, a receiving space 118 for receiving a source material 120 is arranged or formed inside the crucible volume 116. Additionally, or alternatively a seed holder unit 122 for holding a defined seed wafer 18 is preferably provided, in particular arranged respectively arrangeable inside the crucible volume 116. The furnace apparatus 100 preferably also comprises, in particular inside the furnace volume 104, at least one heating unit 124 for heating the source material 120. The receiving space 118 for receiving the source material 120 is preferably at least in parts arranged below the seed holder 122 and above the heating unit 124. The heating unit 124 preferably comprises at least one heating element, wherein the heating element is preferably arranged in vertical direction below the receiving space 118. The method at least comprises the steps: Heating the source material and setting up an isotherm profile in front of the seed wafer 18 by means of the heating unit 124. Flat or significantly flat isotherm planes, in particular horizontal planes, are generated in front of the seed wafer 18. The heating unit 124 additionally comprises at least one further, in particular vertical, heating element, wherein the further heating element is arranged besides the crucible unit 106, in particular besides a side wall of the crucible unit 106, in particular surrounding the crucible unit 106.

Figures 4A, 4B:
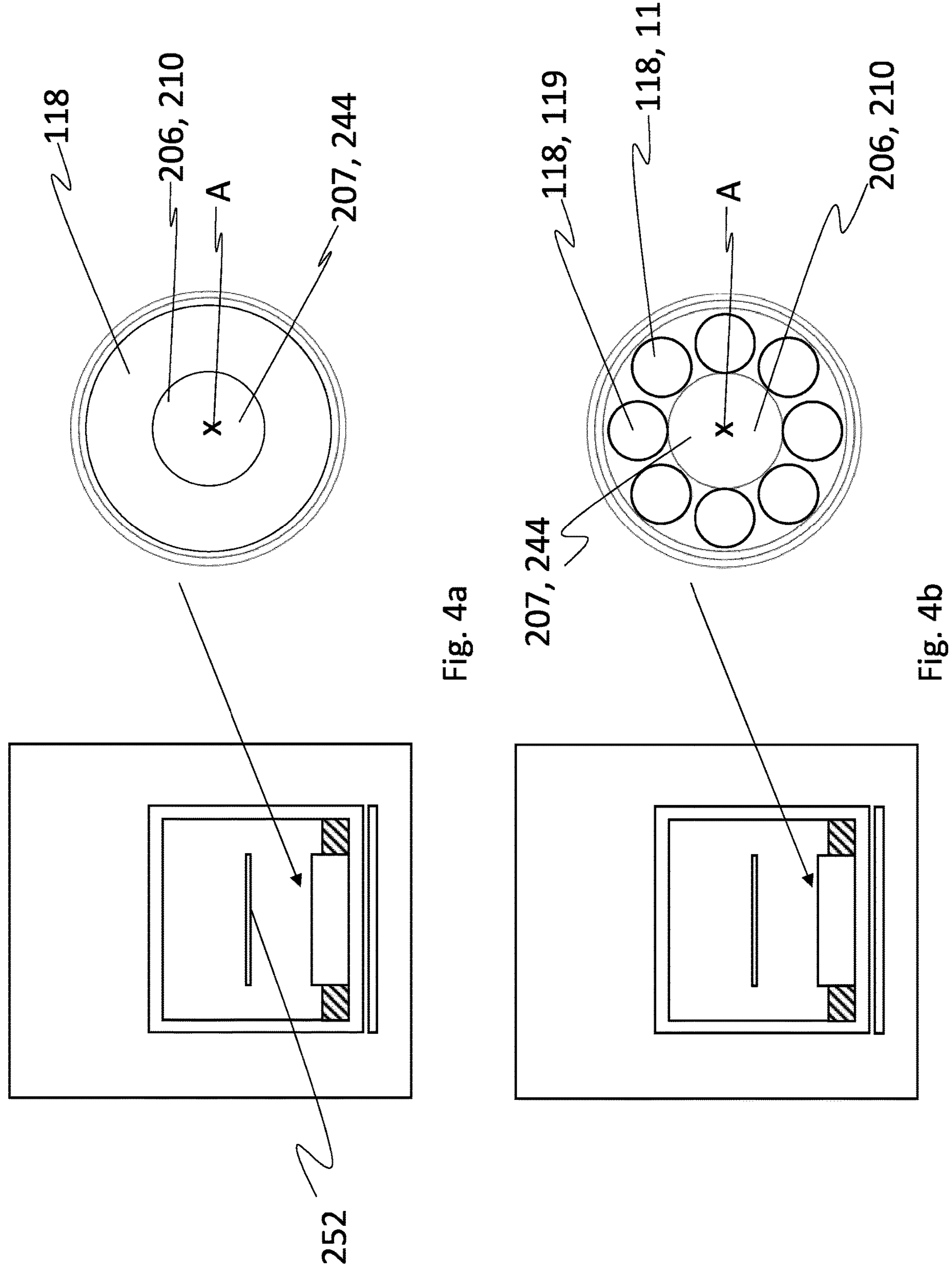
FIG. 4*a* shows an example of a furnace apparatus according to the present invention having an annular shaped receiving space formed as trench or sub receiving spaces arranged around a center.
FIG. 4*b* shows an example of a furnace apparatus according to the present invention having an annular shaped receiving space formed as trench or sub receiving spaces arranged around a center.

FIGS. 4*a* and 4*b* schematically show a furnace apparatus 100 for growing crystals, in particular SiC crystals, and schematically a top view of a receiving space 118. Said furnace apparatus 100 comprises a furnace unit 102, at least one crucible unit 106, wherein the crucible unit 106 is arranged inside the furnace unit 102. The crucible unit 106 comprises a receiving space 118 for receiving a source material 120, preferably a seed holder unit 122 for holding a seed wafer 18, at least one heating unit 124 for heating the source material 120. The receiving space 118 for receiving the source material 120 is at least in parts arranged below the seed holder 122 and above the heating unit 124. The heating unit 124 comprises at least one heating element, wherein the heating element is arranged in vertical direction below the receiving space 118. The receiving space 118 is formed by one continuous trench (cf. FIG. 4*a*) or multiple recesses 119 (cf. FIG. 4*b*), wherein the trench or the recesses 119 at least partially and preferably substantially or preferably completely surround a surface 207, 244 arranged or provided or materialized inside the crucible unit 106, in particular an inner surface 207 of a wall respectively a bottom section 246 respectively a crucible solid bottom section 206 of the crucible unit 106, wherein the receiving space 118 preferably has an annular shape. Said multiple recesses 119 are preferably arranged along a predefined contour, wherein the predefined contour is preferably circular. However, it is alternatively also possible that the homogeneous trench, in particular circular trench, is formed and several pieces, in particularly blocks, of source material, are placed inside said one trench. Said pieces can be arranged next to each other, in particularly contacting each other.

Thus, the receiving space 118 extends around a central axis, wherein the crucible central axis A preferably extends coaxial to a central axis AS of the seed holder unit 122. The receiving space 118 is arranged in a defined distance to the crucible central axis A.

The heating unit 124 overlays at least 30% or at least 40% or at least 50% or at least 60% or at least 70% or at least 80% or at least 90% or at least 95% of a bottom surface 117 of the receiving space 118 and at least 20% or at least 30% or at least 40% or at least 50% or at least 60% or at least 70% or at least 80% or at least 90% or at least 95% of the surface 207, 244 which is at least partially surrounded by the receiving space 118.

The surface 207 which is at least partially surrounded by the receiving space 118 belongs to a crucible bottom wall respectively bottom section which extends at least V1 in vertical direction wherein the receiving space 118 extends V2 in vertical direction between a receiving space bottom surface 117 and a top 248 of the lowest side wall member of the receiving space 118, wherein $V2>V1$, in particular $V2>1.1\times V1$ or $V2>1.2\times V1$ or $V2>1.5\times V1$ or $V2>2\times V1$, or $V2=V1$ or $V2<V1$, in particular $V2<1.1\times V1$ or $V2<1.2\times V1$ or $V2<1.5\times V1$ or $V2<2\times V1$.

The receiving space 118 surrounds a bottom section of the housing 110, in particular comprising the surface 244 surrounded by the receiving space 118, wherein the bottom section is a crucible solid bottom section 206, wherein the crucible solid bottom section 206 has a height (in vertical direction) which is higher than 0.3× the smallest distance between the receiving space 118 and the crucible central axis A or which is higher than 0.5× the smallest distance between the receiving space 118 and the crucible central axis A or 0.7× the smallest distance between the receiving space 118 and the crucible central axis A or which is higher than 0.9× the smallest distance between the receiving space 118 and the crucible central axis A or 1.1× the smallest distance between the receiving space 118 and the crucible central axis A or which is higher than 1.5× the smallest distance between the receiving space 118 and the crucible central axis A.

The bottom section comprises an inner surface 244 respectively the surface surrounded by the receiving space 118, wherein the inner surface 244 of the bottom section is arranged inside the crucible volume 116 and in parallel to the seed holder unit 122, wherein the center of the inner surface 244 and the center of the seed holder unit AS are arranged on the same vertical axis, wherein a distance between the inner surface 244 of the bottom section is arranged in a predefined distance to the seed holder unit 122, wherein the distance is higher than 0.5× the smallest distance between the receiving space 118 and the crucible central axis A or higher than 0.7× the smallest distance between the receiving space 118 and the crucible central axis A or higher than 0.8× the smallest distance between the receiving space 118 and the crucible central axis A or higher than 1× the smallest distance between the receiving space 118 and the crucible central axis A or higher than 1.2× the smallest distance between the receiving space 118 and the crucible central axis A or higher than 1.5× the smallest distance between the receiving space 118 and the crucible central axis A or higher than 2× the smallest distance between the receiving space 118 and the crucible central axis A or higher than 2.5× the smallest distance between the receiving space 118 and the crucible central axis A. additionally or alternatively the defined smallest distance between the receiving space 118 and the crucible central axis A is up to 30% or up to 20% or up to 10% or up to 5% or up to 1% shorter than the diameter of the defined seed wafer 18 or the defined smallest distance between the receiving space 118 and the crucible central axis A is up to 1% or up to 5% or up to 10% or up to 20% or up to 30% longer than the diameter of the defined seed wafer 18 or the defined smallest distance between the receiving space 118 and the crucible central axis A matches with the diameter of the defined seed wafer 18.

The surface 207, 244 surrounded by the receiving space 118 preferably has at least a size of 0.5× the size of the top surface respectively crystal growth face 252 of the defined seed wafer 18 respectively the size of the growth surface of the defined seed wafer 18 or has at least a size of 0.8× the size of the crystal growth face 252 of the defined seed wafer 18 respectively the size of the growth surface of the defined seed wafer 18 or has at least a size of 0.9× the size of the crystal growth face 252 of the defined seed wafer 18 respectively the size of the growth surface of the defined seed wafer 18 or has at least a size of 1× the size of the crystal growth face 252 of the defined seed wafer 18 respectively the size of the growth surface of the defined seed wafer 18 or has at least a size of 1.1× the size of the crystal growth face 252 of the defined seed wafer 18 respectively the size of the growth surface of the defined seed wafer 18.

The center of the surface 207, 244 surrounded by the receiving space 118 and the center of the crystal growth face 252 of the defined seed wafer 18 are preferably arranged on the same vertical axis.

The surface 207, 244 surrounded by the receiving space 118 and the crystal growth face 252 of the defined seed wafer 18 are arranged in parallel respectively substantially in parallel to each other.

FIGS. **4*a* and 4*b* also disclose a method for operating a furnace apparatus 100, in particular a furnace apparatus for growing crystals, in particular for growing SiC crystals, wherein the furnace apparatus 100 comprises a furnace unit 102, wherein the furnace unit 102 comprises a furnace housing 108, at least one crucible unit 106, wherein the crucible unit 106 is arranged inside the furnace housing 108, wherein the crucible unit 106 comprises a crucible housing 110, wherein the crucible housing 110 has an outer surface 112 and an inner surface 114, wherein the inner surface 114 at least partially forms a crucible volume 116. Furthermore, a receiving space 118 for receiving a source material 120 is arranged or formed inside the crucible volume 116. Additionally, or alternatively a seed holder unit 122 for holding a defined seed wafer 18 is preferably provided, in particular arranged respectively arrangeable inside the crucible volume 116. The furnace apparatus 100 preferably also comprises, in particular inside the furnace volume 104, at least one heating unit 124 for heating the source material 120. The receiving space 118 for receiving the source material 120 is preferably at least in parts arranged above the heating unit 124 and below the seed holder unit 122. The heating unit preferably comprises at least one heating element, wherein the heating element is preferably arranged in vertical direction below the receiving space 118. The receiving space 118 is formed by one continuous trench or multiple recesses 119, wherein the trench 118 or the recesses 119 at least partially and preferably substantially or preferably completely surround a surface 207, 244 arranged or provided or materialized inside the crucible unit 106, in particular an inner surface 207 of a wall and/or bottom section of the crucible unit 106 or a surface 244 of a crucible solid bottom section 206, wherein the receiving space 118 preferably has an annular shape. However, it is alternatively also possible that the homogeneous trench, in particular circular trench, is formed and several pieces, in particularly blocks, of source material, are placed inside said one trench. Said pieces can be arranged next to each other, in particularly contacting each other. The method at least comprises the steps: Heating the source material 120 inside the receiving space 118 by means of the heating unit 124 thereby vaporizing the source material 120, guiding the vaporized source material to a space above a bottom portion 207, 244 which is surrounded by the receiving space 118, in particular guiding the vaporized source material in a combined radial and vertical direction to a space in front of the seed wafer 18**.

Additionally, or alternatively the receiving space 118 is formed in a wall portion of the crucible unit 106 or arranged on a wall or bottom section inside the crucible unit 106 and the receiving space 118 extends around a central axis respectively crucible central axis A, wherein the crucible central axis A preferably extends coaxially to a central axis AS of the seed holder unit 122, wherein the receiving space 118 is arranged in a defined distance to the crucible central axis A. A distance between crucible central axis A and central axis AS of the seed holder unit 122 is preferably 0.

Furthermore, reference number 210 indicates a crucible empty bottom section. Crucible empty bottom section 210 is preferably empty.

Figure 4C:
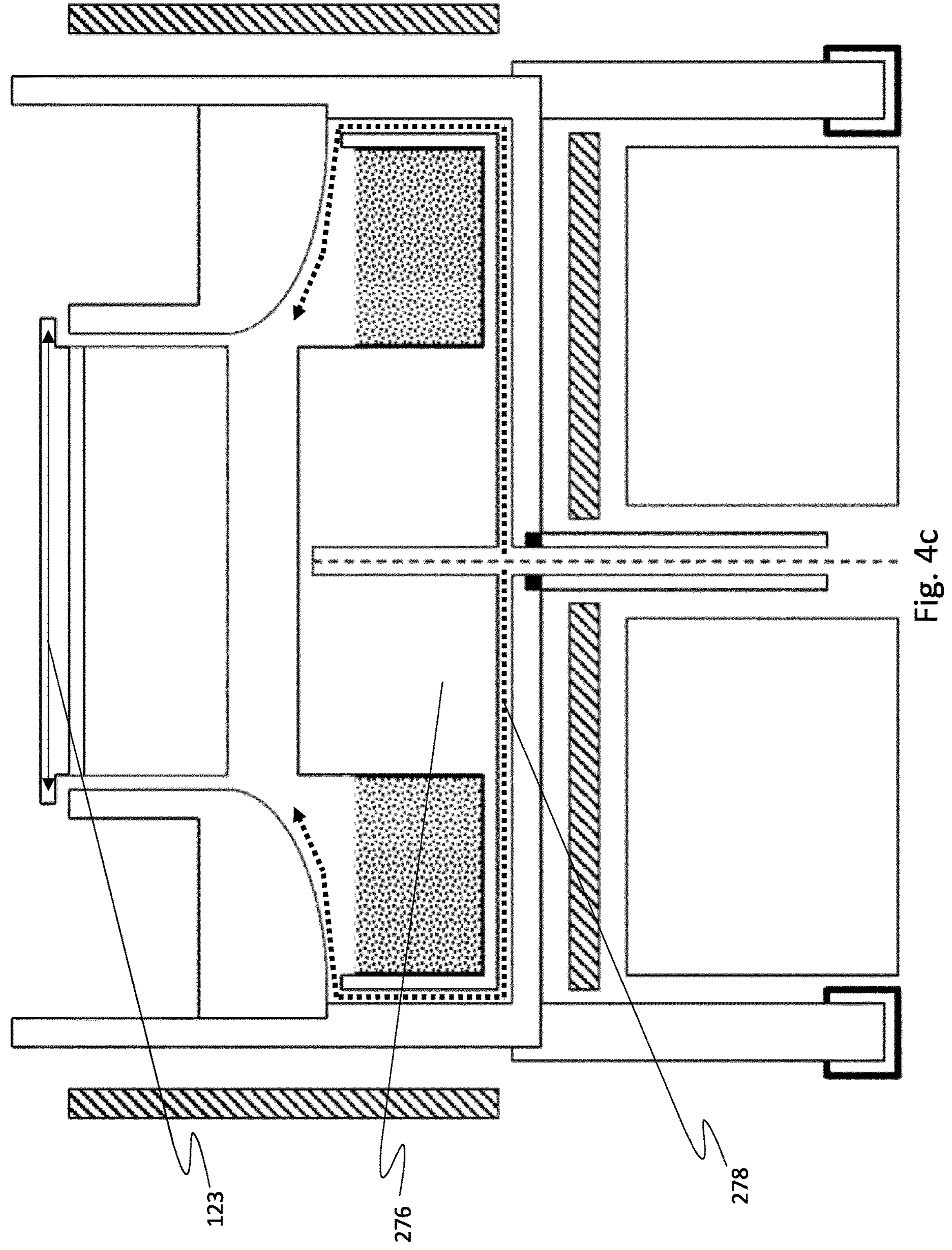
FIG. 4*c* shows an example of a furnace apparatus according to the present invention having an annular shaped receiving space formed as trench or sub receiving spaces arranged around a center.

FIG. 4*c* shows a further example of the crucible unit 106 or crucible housing 110, wherein the features of this example can be alternatively applied to all the other crucible units 106 or crucible housings 110. According to this embodiment the receiving space 118 is formed by at least one insert element 276. The insert element 276 and the crucible section in particular the crucible bottom, form a gas guide path 278 (dotted lines). The insert element 276 has the source material trench respectively receiving spaces and the solid center section respectively empty center section. Thus, is a gas guide path 278 between the crucible and the insert which allows incoming gases to pass along the bottom and sides of the crucible and emerge around the outer periphery of the source material thereby enveloping and guiding the sublimation vapors to the crystal. The height of the gas guide path is preferably below 2 cm, in particularly below 1 cm or below 0.5 cm or below 0.1 cm.

FIGS. 5*a* to 5*d* schematically show examples according to which the furnace apparatus 100 comprises a gas flow unit 170, wherein the gas flow unit 170 comprises a crucible gas inlet tube 172 for conducting gas into the crucible volume 116 and a crucible vacuum outlet tube 174 for removing gas from the crucible volume 116.

The gas inlet respectively the crucible gas inlet tube 172 is connected to the crucible lower volume 148 (cf. FIG. 5*d*) within the crucible unit 106, wherein the crucible lower volume 148 also contains the seed holder unit 122 and the receiving space 118, wherein a source material 120 can be transformed within the crucible lower volume from a solid state into a vapor state and from the vapor state back into a solid state on a target body, wherein the source material 120 can be arranged inside the receiving space 118 and wherein the solid target body can be held by the seed holder unit 122, wherein gases introduced via the crucible gas inlet tube 172 mix and/or react with the source material 120 in the vapor state.

The crucible vacuum outlet tube 174 is connected to the crucible upper volume 150 (cf. FIG. 5*d*), wherein the crucible upper volume 150 also contains the filter output surface 142 of the filter unit 130, wherein the gas composition in the crucible upper volume 150 is free of Si vapor. The crucible upper volume 150 and the crucible lower volume 148 are highly preferably both present in all embodiments of the present inventions, in particular in all embodiments mentioned with respect to FIG. 1-7*c* and FIG. 9.

The conditions inside the filter unit 130 are such that sublimation vapors, in particular Si vapor, adsorb and condense and only process gases, in particular argon and/or nitrogen pass through the filter output surface into the crucible upper volume 150. In particular the temperature in the filter trapping section 146 is below the condensation temperature $T_c$, of gaseous Si respectively Si vapor at the prevailing pressure.

A gas or a mixture of gases, in particular argon and/or nitrogen, can be introduced via the crucible gas inlet tube 172 into the crucible volume 116, respectively into the crucible lower volume 148.

The crucible gas inlet tube 172 is preferably in vertical direction arranged closer to the receiving space 118 compared to the seed holder unit 122, in particular the vertical distance between the seed holder unit 122 and the crucible gas inlet tube 172 is preferably more than 2 times the vertical distance between the receiving space 118 and the crucible gas inlet tube 172, in particular more than 5 times the vertical distance between the receiving space 118 and the crucible gas inlet tube 172 or more than 8 times the vertical distance between the receiving space 118 and the crucible gas inlet tube 172 or more than 10 times the vertical distance between the receiving space 118 and the crucible gas inlet tube 172 or more than 20 times the vertical distance between the receiving space 118 and the crucible gas inlet tube 172.

Figures 5A, 5B, 5C, 5D:
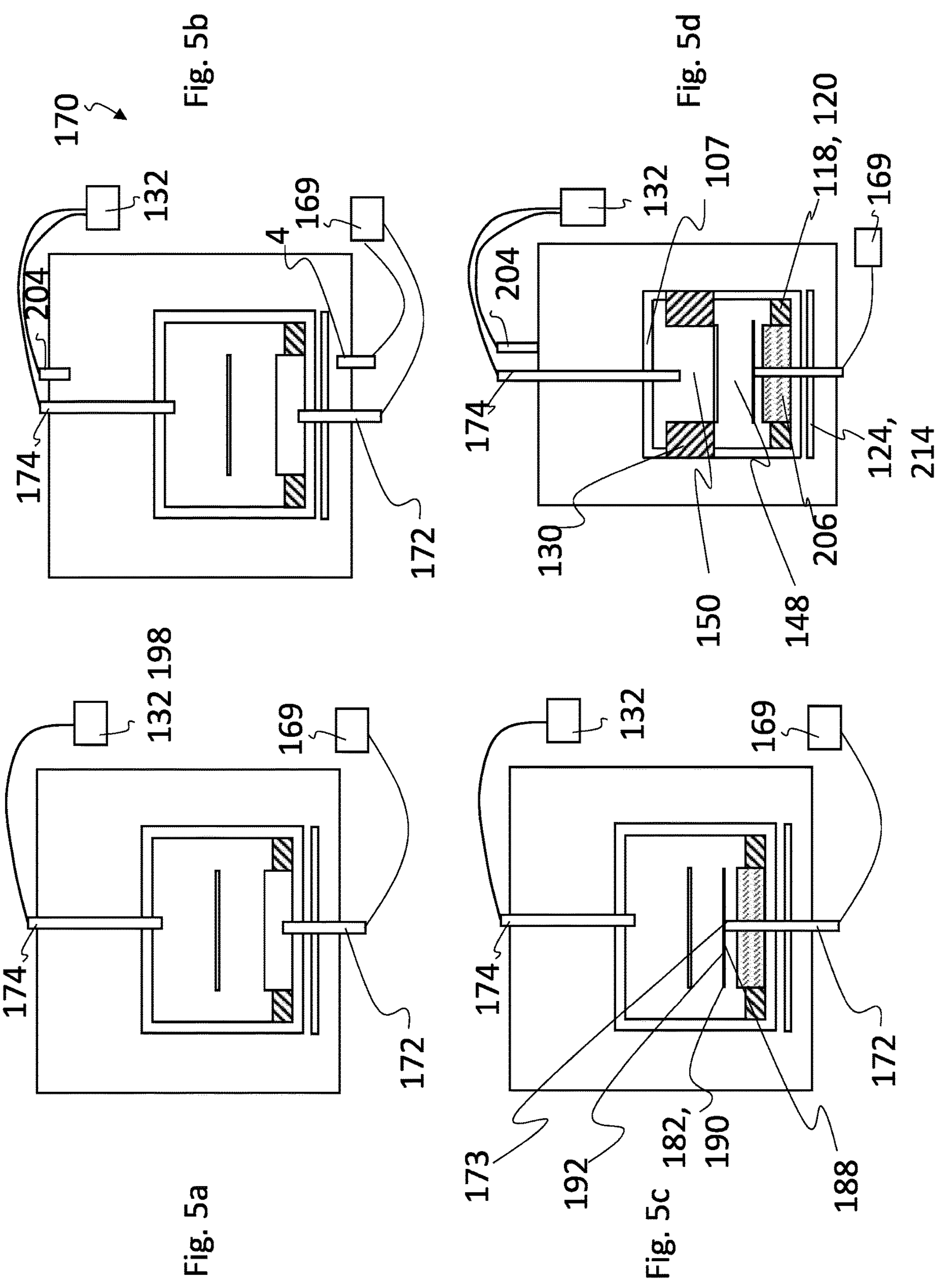
FIG. 5*a* shows an example of a furnace apparatus according to the present invention having a crucible unit comprising a gas input and a gas output.
FIG. 5*b* shows an example of a furnace apparatus according to the present invention having a crucible unit comprising a gas input and a gas output.
FIG. 5*c* shows an example of a furnace apparatus according to the present invention having a crucible unit comprising a gas input and a gas output.
FIG. 5*d* shows an example of a furnace apparatus according to the present invention having a crucible unit comprising a gas input and a gas output.

The crucible gas inlet tube 172 can be covered according to a further preferred embodiment of the present invention by a gas distribution member 182 (cf. examples of FIGS. 5*c* and 5*d*). The gas distribution member 182 preferably extends parallel to a bottom surface 207, 244 of the crucible unit 106, in particular the inner bottom surface 207 of the crucible unit 106. Additionally, or alternatively the gas distribution member 182 extends in a horizontal plane. Thus, gas can be distributed in a homogeneous manner to the annular receiving space 118 and therefore to the source material 120 present in the receiving space 118 or to the vaporized source material which flows out of the receiving space 118.

The gas distribution member 182 is arranged in a defined distance to the bottom surface 207, 244 of the crucible unit 106, in particular the inner bottom surface 207 of the crucible unit 106. The defined distance in vertical direction between the lower surface 188 of the gas distribution member 182 and the bottom surface 207, 244 of the crucible unit 106 is preferably less than 0.5× vertical distance between the receiving space 118 and the crucible gas inlet tube 172 (this means: less than half the vertical distance between the receiving space 118 and the upper end 173 of the crucible gas inlet tube 172) or less than 0.3× vertical distance between the receiving space 118 and the crucible gas inlet tube 172 or less than 0.1× vertical distance between the receiving space 118 and the crucible gas inlet tube 172 or less than 0.05× vertical distance between the receiving space 118 and the crucible gas inlet tube 172.

The gas distribution member 182 is preferably a gas guiding plate respectively a gas guide plate respectively a gas distribution plate 190. The gas distribution plate 190 preferably forms a lower surface 188 and an upper surface 192. The lower surface 188 and the upper surface 192 preferably extend at least sectionally in parallel to each other. The distance between the lower surface 188 and the upper surface 192 is preferably less than 0.5× distance between the receiving space 188 and the crucible gas inlet tube 172 or less than 0.3× distance between the receiving space 118 and the crucible gas inlet tube 172 or less than 0.1× distance between the receiving space 118 and the crucible gas inlet tube 172 or less than 0.05× distance between the receiving space 118 and the crucible gas inlet tube 172. The gas distribution plate 190 is preferably thin. This means that the distance between the lower surface 188 and the upper surface 192 is preferably less that 5 cm or less than 3 cm or less than 1 cm. This is beneficial since the gas distribution plate 190 does not incorporate a significant amount of material. Furthermore, the gas distribution plate 190 does not significantly affect heat radiation radiated from a bottom section 208 respective crucible solid bottom section 206 covered by the gas distribution plate 190.

FIG. **5*d* also shows that the crucible gas inlet tube 172 is arranged in gas flow direction before the filter unit 130 and wherein the crucible vacuum outlet tube 174 respectively the crucible gas outlet tube 174 is arranged in gas flow direction after the filter unit 130, wherein a gas flow path extends from the filter input surface 140 through a filter body 138 to the filter output surface 142**.

Thus, FIGS. **5*a-d* also disclose a method for operating a furnace apparatus 100, in particular a furnace apparatus for growing crystals, in particular for growing SiC crystals, wherein the furnace apparatus 100 comprises a furnace unit 102, wherein the furnace unit 102 comprises a furnace housing 108, at least one crucible unit 106, wherein the crucible unit 106 is arranged inside the furnace housing 108, wherein the crucible unit 106 comprises a crucible housing 110, wherein the housing 110 has an outer surface 112 and an inner surface 114, wherein the inner surface 114 at least partially forms a crucible volume 116. Furthermore, a receiving space 118 for receiving a source material 120 is arranged or formed inside the crucible volume 116. Additionally, or alternatively a seed holder unit 122 for holding a defined seed wafer 18 is preferably provided, in particular arranged respectively arrangeable inside the crucible volume 116. The furnace apparatus 100 preferably also comprises, in particular inside the furnace volume 104, at least one heating unit 124 for heating the source material 120. The receiving space 118 for receiving the source material 120 is preferably at least in parts arranged above the heating unit 124 and below the seed holder unit 122. The heating unit preferably comprises at least one heating element, wherein the heating element is preferably arranged in vertical direction below the receiving space 118. Furthermore, a gas flow unit 170 is provided, wherein the gas flow unit 170 comprises a crucible gas inlet tube 172 for introducing gas into the crucible volume 116 and a crucible vacuum outlet tube 174 for removing gas from the crucible volume 116. Said method comprises at least the steps: Introducing gas via the crucible gas inlet tube 172 into the crucible volume 116, mixing the introduced gas with vaporized source material 120 and removing gas from the crucible volume 116 via the crucible vacuum outlet tube 174. Prior to the step of removing gas from the crucible volume 116, a step of removing Si vapor from the gas mixture preferably takes place, in particular by means of a filter unit 130**.

FIGS. **6*a* and 6*b* schematically show further examples of a furnace apparatus 100. According to FIGS. 6*a* and 6*b* a growth guide element 230 is provided. The growth guide element 230 can be understood as gas distribution plate. The growth guide element 230 is arranged in vertical direction above the receiving space 118 to guide vaporized source material and/or introduced gas into a space between the seed holder unit 122 and the inner bottom surface 207, 244 of the crucible volume 116**.

The growth guide element 230 comprises a growth guide first section 260 and a growth guide second section 262, wherein the growth guide first section 260 is shaped to match with a corresponding wall section of the crucible housing 110 and wherein the growth guide second section 262 is formed to manipulate the shape of a growing crystal. The growth guide first section 260 and the growth guide second section 262 are arranged coaxially, wherein the growth guide first section 260 is arranged in a first diameter to the center axis A and wherein the growth guide second section 262 is arranged in a second diameter to the center axis A, wherein the first diameter is larger compared to the second diameter. The growth guide first section 260 and the growth guide second section 262 are connected with each other by means of a growth guide third section 261, wherein the growth guide third section 261 at least partially extends in horizontal direction. The growth guide first section 260 and the growth guide third section 261 form a growth guide fourth section 264 and/or wherein the growth guide second section 262 and the growth guide third section 261 are arranged in an angle between 60° and 120°, in particular in an angle between 70° and 110°, in particular in an angle of 90°. The growth guide first section 260, the growth guide second section 262 and the growth guide third section 261 are integral parts of the growth guide element 230.

The growth guide element 230 comprises graphite.

FIG. **6*b* shows that the outer diameter of the filter unit 130 is preferably at least or up to 1.05× larger compared to the first diameter of the growth guide element 230 or wherein the outer diameter of the filter unit 130 is preferably at least or up to 1.1× larger compared to the first diameter of the growth guide element 230 or wherein the outer diameter of the filter unit 130 is preferably at least or up to 1.3× larger compared to the first diameter of the growth guide element 230 or wherein the outer diameter of the filter unit 130 is preferably at least or up to 1.5× larger compared to the first diameter of the growth guide element 230. The second diameter of the growth guide element 230 is preferably at least or up to 1.05× larger compared to the inner diameter of the filter unit 130 respectively the diameter of inner wall 162 or wherein the second diameter of the growth guide is preferably at least or up to 1.1× larger compared to the inner diameter of the filter unit 130 respectively the diameter of inner wall 162 or wherein the second diameter of the growth guide is preferably at least or up to 1.3× larger compared to the inner diameter of the filter unit 130 respectively the diameter of inner wall 162 or wherein the second diameter of the growth guide is preferably at least or up to 1.5× larger compared to the inner diameter of the filter unit 130 respectively the diameter of inner wall 162**.

The upper vertical end respectively growth guide upper vertical end 266 of the growth guide second section 262 and the seed holder unit 122 and/or the seed wafer 18 form a gas flow passage respectively a gas flow channel 268, wherein the smallest distance between the growth guide upper vertical end 266 of the growth guide second section 262 and the seed holder unit 122 is smaller than 0.3× second diameter of the growth guide element 230 or smaller than 0.1× second diameter of the growth guide element 230 or smaller than 0.08× second diameter of the growth guide element 230 or smaller than 0.05× second diameter of the growth guide element 230 or smaller than 0.03× second diameter of the growth guide element 230 or smaller than 0.01× second diameter of the growth guide element 230.

Figures 6A, 6B:
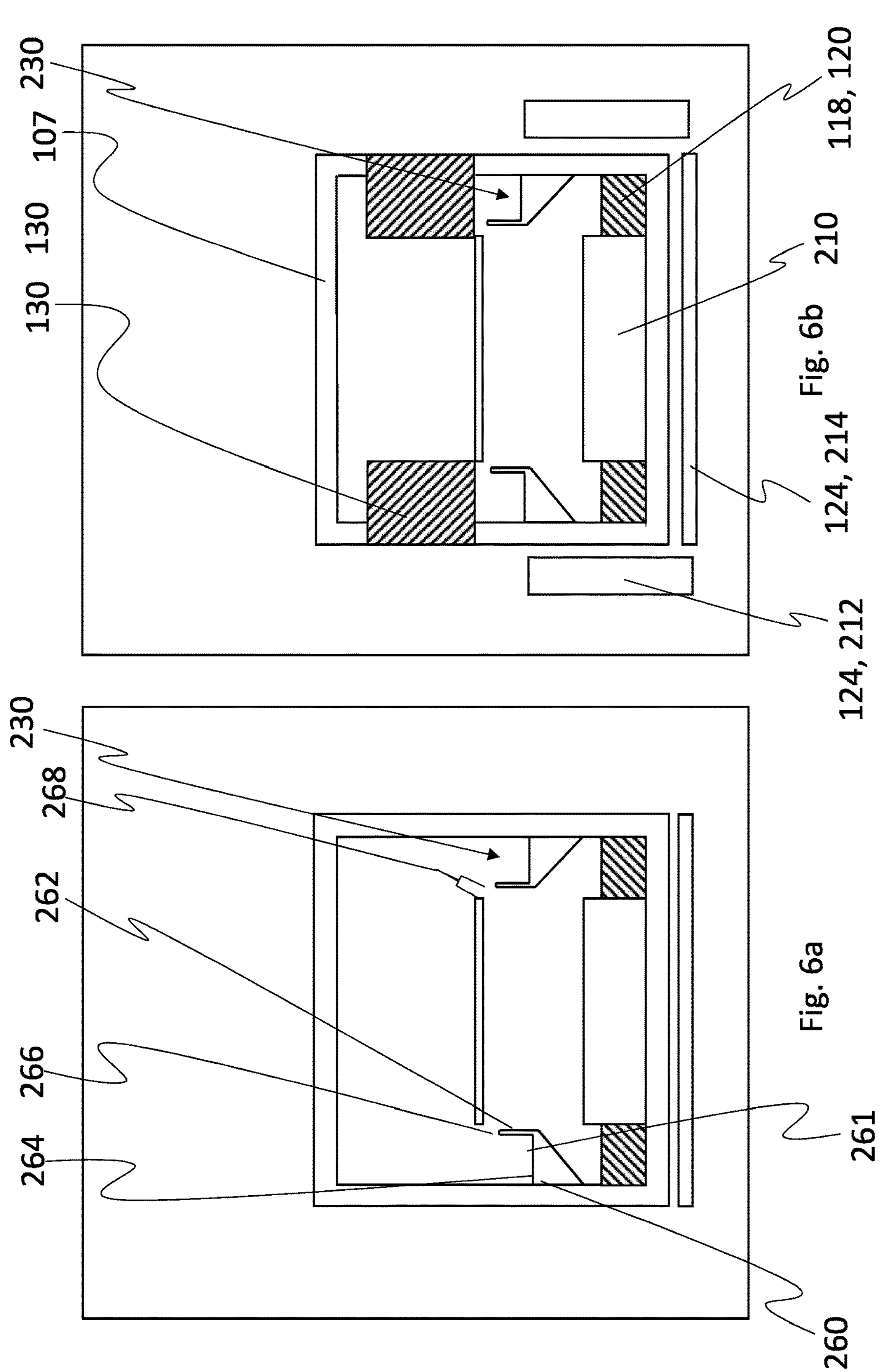
FIG. 6*a* shows an example of a furnace apparatus according to the present invention having a gas distribution plate at least partially overlapping a receiving space of the crucible unit.
FIG. 6*b* shows an example of a furnace apparatus according to the present invention having a gas distribution plate at least partially overlapping a receiving space of the crucible unit.

Thus, FIG. 6*a*-*b* also disclose a method for operating a furnace apparatus 100, in particular a furnace apparatus for growing crystals, in particular for growing SiC crystals, wherein the furnace apparatus 100 comprises a furnace unit 102, wherein the furnace unit 102 comprises a furnace housing 108, at least one crucible unit 106, wherein the crucible unit 106 is arranged inside the furnace housing 108, wherein the crucible unit 106 comprises a crucible housing 110, wherein the crucible housing 110 has an outer surface 112 and an inner surface 114, wherein the inner surface 114 at least partially forms a crucible volume 116. Furthermore, a receiving space 118 for receiving a source material 120 is arranged or formed inside the crucible volume 116. Additionally, or alternatively a seed holder unit 122 for holding a defined seed wafer 18 is preferably provided, in particular arranged respectively arrangeable inside the crucible volume 116. The furnace apparatus 100 preferably also comprises, in particular inside the furnace unit 102, at least one heating unit 124 for heating the source material 120. The receiving space 118 for receiving the source material 120 is preferably at least in parts arranged above the heating unit 124 and below seed holder unit 122. The heating unit 124 preferably comprises at least one heating element, wherein the heating element is preferably arranged in vertical direction below the receiving space 118. A growth guide element 230 is arranged in vertical direction above the receiving space 118 to guide vaporized source material 120 and/or introduced gas into a space between the seed holder unit 122 and the inner bottom surface 207, 244 of the crucible volume 116. The method at least comprises the steps: Heating the source material 120 inside the receiving space 118 by means of the heating unit 124 thereby vaporizing the source material 120 and/or introducing gas into the crucible volume 116, guiding the vaporized source material and/or gas with the growth guide element 230 to the seed wafer 18 or guiding the gas with the growth guide element 230 into the direction of a crucible vacuum outlet tube 174.

FIG. 6*b* shows an example based on the combination of FIG. 2*c* and FIG. 6*a*. However, it is herewith explicitly mentioned that the features of FIG. 6*a* can also be combined with any of the examples of FIG. 2*b*-2*f* and/or any of FIG. 3*a*-3*h* and/or any of FIG. 4*a*-4*b*.

The filter unit 130 is arranged in vertical direction above the receiving space 118. The filter unit 130 and the receiving space 118 are preferably arranged coaxially. An outer diameter of the filter unit 130 preferably corresponds to an outer diameter of the receiving space 118 and/or wherein an inner diameter of the filter unit 130 corresponds to an inner diameter of the receiving space 118. The outer diameter of the filter unit 130 is preferably at least or up to 1.05× larger compared to the outer diameter of the receiving space 118 or wherein the outer diameter of the filter unit 130 is preferably at least or up to 1.1× larger compared to the outer diameter of the receiving space 118 or wherein the outer diameter of the filter unit 130 is preferably at least or up to 1.3× larger compared to the outer diameter of the receiving space 118 or wherein the outer diameter of the filter unit 130 is preferably at least or up to 1.5× larger compared to the outer diameter of the receiving space 118. Alternatively the outer diameter of the receiving space 118 can be at least or up to 1.05× larger compared to the outer diameter of the filter unit 130 or wherein the outer diameter of the receiving space 118 can be at least or up to 1.1× larger compared to the outer diameter of the filter unit 130 or wherein the outer diameter of the receiving space 118 can be at least or up to 1.3× larger compared to the outer diameter of the filter unit 130 or wherein the outer diameter of the receiving space 118 can be at least or up to 1.5× larger compared to the outer diameter of the filter unit 130. Additionally or alternatively the inner diameter of the receiving space 118 is preferably at least or up to 1.05× larger compared to the inner diameter of the filter unit 130 or wherein the inner diameter of the receiving space 118 is preferably at least or up to 1.1× larger compared to the inner diameter of the filter unit 130 or wherein the inner diameter of the receiving space 118 is preferably at least or up to 1.3× larger compared to the inner diameter of the filter unit 130 or wherein the inner diameter of the receiving space 118 is preferably at least or up to 1.5× larger compared to the inner diameter of the filter unit 130. Or wherein the inner diameter of the filter unit 130 is preferably at least or up to 1.05× larger compared to the inner diameter of the receiving space 118 or wherein the inner diameter of the filter unit 130 is preferably at least or up to 1.1× larger compared to the inner diameter of the receiving space 118 or wherein the inner diameter of the filter unit 130 is preferably at least or up to 1.3× larger compared to the inner diameter of the receiving space 118 or wherein the inner diameter of the filter unit 130 is preferably at least or up to 1.5× larger compared to the inner diameter of the receiving space 118.

Figures 7A, 7B:
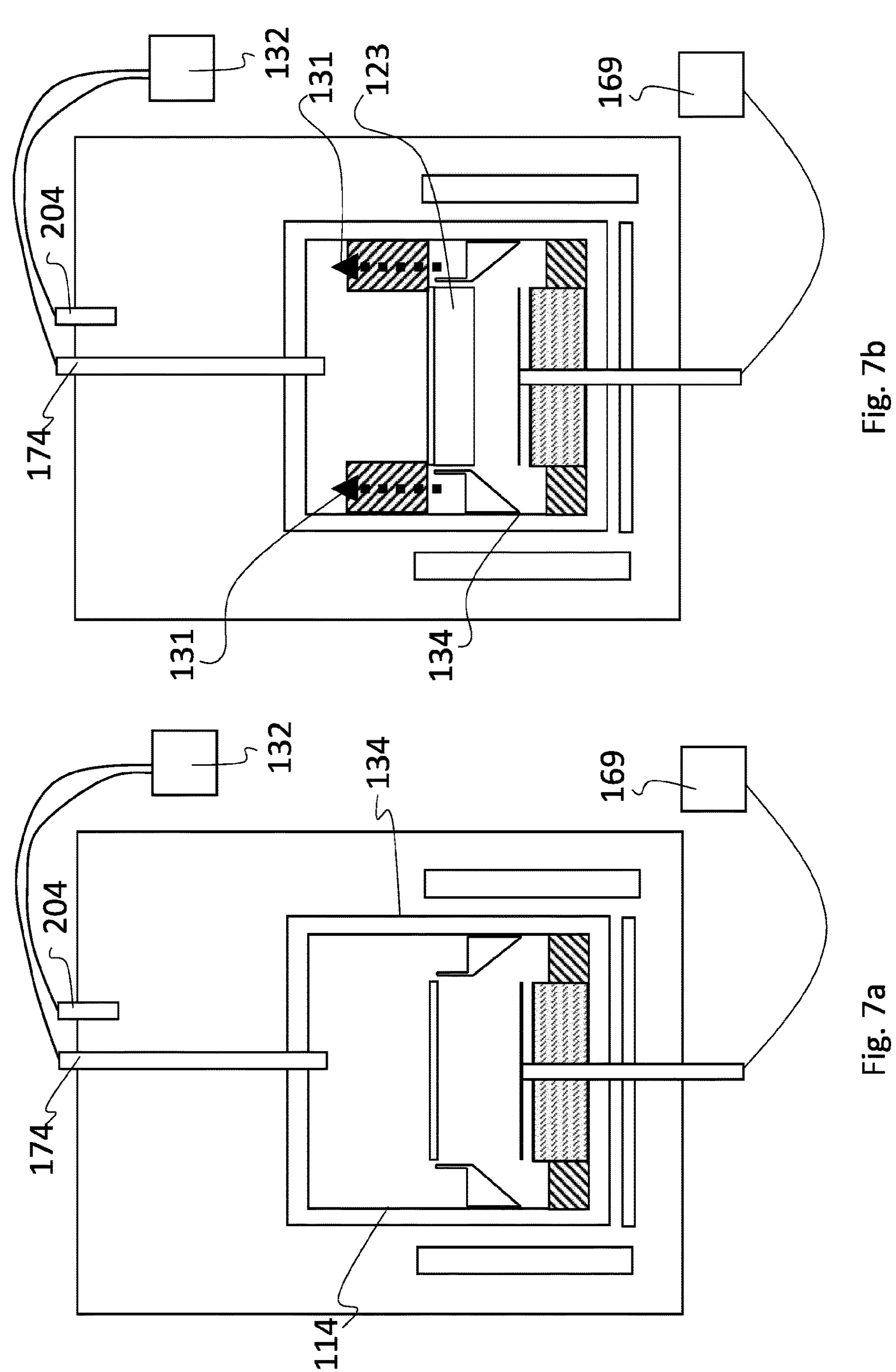
FIG. 7*a* shows an example of a furnace apparatus according to the present invention having an having a plurality of the components of the before mentioned examples.
FIG. 7*b* shows an example of a furnace apparatus according to the present invention having an having a plurality of the components of the before mentioned examples.

FIGS. 7*a* and 7*b* show exemplarily that further combinations of the herewith disclosed features are possible.

Thus, according to FIG. 7*a* a furnace apparatus 100 according to the present invention can comprise an annular receiving space 118, a heating unit 124 for heating the bottom of a crucible volume 116, a gas distribution plate 190, in particular coupled with a crucible gas inlet tube 172, a growth guide element 230, at least one and preferably multiple leak prevention means 134, 132.

FIG. 7*b* schematically shows that the furnace apparatus 100 can also comprise a filter unit 130. However, the housing 110 can be preferably opened by means of a lid 107 (cf. FIG. 2*c*). Thus, the filter unit 130 can be configured to form an outer wall of the crucible housing 110.

Figure 7C:
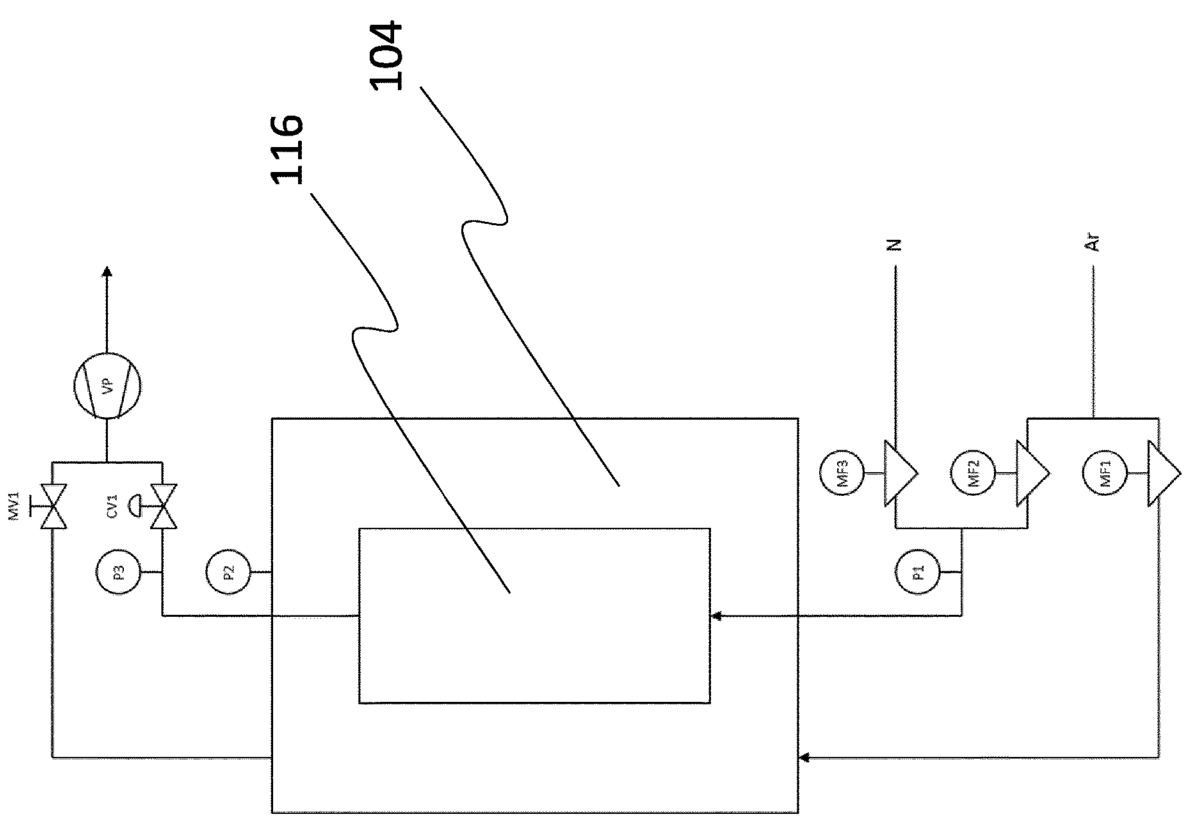
FIG. 7*c* shows an example of a furnace apparatus according to the present invention having an having a plurality of the components of the before mentioned examples.

FIG. 7*c* shows schematically an example of a process flow diagram showing an example how P1 and P2 can be controlled. There are pressurized process gases on one end and a vacuum pump on the other end. First, the mass flow controllers MF1 and MF2 are fully opened and control valve CV1 and manual valve MV1 are fully opened and the furnace volume 104 and the crucible volume 116 are completely purged of air with a gas, in particular an inert gas, in particular argon.

Then MF1 and MF2 are fully closed and maximum vacuum is drawn in both volumes 104, 116.

Next the required (very low) flow of gases, in particular argon and nitrogen, into the crucible volume 116 is started by opening MF2 and MF3 as necessary. The pressure in the crucible volume 116 stabilizes and the incoming pressure and the outgoing pressure are read on pressure gauges P1 and P2. There might be some minor pressure drop across the filter, especially as it starts to fill up with condensed Si. The important reading is P1 as it shows the pressure in the section of the crucible volume where the crystal is growing.

Finally, a small volume of a gas, in particular argon, is put into the furnace volume by opening and closing MF1 just enough to establish a slightly higher pressure over the crucible volume. In other words P2>P1.

Figure 8:
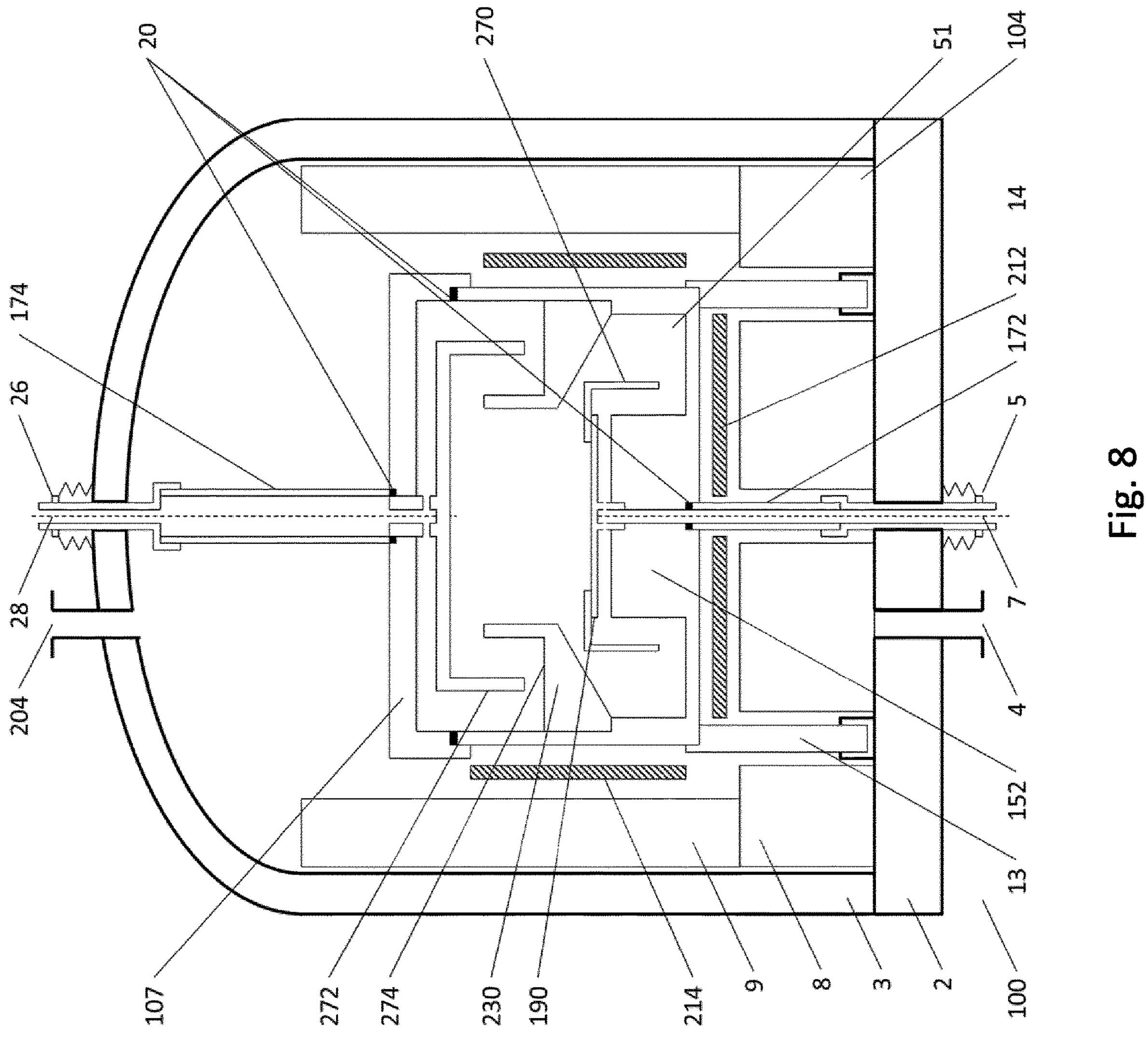
FIG. 8 shows an example of a furnace apparatus according to the present invention in a recovery configuration.

FIG. 8 shows the furnace apparatus 100 respectively furnace 100 in coating regeneration mode. A longer crucible vacuum outlet tube 174 is utilized and the crucible lid respectively filter lid 107 is sealed directly against the crucible lower housing 152. A lower gas guide 270 and an upper gas guide 272 are utilized to guide the flow of a coating gas for optimal coating efficiency. In one embodiment this coating gas is a carbon bearing gas such as methane.

Thus, FIG. 8 schematically shows an example of a furnace apparatus 100 for growing crystals, in particular for growing SiC crystals. The furnace apparatus 100 comprises a furnace respectively a furnace unit 102, at least one crucible unit 106, wherein the crucible unit 106 is arranged inside the furnace unit 102. The crucible unit 106 comprises a crucible housing 110 and a receiving space 118 for receiving a source material 120. The furnace apparatus 100 further comprises at least one heating unit 124 for heating the source material 120. The receiving space 118 for receiving the source material 120 is preferably at least in parts arranged above the heating unit 124 and below seed holder unit 122. The heating unit 124 comprises at least one heating element, wherein the heating element is preferably arranged in vertical direction below the receiving space 118. The size of the crucible housing 110 can be configured respectively is modifiable. The crucible housing 110 surrounds a first volume VI in a crystal growth configuration and the crucible housing 110 surrounds a second volume VII in a coating regeneration configuration. Volume VI is larger compared to volume VII.

VI is at least 10% or at least or up to 20% or at least or up to 30% or at least or up to 40% or at least or up to 50% or at least or up to 60% or at least or up to 70% or at least or up to 80% or at least or up to 100% or at least or up to 120% or at least or up to 150% or at least or up to 209% or at least or up to 250% larger than VII.

The housing 110 comprises in the crystal growth configuration at least one further wall member 130 compared to the coating regeneration configuration.

The further wall member is preferably a filter unit 130. The filter unit 130 is preferably removed in the coating regeneration configuration.

In the coating regeneration configuration, the crucible upper housing 154 respectively the filter lid 107 is in contact with the crucible lower housing 152. In the crystal growth configuration, the filter unit 130 is between and in contact with both the crucible upper housing 154 respectively filter lid 107 and the crucible lower housing 152.

At least one gasket 20 is arranged between the crucible lower housing 152 and the crucible upper housing 154 in the coating regeneration configuration. The gasket 20 preferably functions as leak prevention means 134.

In the crystal growth configuration preferably at least one gasket 20 is arranged between the filter unit 130 and the crucible upper housing 154 and at least one gasket 20 is arranged between the filter unit 130 and the crucible lower housing 152.

The crucible unit 106 comprises in the coating regeneration configuration preferably at least or exactly one lower gas guide respectively at least or exactly one receiving-space-gas-guiding-member 270, wherein the receiving-space-gas-guiding-member 270 extends into the receiving space 118 to guide gas into the receiving space 118.

The furnace apparatus comprises a gas flow unit 170, wherein the gas flow unit 170 comprises a gas inlet for conducting gas into the crucible and a gas outlet for removing gas from the crucible, wherein the crucible gas inlet tube 172 is arranged closer to the bottom of the crucible compared to the crucible vacuum outlet tube 174.

The crucible gas inlet tube 172 is arranged in a transformation zone within the crucible unit 106, wherein the transformation zone preferably comprises the seed holder unit 122 and/or the receiving space 118.

The crucible gas inlet tube 172 is preferably arranged between the receiving space 118 and the seed holder unit 122, wherein the crucible gas inlet tube 172 is preferably in vertical direction arranged closer to the receiving space 118 compared to the seed holder unit 122, in particular the vertical distance between the seed holder unit 122 and the crucible gas inlet tube 172 is preferably more than 2 times the vertical distance between the receiving space 118 and the crucible gas inlet tube 172, in particular more than 5 times the vertical distance between the receiving space 118 and the crucible gas inlet tube 172 or more than 8 times the vertical distance between the receiving space 118 and the crucible gas inlet tube 172 or more than 10 times the vertical distance between the receiving space 118 and the crucible gas inlet tube 172 or more than 20 times the vertical distance between the receiving space 118 and the crucible gas inlet tube 172.

The crucible gas inlet tube 172 is preferably covered by a gas distribution member 190, wherein the gas distribution member 190 preferably extends parallel to a bottom surface 207, 244 of the crucible unit 106, in particular the inner bottom surface 207, 244 of the crucible unit 106.

The gas distribution member 190 is preferably arranged in a defined distance to the bottom surface 207, 244 of the crucible unit 106, in particular the inner bottom surface of the crucible unit 106, wherein the defined distance in vertical direction between the lower surface of the gas distribution member and the bottom surface of the crucible is less than 0.5× distance between the receiving space and the gas inlet or less than 0.3× distance between the receiving space and the gas inlet or less than 0.1× between the receiving space and the gas inlet or less than 0.05× distance between the receiving space 118 and the crucible gas inlet tube 172.

The gas distribution member 182 is preferably a gas guiding plate respectively a gas distribution plate 190. The gas guiding plate 190 preferably forms a lower surface 188 and an upper surface 192. The lower surface 188 and the upper surface 192 preferably extend at least sectionally in parallel to each other. The distance between the lower surface 188 and the upper surface 192 is preferably less than 0.5× distance between the receiving space 188 and the crucible gas inlet tube 172 or less than 0.3× distance between the receiving space 118 and the crucible gas inlet tube 172 or less than 0.1× distance between the receiving space 118 and the crucible gas inlet tube 172 or less than 0.05× distance between the receiving space 118 and the crucible gas inlet tube 172. The gas distribution plate 190 is preferably thin. This means that the distance between the lower surface 188 and the upper surface 192 is preferably less that 5 cm or less than 3 cm or less than 1 cm. This is beneficial since the gas distribution plate 190 does not incorporate a significant amount of material. Furthermore, the gas distribution plate 190 does not affect heat radiation radiated from a bottom section 208 respective crucible solid bottom section 206 covered by the gas distribution plate 190.

The receiving-space-gas-guiding-member 270 preferably rests at least partially on the gas distribution member 190 respectively wherein the gas distribution member 190 preferably holds the receiving-space-gas-guiding-member 270.

The receiving-space-gas-guiding-member 270 preferably has an annular or circular shape.

The receiving-space-gas-guiding-member 270 preferably comprises carbon or consists of carbon and/or graphite.

A growth guide element 230 is preferably arranged in vertical direction above the receiving space 118 to guide vaporized source material and/or introduced gas into a space between the seed holder unit 122 and the inner bottom surface of the crucible unit 106.

The growth guide element 230 comprises a growth guide first section 260 and a growth guide second section 262, wherein the growth guide first section 260 is shaped to match with a corresponding wall section of the crucible housing 110 and wherein the growth guide second section 262 is formed to manipulate the shape of a growing crystal. The growth guide first section 260 and the growth guide second section 262 are arranged coaxial. wherein the growth guide first section 260 is arranged in a first diameter to the center axis A and wherein the growth guide second section 262 is arranged in a second diameter to the center axis A, wherein the first diameter is lager compared to the second diameter. The growth guide first section 260 and the growth guide second section 262 are connected with each other by means of a growth guide third section 261, wherein the growth guide third section 261 at least partially extends in horizontal direction. The growth guide first section 260 and the growth guide third section 261 form a growth guide fourth section 264 and/or wherein the growth guide second section 262 and the growth guide third section 261 are arranged in an angle between 60° and 120°, in particular in an angle between 70° and 110°, in particular in an angle of 90°. The growth guide first section 260, the growth guide second section 262 and the growth guide third section 261 are integral parts of the growth guide element 230.

The growth guide element 230 comprises graphite.

Preferably at least one or exactly one grow-plate-gas-guide-member 272 respectively at least one or exactly one upper gas guide 272 is provided for guiding gas to a surface 274 on the upper side of the growth guide third section 261 of the growth guide element 230. The upper gas guide 272 preferably has an annular or circular shape. The upper gas guide 272 is preferably arranged at the top respectively upper wall part of the housing.

The grow-plate-gas-guide-member preferably comprises carbon or consists of carbon and/or graphite.

FIG. 8 also discloses a method for operating a furnace apparatus 100 in a regeneration mode, in particular a furnace apparatus for growing crystals, in particular for growing SiC crystals. The furnace apparatus 100 comprises a furnace respectively a furnace unit 102, at least one crucible unit 106, wherein the crucible unit 106 is arranged inside the furnace unit 102. The crucible unit 106 comprises a crucible housing 110 and a receiving space 118 for receiving a source material 120. The furnace apparatus 100 further comprises at least one heating unit 124 for heating the source material 120. The receiving space 118 for receiving the source material 120 is at least in parts arranged above the heating unit 124 and below the seed holder unit 122, wherein the heating unit 124 comprises at least one heating element, wherein the heating element is preferably arranged in vertical direction below the receiving space and/or besides the receiving space 118. The size of the crucible housing 110 can be configured, wherein the crucible housing 110 surrounds a first volume VI in a crystal growth configuration and wherein the crucible housing 110 surrounds a second volume VII in a coating regeneration configuration, wherein volume VI is larger compared to volume VII. The crucible unit 106 preferably further comprises a crucible gas inlet tube 172 and a crucible vacuum outlet tube 174. The method comprises the steps: Setting up the coating regeneration configuration, heating the crucible unit 106 with the heating unit 124, inserting a coating gas via the crucible gas inlet tube 172, guiding the coating gas through the crucible unit 106 to coat at least or up to 60%, in particular to coat at least or up to 70% or to coat at least or up to 80% or to coat at least or up to 90% or to coat at least or up to 95% or to coat at least or up to 99%, of the inner surface of the housing 110, and removing the gas via the crucible vacuum outlet tube 174.

This furnace apparatus is beneficial since a reapplying of pyrocarbon coatings to the crucible volume components can take place, in particular in situ using gas guides 270, 272 to optimize flow of gas and hence coating efficiency.

Figure 9:
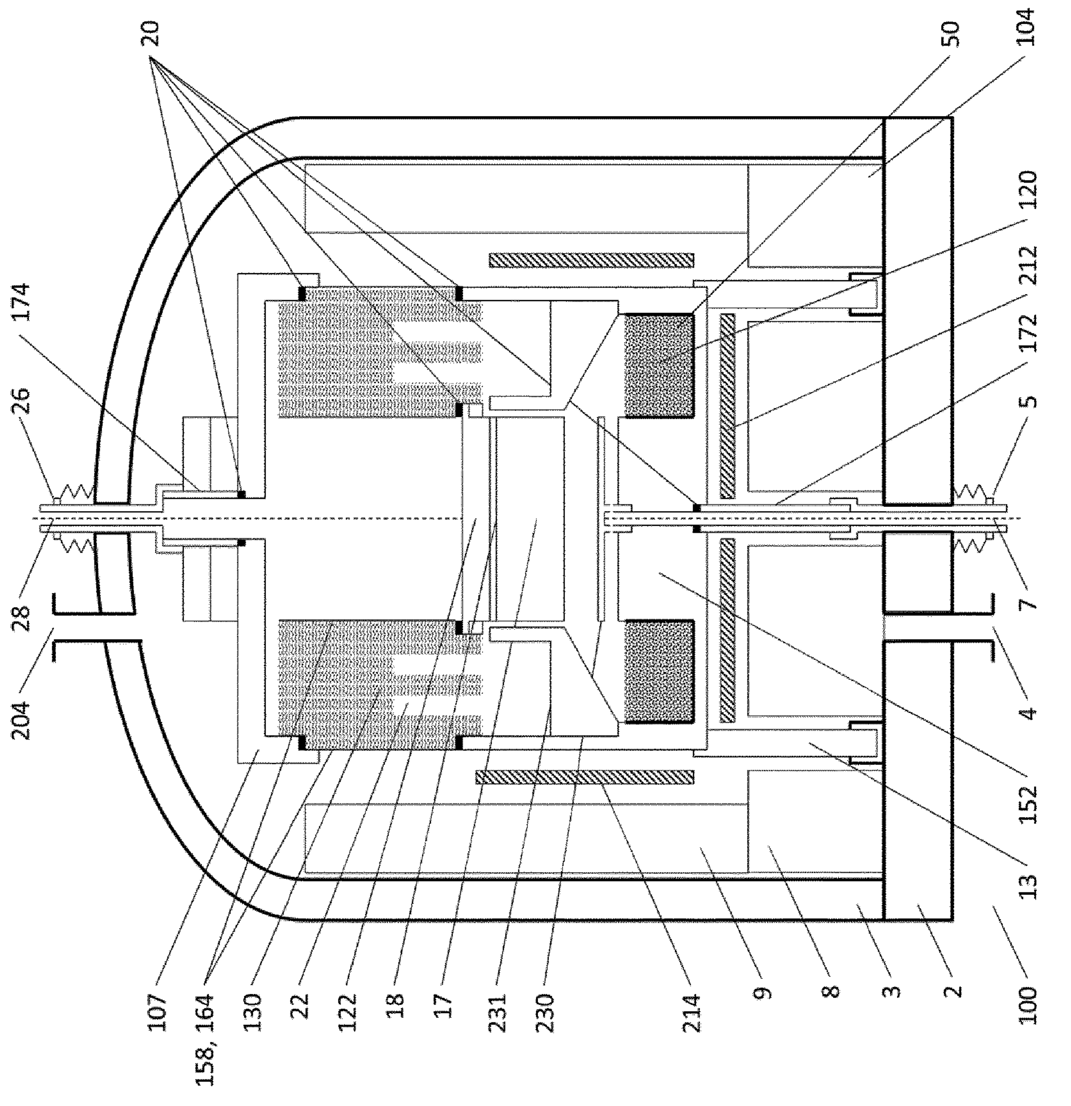
FIG. 9 shows a preferred example of a furnace apparatus according to the present invention having a plurality of the components of the before mentioned examples and preferably further features

FIG. 9 schematically shows a method and apparatus 100 for producing SiC single crystals, in particular SiC of a second type, by PVT. It consists of a furnace unit 102 equipped with inductive or resistive heating elements positioned inside the furnace volume next to a crucible. One of the heating elements is positioned axially directly below the crucible. The crucible bottom has a solid central section surrounded by an annular trench into which source material is loaded. The solid central section is heated primarily by the axial heater below it and provides a stable thermal field for the crystal directly above it. There is no source material between the solid central section and the crystal. A crucible gas inlet tube seals against the bottom center of the crucible and process gases such as argon and nitrogen pass through a shaft in the solid central section and are distributed into the crucible by a gas distribution plate.

The upper edge of the crucible seals against the bottom outer edge of a thick-walled disposable tubular filter and a seed holder seals against the bottom inner edge of the filter. The seed holder holds as seed wafer from which the crystal grows. The upper outer edge of the filter seals against a crucible lid or filter lid and crucible vacuum outlet tube seals against the crucible lid or filter lid. The gas inlet tube, crucible, filter, seed holder, crucible lid or filter lid, and crucible vacuum outlet tube define a crucible volume which operates at slightly lower pressure than the surrounding furnace volume, helping to minimize leakage and permeation of sublimation vapor into the furnace volume.

Except for the filter, the components defining the crucible volume are fabricated from materials which minimize their permeability by Si vapor. These materials include vitreous infiltrated graphite, glassy carbon, pyrocarbon coated graphite, and tantalum carbide ceramics and coatings. The filter is fabricated from a high surface area porous material such as activated carbon powder bound with a high-temperature binder. The inner and outer walls of the filter are coated with a material such as glassy carbon coating to also minimize permeability by Si vapor.

Thus, the combination of slightly lower operating pressure and low permeability materials prevents the Si vapor from permeating out of the crucible volume. The filter is maintained at a lower temperature than the crucible and the Si vapor ultimately reaches and condenses inside the filter. The inexpensive filter is replaced when its capacity to adsorb and condense Si vapor is reached, typically every run.

Preventing the Si vapor from escaping the crucible volume and permeating the furnace internal components except for the filter has the following benefits:

The service life of the furnace internal components is increased,

- The furnace internal components maintain constant thermal properties, improving the stability and repeatability of the crystal growth process and thus increasing yield of low defect crystals, and
- Heating elements can be positioned inside the furnace volume directly next to the crucible without being degraded by escaping Si vapor, allowing for the formation of a thermal field suitable for growth of large diameter crystals.

All of the above benefits contribute to reducing the production cost of the SiC single crystals and the resulting wafers.

Thus, also a method for in-situ generation of a pyrocarbon coating on the crucible components of the furnace apparatus 100, in particular an apparatus for PVT growth of SiC single crystals, preferably comprises the steps: Maintaining the crucible unit 106 in the apparatus respectively furnace apparatus 100 and/or heating the crucible component surfaces to be coated to at least 500 C.° and/or passing a carbon containing gas such as methane through the crucible unit 106 to generate the pyrocarbon coating. One or multiple gas guides 270, 272 are preferably inserted into the crucible unit 106 to direct the flow of the carbon containing gas such that the uniformity of the pyrocarbon coating thickness on the crucible component surfaces can be enhanced.

FIG. 9 shows one embodiment of a furnace respectively a furnace apparatus 100 respectively a PVT furnace in accordance with the principles of this invention. The furnace 100 is cylindrical in shape and is composed of a lower furnace unit respectively a lower furnace housing 2 and an upper furnace unit respectively an upper furnace housing 3, both typically of double-walled water-cooled stainless-steel construction, which define a furnace volume 104. The lower furnace housing 2 incorporates a furnace gas inlet 4 and the upper furnace housing 3 incorporates a furnace vacuum outlet respectively furnace vacuum outlet 204. Inside the furnace volume 104 there is a crucible unit 106, supported by crucible legs 13. Below the crucible unit 106 there is an axial heating element 214 and around the sides of the crucible unit 106 there is a radial heating element 212. Below the axial heating element 214 there is bottom insulation 8 and around the radial heating element 212 there is side insulation 9. The crucible lower housing 152 has a solid central section surrounded by an annular trench, into which source material 120 is loaded. A crucible gas inlet tube 172 seals against the bottom center of the crucible lower housing 152 and process gases such as argon and nitrogen pass through a shaft in the solid central section and are distributed into the crucible volume by a gas distribution plate 190. The crucible gas inlet tube respectively crucible gas inlet tube 172 is connected to an adjustable crucible gas inlet 5 extending through the furnace lower body 2.

The crucible lower housing 152 also incorporates a growth guide element 230 which is used to tune the thermal field and vapor flow around the sides of the crystal 17. The crystal 17 grows from a seed wafer 18 attached to a seed holder 122. The seed holder 122 seals against the lower inner edge of a thick-walled tubular filter respectively filter unit 130. The crucible lower housing 152 seals against the lower outer edge of this filter 130. The filter preferably incorporates filter grooves 22 or holes to increase the surface area for deposition of excess $SiC_2$ and $Si_2C$ sublimation vapors. The filter 130 also incorporates a filter outer surface coating 158, 164 on its inner and outer walls to minimize permeability by Si vapor.

The upper outer edge of the filter 130 seals against a crucible lid or filter lid 107 respectively a crucible upper housing 154 which in turn seals against a crucible vacuum outlet tube respectively crucible vacuum outlet tube 174. The crucible vacuum outlet tube 175 is connected to an adjustable crucible vacuum outlet 26 extending through the furnace upper body 3. All sealing surfaces are fitted with gaskets 20.

The crucible gas inlet tube 172, crucible unit 106, seed holder 122, filter 130, filter lid 107, and crucible vacuum outlet tube 174 define a crucible volume 116. The temperature of the bottom of the gas distribution plate 190 is measured by a pyrometer along the lower pyrometer sightline 7. The temperature of the top of the seed holder 122 is measured by a pyrometer along the upper pyrometer sightline 28.

The furnace 100 is operated under conditions of high temperature and low pressure. First the furnace volume 104 and the crucible volume 116 are purged of any air with an inert gas such as argon to prevent oxidation. The axial heating element 214 and the radial heating element 212 are then used to create a thermal field inside the crucible volume 116 such that the temperature of the bottom of the gas distribution plate 190 is typically in the range of 2,200-2,400° C. and the temperature of the crystal growth face is typically in the range of 2,000-2,200° C., with flat radial isotherms throughout the crystal 17. The lower temperature of the crystal 17 is achieved by having little or no insulation above the seed holder 122, allowing heat to pass through the crystal 17 and seed holder 122 and radiate out to the water-cooled inner wall of the upper furnace housing 3.

Pressure inside the crucible volume 116 during crystal growth is typically in the range of 0.1 respectively 13.3322 Pa-50 Torr respectively 6666.12 Pa and is slightly less than the pressure in the furnace volume 104. This negative relative pressure inside the crucible volume 116 minimizes the leakage of sublimation vapors into the furnace volume 104.

Under the described temperature and pressure conditions, the source material sublimes, releasing Si, $SiC_2$ and $Si_2C$ vapors. The temperature gradient between the source material 120 and the cooler crystal 17 drives these sublimation vapors toward the crystal 17 where the $SiC_2$ and $Si_2C$ vapors incorporate into the crystal 17, resulting in its growth. Excess $SiC_2$ and $Si_2C$ vapors form polycrystalline deposits on sides of the seed holder 122, the lower surfaces of the filter 130, and the upper inner walls of the crucible unit 106. In one embodiment, a slight flowrate of argon and/or nitrogen convectively assists the thermally driven diffusion of the sublimation vapors to the crystal 17. In another embodiment, a slight flowrate of nitrogen is added to dope the crystal 17 and modify its electrical properties. The gas flows radially outward from the gas distribution plate 190, mixing with the sublimation vapors rising from the source material 120.

All of the components inside the furnace volume 104 are fabricated from materials that are compatible with the operating temperatures and pressures and that do not contaminate the crystal 17. In one embodiment, the bottom insulation 8 and side insulation 9 can be fabricated from graphite felt or graphite foam. The axial heating element 214 and radial heating element 212 can be fabricated from graphite as can the crucible legs 13 and the crucible gas inlet tube 172.

The crucible lower housing 152, gas distribution plate respectively gas distribution plate 190, growth guide element 230, and seed holder 122 can be fabricated from materials that also minimize permeation by the Si vapor. Such materials include vitreous infiltrated graphite, glassy carbon, pyrocarbon coated graphite, and tantalum carbide ceramics and coatings. Whereas graphite has a permeability of $10^{-1}$ $cm^2/s$, vitreous infiltrated graphite has a permeability of $10^{-3}$ $cm^2/s$, glassy carbon has a permeability of $10^{-11}$ $cm^2/s$ and pyrocarbon coated graphite has a permeability of $10^{-12}$ $cm^2/s$. Not significantly permeating these components or incorporating into the crystal 17, the Si vapor arising from the subliming source material 120 pass between the growth guide element 230 and the crystal 17 respectively the growing crystal and enter the filter 130.

The filter 130 is made of a porous material with high surface area. In one embodiment this material is activated carbon powder with a unit surface area of approximately 2,000 $m^2/g$ bound together with a high temperature binder such as carbonized starch. The inner and outer walls of the filter 130 have filter outer surface coatings 158, 164 fabricated from a material to minimize permeation by Si vapor. In one embodiment this material is glassy carbon coating. Not significantly permeating the filter outer surface coatings 158, 164, the Si vapor rises further into the filter 130 and ultimately condenses due to the lower temperatures in the upper section of the filter 130.

Thus, the present invention can refer to a method or furnace apparatus or apparatus for PVT growth of single crystals, in particular SiC single crystals, comprising one multiple or all of the below mentioned features or steps:

Providing a furnace housing capable of containing a crucible unit, heaters, and insulation, with the furnace housing also having an adjustable lower crucible gas inlet tube and an adjustable upper crucible vacuum outlet tube. Providing a crucible unit and a growth guide which are both substantially impermeable to Si vapor. Loading the crucible unit with SiC source material.

Providing a lid assembly for the crucible unit consisting of: An annular porous high surface area filter for trapping Si sublimation vapors whose outside and inside vertical tubular surfaces are coated with a coating substantially impermeable to Si vapor and which has upper and lower outer circumferential sealing shoulders; A seed holder also substantially impermeable to Si vapor and attached to and sealing the lower inner opening of the filter; A SiC single crystal seed attached to the seed holder; A filter cap that seals against the upper outer circumferential sealing shoulder of the filter and that also seals against the crucible vacuum outlet tube.

Raising the crucible gas inlet tube and lowering the crucible vacuum outlet tube such that the crucible gas inlet tube presses and seals against the crucible unit, the crucible unit presses and seals against the lower outer circumferential sealing shoulder of the filter, the upper outer circumferential sealing shoulder of the filter presses and seals against the filter cap, and the filter cap presses and seals against the crucible vacuum outlet tube. Providing sealing gaskets at all the seal interfaces to improve the gas-tightness of the seal interfaces.

Creating an inert vacuum in the crucible volume defined by the crucible unit and filter assembly. Creating an inert vacuum in the furnace volume via a separate furnace gas inlet and separate furnace vacuum outlet.

Maintaining the crucible volume at a lower pressure than the furnace volume. Heating and subliming the source material.

Activating the flow of carrier and doping gases, as necessary, into the crucible unit. Growing the crystal while trapping the Si vapor in the filter, thus preventing the Si vapor from permeating and coating the crucible unit, heaters, insulation, and any other components inside the furnace volume.

Thus, preferably a PVT furnace for making SiC single crystals is provided, where the subliming Si vapors are prevented from infiltrating the crucible housing wall, the heaters, and the insulation. Infiltration of Si vapor into these components first alters their thermal properties making it hard to grow a good crystal because the thermal field is not stable. Second, the physical structure of these components is eventually destroyed by the Si. Thus, the present PVT furnace avoids such infiltration.

This is preferably achieved by making the walls especially the inner walls of the crucible housing impermeable to Si vapor and/or by removing the Si vapor from the gas mixture inside the crucible volume, in particular by adsorbing and condensing or depositing it on some surface, wherein that surface can be a filter. That surface can be for example arranged inside the crucible unit or outside the crucible unit but inside the furnace or even outside the entire furnace unit. In case that surface is arranged outside the crucible unit a fluid communication by means of at least one pipe respectively a pipe system is preferably provided to connect that surface functionally with the crucible volume.

By doing the above, heaters can be put inside the furnace volume and create the thermal field necessary to grow large diameter boules without worrying about the heaters getting destroyed by the Si vapor. Thus, the service life of the insulation and the crucible housing can be dramatically extended. Additionally, since all these materials will have stable thermal properties, a higher yield of boules meeting specs is possible.

Basically, the present invention refers to a furnace apparatus 100, in particular a furnace apparatus 100 for growing crystals, in particular for growing SiC crystals. The furnace apparatus comprises a furnace unit 104, wherein the furnace unit 102 comprises a furnace housing 108 at least one crucible unit 106 wherein the crucible unit 106 is arranged inside the furnace housing 108, wherein the crucible unit 106 comprises a crucible housing 110, wherein the housing 110 has an outer surface 112 and an inner surface 114, wherein the inner surface 114 at least partially defines a crucible volume 116, wherein a receiving space 118 for receiving a source material 120 is arranged or formed inside the crucible volume 116, wherein a seed holder unit 122 for holding a defined seed wafer 18 is arranged inside the crucible volume 116, and at least one heating unit 124 for heating the source material 120, wherein the receiving space 118 for receiving the source material 120 is at least in parts arranged between the heating unit 124 and the seed holder unit 122.

Further, the present invention refers to a reactor 100, in particularly a reactor 100 for growing crystals, in particularly for growing SiC crystals. The reactor comprises a furnace 102, wherein the furnace 102 comprises a furnace chamber 104 at least one crucible (106) wherein the crucible 106 is arranged inside the furnace chamber 104, wherein the crucible 106 comprises a frame structure 108, wherein the frame structure 108 forms a housing 110, wherein the housing 110 has an outside surface 112 and an inside surface 114, wherein the inside surface 114 at least partially forms a crucible chamber 116, wherein a receiving space 118 for receiving a source material 120 is arranged or formed inside the crucible chamber 116, wherein a seed holder unit 122 for holding a defined seed wafer is arranged inside the crucible chamber 116, and at least one heating unit 124 for heating the source material 120, wherein the receiving space 118 for receiving the source material 120 is at least in parts arranged between the heating unit 124 and the seed holder unit 122.

Figure 10:
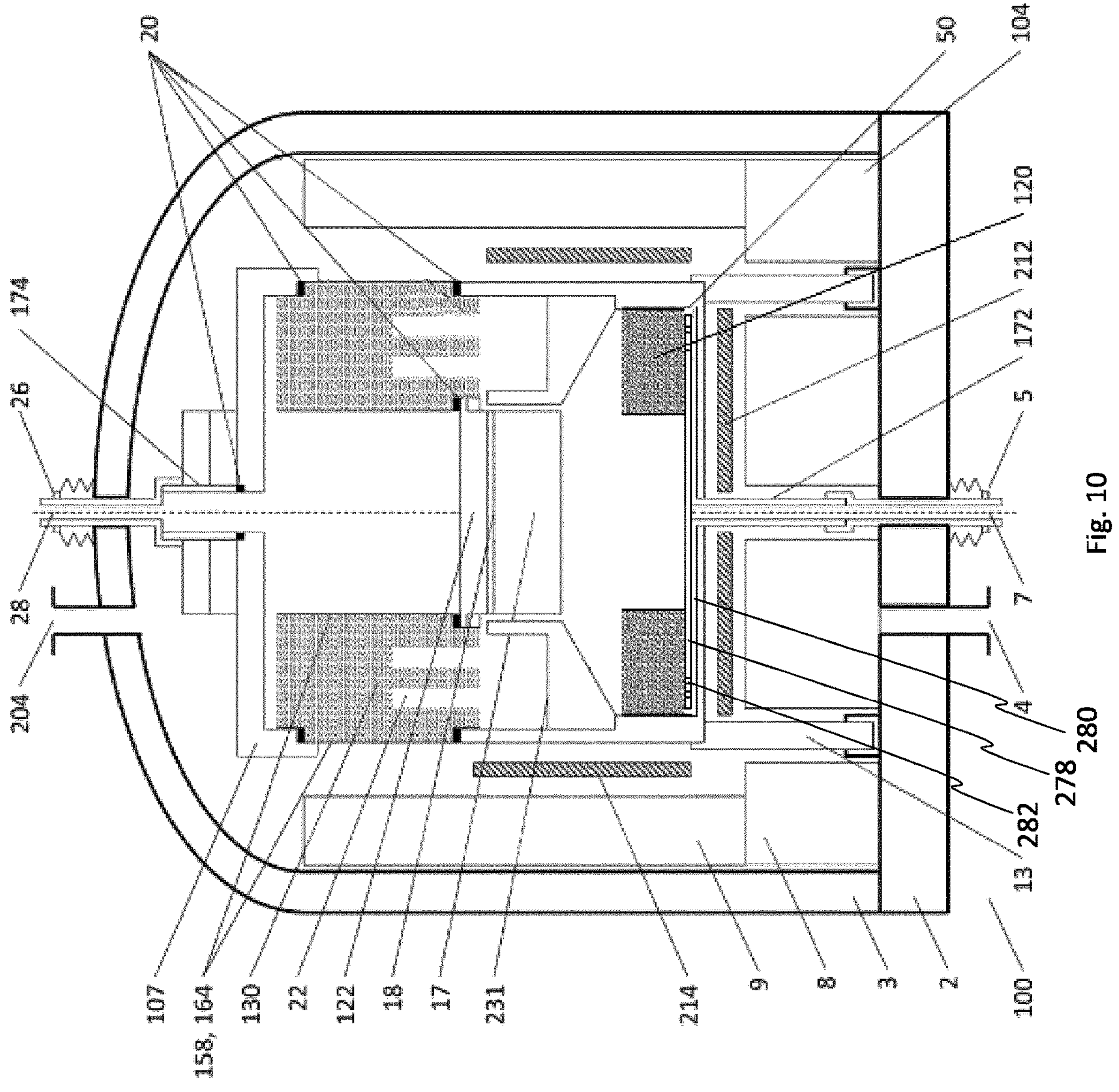
FIG. 10 shows a further preferred example of a furnace apparatus according to the present invention having a plurality of the components of the before mentioned examples and preferably further or alternative features.

FIG. 10 shows a preferred embodiment of the furnace apparatus 100 with the gas flow patterns within the crucible volume 116 described. The crucible gas inlet 5 passes through the furnace lower housing 2 and connects to the crucible gas inlet tube 172, which in turn connects to the crucible lower housing 152. Thus a pathway is create for pumping an inert carrier gas such as argon into the crucible volume 116. There is a source material plate 278 positioned such that a gas flow gap 280 is created between the source material plate 278 and the crucible bottom wall inner surface 207. The source material plate 278 is provided with source material plate holes 282 or porous sections positioned to allow the carrier gas to pass from the gas flow gap 280 into the source material 120 while minimizing backward diffusion of sublimation species into the crucible gas inlet tube 172.

Thus a gas flow path 284 is established which enters the crucible gas inlet 5, passes through the crucible gas inlet tube 172, spreads out in the gas flow gap 280, passes through the source material plate holes 282 and enters the source material 120. In the source material 120, the gas flow path 284 passes between and around the particles of the source material in an overall upward direction. In the space above the source material 120, the growth guide 230 concentrates the gas flow path 284 toward the seed wafer 18 or crystal growth face 252, as the case may be. The majority of sublimation species moving in the gas flow path 284 condense onto the seed wafer 18 or crystal growth face 252, thus achieving crystal growth. The carrier gas such as inert argon and any remaining sublimation species continue along the gas flow path outward across the surface of the seed wafer 18 or crystal growth face 252 and pass through the annual gap between the growth guide 230 and seed holder 122. Once past this annular gap, the gas flow path 284 enters the highly porous filter unit 130 and flows easily upward to exit the filter unit 130 just below the filter lid 107. The gas flow path 284 then moves toward the center of the filter lid 107 and into the crucible vacuum outlet tube 174. The gas flow path then exits the furnace upper housing 3 through the crucible vacuum outlet 26.

Figure 11B:
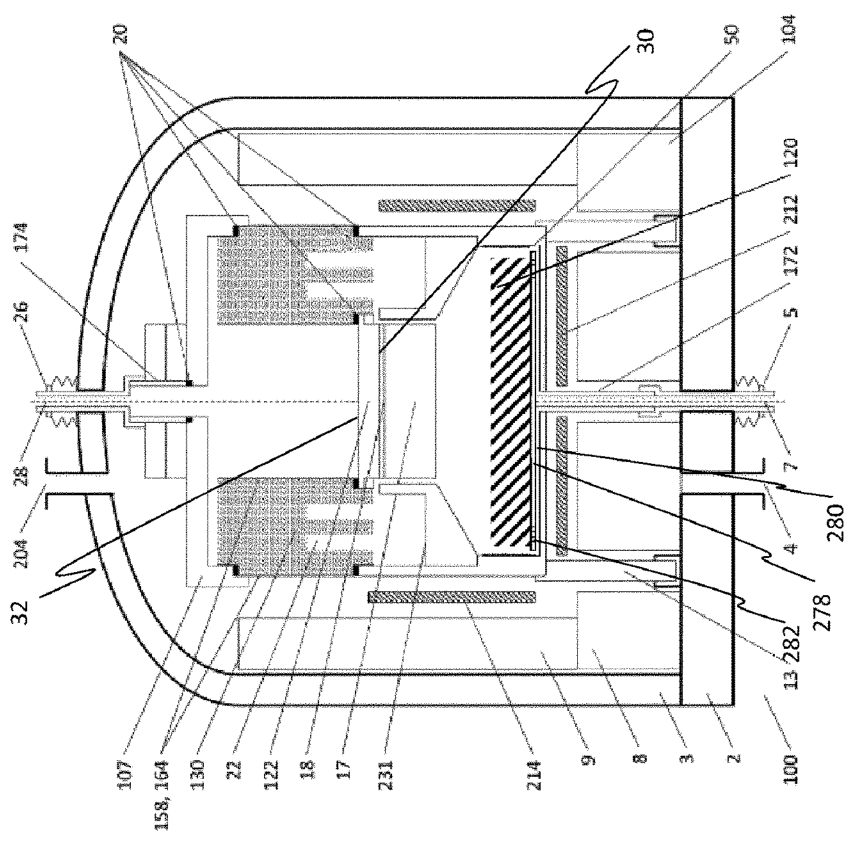
FIG. 11*b* shows a preferred example of a furnace apparatus according to the present invention having a plurality of the components of the before mentioned examples and preferably further or alternative features, furthermore different granularity of source material is shown.
Figure 11A:
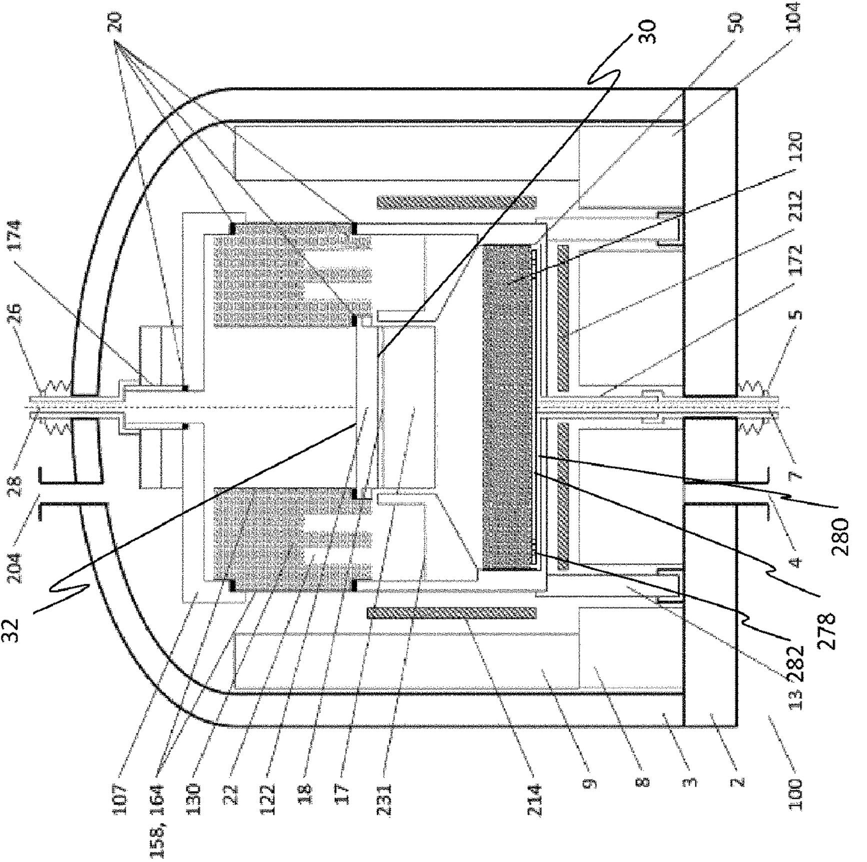
FIG. 11*a* shows a preferred example of a furnace apparatus according to the present invention having a plurality of the components of the before mentioned examples and preferably further or alternative features, furthermore different granularity of source material is shown.
Figures 11C, 12:
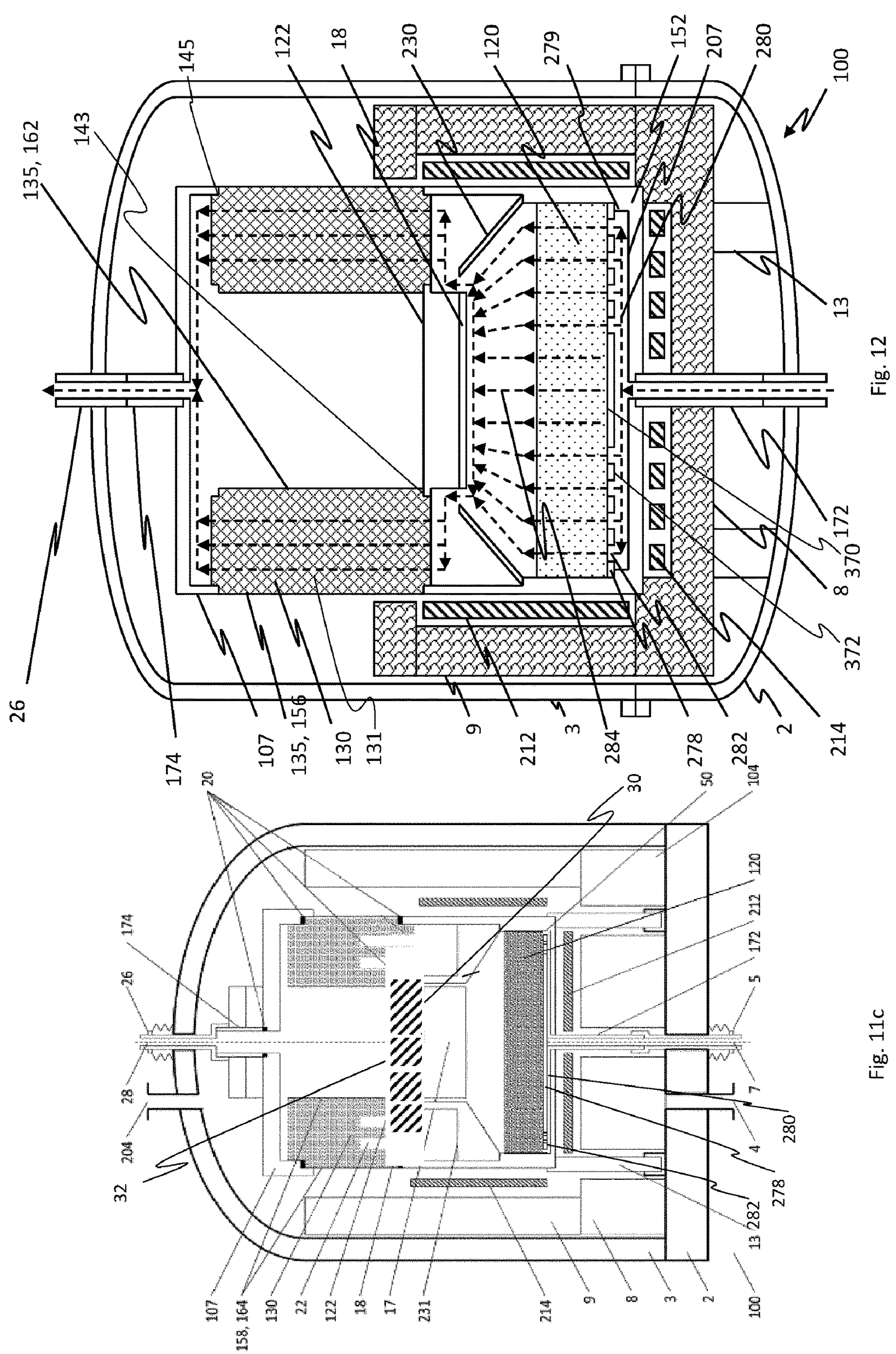
FIG. 11*c* shows a preferred example of a furnace apparatus according to the present invention having a plurality of the components of the before mentioned examples and preferably further or alternative features, furthermore different granularity of source material is shown.
FIG. 12 shows a preferred example of a furnace apparatus according to the present invention having a plurality of the components of the before mentioned examples and preferably further or alternative features.

FIG. 11*a* shows an examples similar to the examples shown in FIGS. 9, 10 and 12, wherein according to this example the source material 120 is provided as fragments respectively at least partially provided as fragments, wherein at least 50% (mass) or preferably at least 70% (mass) or highly preferably at least 80% (mass) or most preferably at least 90% (mass) of the source material is provided as fragments having a volume of more than 0.5 $cm^3$ or preferably of more than 1 $cm^3$ or highly preferably of more than 1.5 $cm^3$ or most preferably of more than 2 $cm^3$ or of more than 5 $cm^3$.

FIG. 11*b* shows an examples similar to the examples shown in FIG. 11*a*, wherein according to this example the source material 120 is provided as one solid body, respectively wherein at least 50% (mass) or preferably at least 70% (mass) or highly preferably at least 80% (mass) or most preferably at least 90% (mass) of the source material is provided as one solid body, wherein the one solid body has a volume above 10 $cm^3$ or above 20 $cm^3$.

FIG. 11*c* shows an examples similar to the examples shown in FIG. 11*a*, wherein according to this example the source material 120 is provided as multiple solid bodies, respectively wherein at least 50% (mass) or preferably at least 70% (mass) or highly preferably at least 80% (mass) or most preferably at least 90% (mass) of the source material is provided as multiple solid bodies, wherein the each of the solid bodies has a volume above 10 $cm^3$ or above 3.

Furthermore, it is shown that the seed holder unit 122 is preferably coupled to the filter unit 130 and held by the filter unit 130. The seed holder unit 122 and the filter unit 130 are highly preferably glued together or are pressed together or are screwed together.

FIG. 12 shows a further example of the furnace apparatus 100 according to the present invention. The filter outer surface 156 preferably comprises a filter outer surface covering element 158, wherein the filter outer surface covering element 158 is a sealing element 135, wherein the sealing element 135 is preferably a filter coating 135, wherein the filter coating 135 is generated at the filter surface 156 or attached to the filter surface 156 or forms the filter surface 156.

The filter coating 135 of the outer surface 156 preferably comprises a material or multiple materials selected from a group of materials at least comprising pyrocarbon and glassy carbon, wherein the filter coating 135 of the filter outer surface 156 is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating 135 of the filter outer surface 156 is preferably formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

The filter inner surface 162 preferably comprises a further filter inner surface covering element 164, wherein the further filter inner surface covering element 164 is a sealing element, wherein the sealing element is a filter coating 135, wherein the filter coating 135 is generated at the filter surface 156 or attached to the filter surface 156 or forms the filter surface 156. The filter coating 135 of the filter inner surface 162 preferably comprises a material or multiple materials selected from a group of materials at least comprising pyrocarbon and glassy carbon, wherein the filter coating 135 of the filter inner surface 162 is formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating 135 of the filter inner surface is formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

Figure 13B:
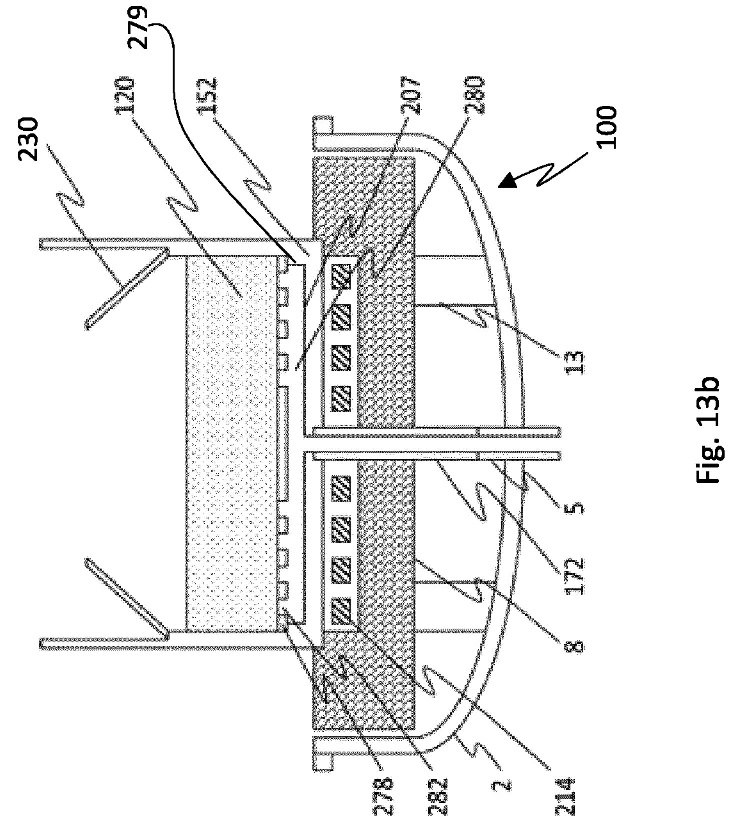
FIG. 13*b* shows an example of how a receiving space of a crucible inside a furnace apparatus according to the present invention can be accessed.
Figure 13A:
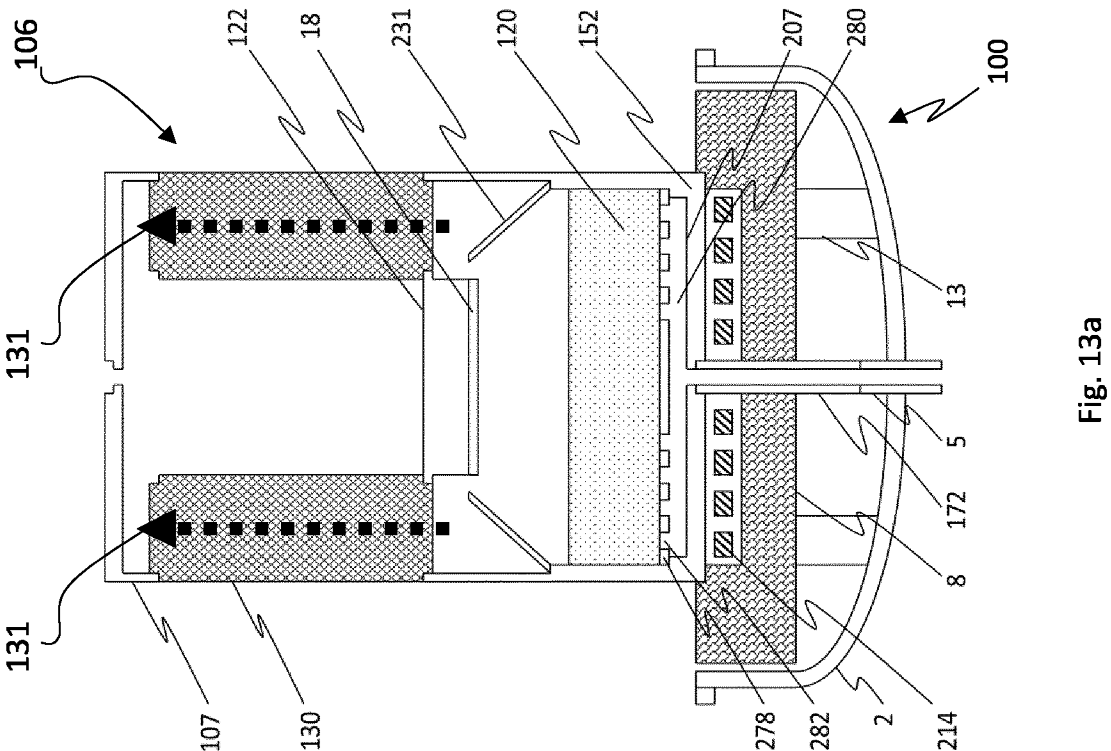
FIG. 13*a* shows an example of how a crucible inside a furnace apparatus according to the present invention can be accessed.

FIG. 13*a* shows an example of how the furnace apparatus 100 can be disassembled to reach the crucible unit 106. According to this example the furnace upper housing 3 is removed from the furnace lower housing 2 (cf. e.g. FIG. 12).

FIG. 13*a* shows an example of how the crucible unit 106 can be disassembled to reach the receiving space 118 respectively the source material plate hole 282, which preferably rests on a source material holding plate seat 279, which is preferably formed by a section of the crucible wall.

Figure 14:
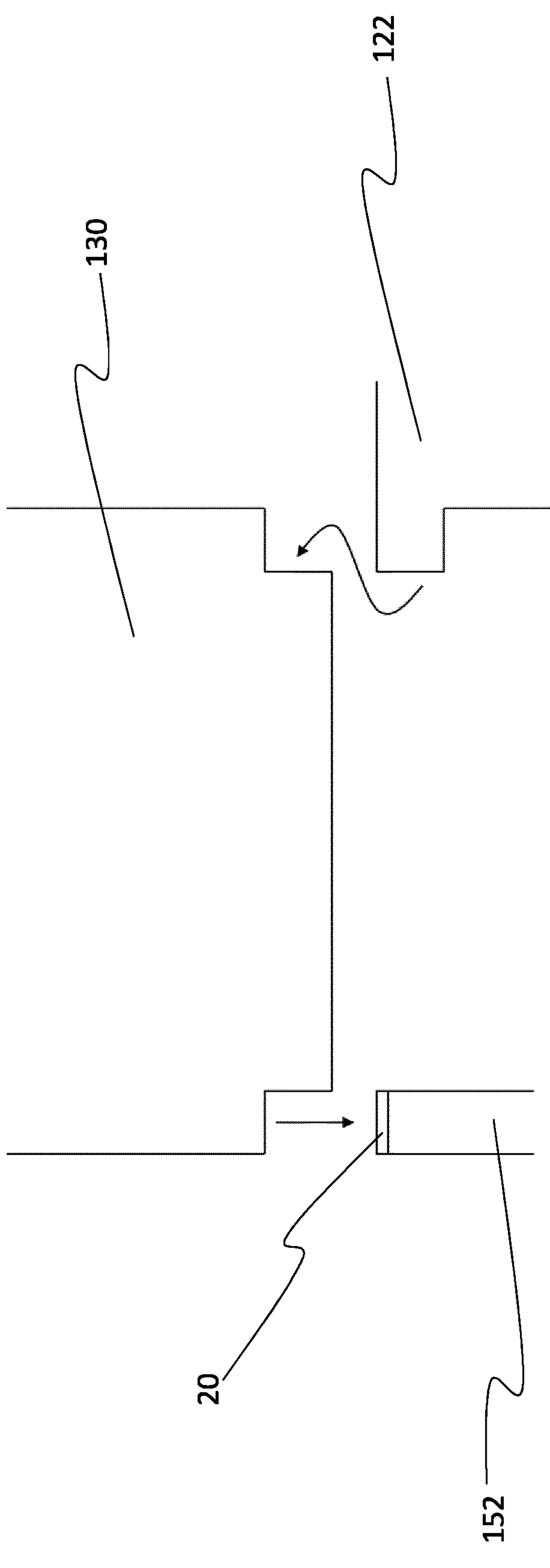
FIG. 14 shows an example of how a filter unit can be coupled with crucible wall and/or seed holder unit.

FIG. 14 shows an example of how the filter unit 130 can be attached to the crucible wall 152. The filter unit preferably forms a seat portion for resting on the crucible wall 152, in particular on a sealing respectively gasket arranged or formed or provide on a surface of the crucible wall 152. However, it is alternatively or additionally also possible that the sealing or gasket 20 is arranged or formed or provide on a surface of the filter unit 130.

FIG. 14 additionally shows that the seed holder unit 122 can be attached to the filter unit 130. The filter unit 130 and/or the seed holder unit 122 preferably form respective surfaces, which can be brought in contact with each other. The seed holder unit 122 is preferably clamped, screwed and/or glued to the filer unit 130.

Figure 15:
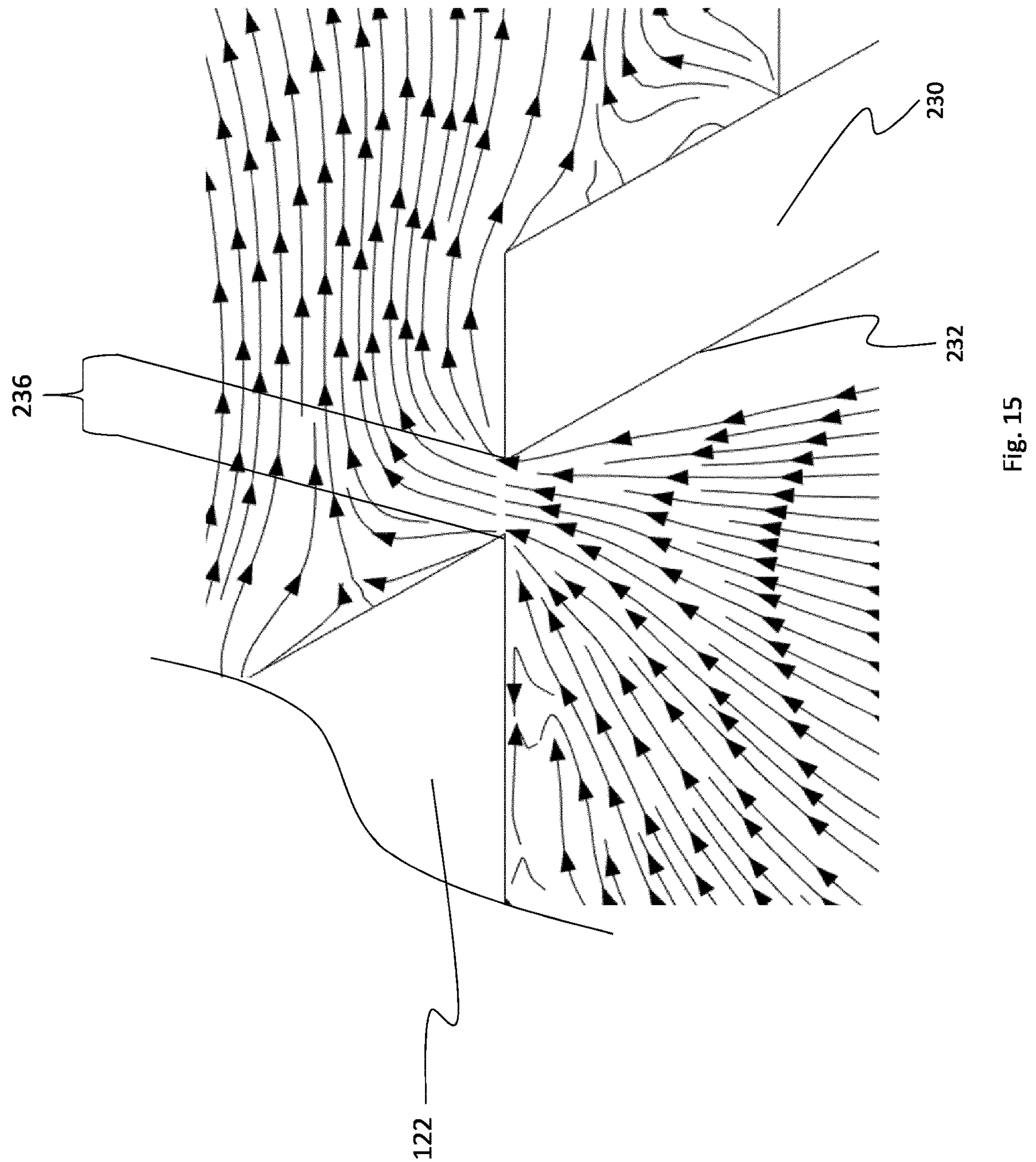
FIG. 15 schematically shows a fluid flow path through a fluid passage between the seed holder unit and a growth guide plate.

FIG. 15 shows schematically a gas flow through a gas flow passage 236 formed between the seed holder unit 122 and the growth guide 230. Thus, the growth guide 230 respectively growth guide element 230 forms a growth-guide-gas-path-section-boundary for guiding gas flow into the direction of the seed holder unit. The growth guide and the seed holder unit form a gas-flow passage, wherein gas flow velocity through the gas flow passage is preferably set-up between 1 cm/s and 10 cm/s and highly preferably between 2 cm/s and 6 cm/s and most preferably between 2.5 cm/s and 5.5 cm/s or 2.5 cm/s and 4.5 cm/s or 3 cm/s and 5.5 cm/s or 3.5 cm/s and 4 cm/s. The seed holder unit and the growth guide preferably are arranged in a distance to each other to form the gas flow passage. The distance between the seed holder unit and the growth guide is preferably more than 0.1% of the diameter of the seed holder unit and highly preferably more than or up to 2% of the diameter of the seed holder unit and most preferably between 0.1% and 20%, in particular between 1% and 10% or between 1% and 5%, of the diameter of the seed holder unit. The distance between the seed holder unit and the growth guide is preferably less than 20 cm or less than 15 cm or highly preferably less than 10 cm and most preferably in a range between 0.5 cm and 10 cm.

Figure 16B:
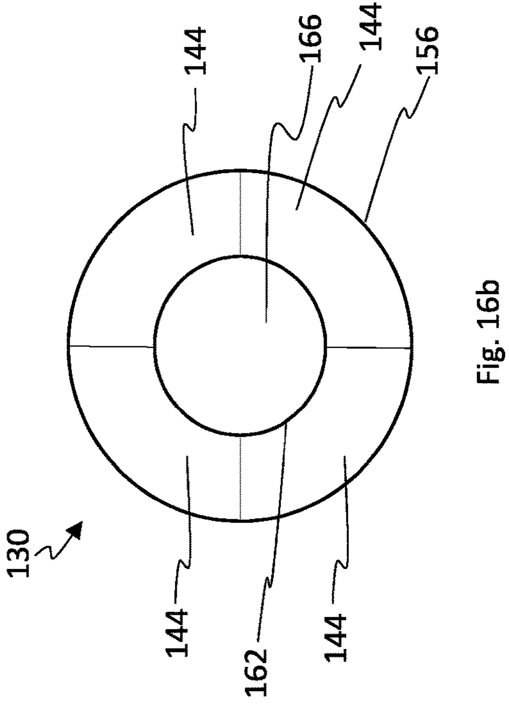
FIG. 16*b* schematically shows an example of a filter unit.
Figure 16D:
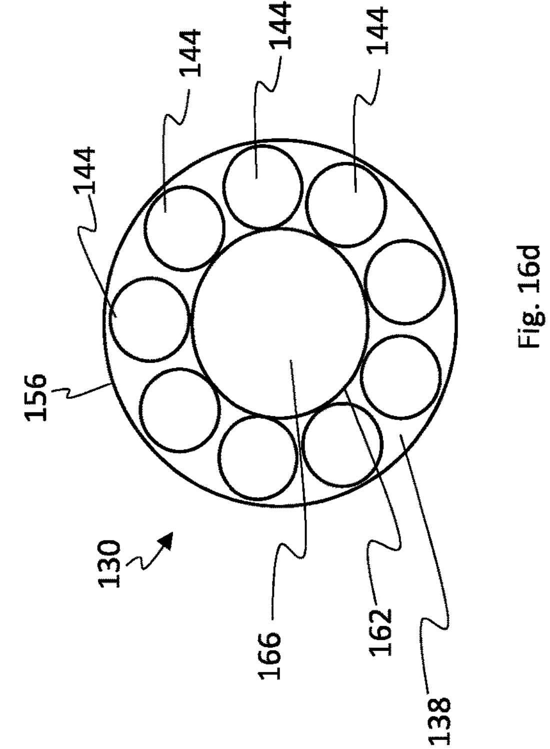
FIG. 16*d* schematically shows an example of a filter unit.
Figure 16A:
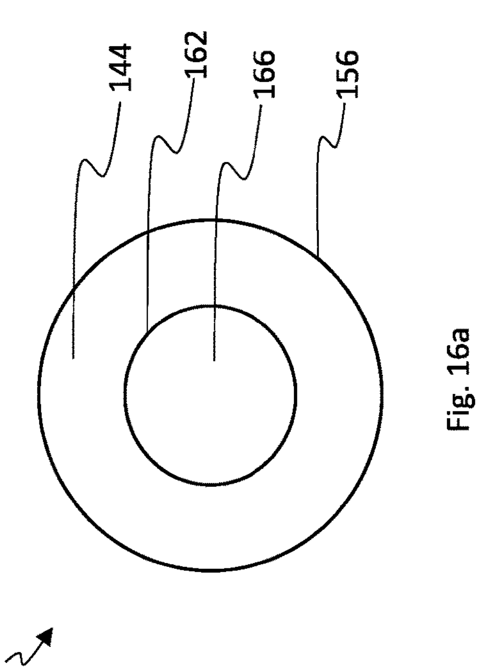
FIG. 16*a* schematically shows an example of a filter unit.

FIG. 16*a* schematically shows a preferred example of a filter unit according to the present invention.

FIG. 16*b* shows a further preferred example of a filter unit according the present invention, wherein this filter unit 130 comprises or consist of multiple filter elements 144.

Figure 16C:
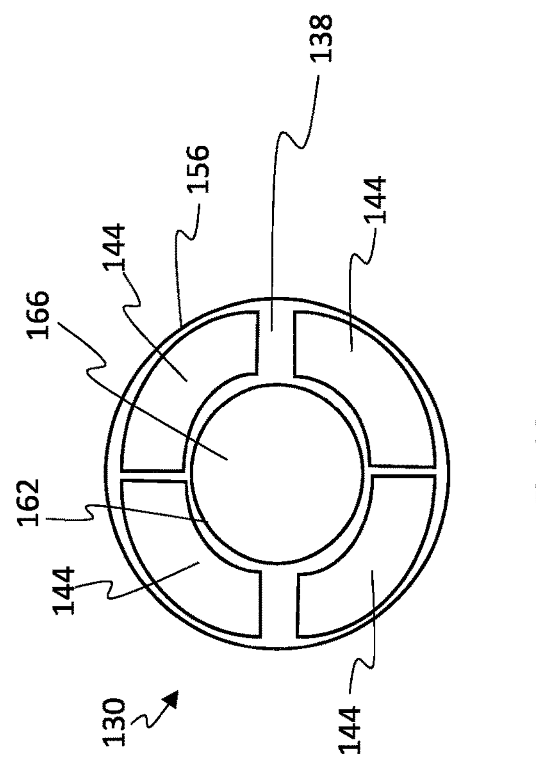
FIG. 16*c* schematically shows an example of a filter unit.

FIGS. 16*c* and 16*d* show embodiments, wherein the filter body 138 forms one receiving slot for receiving one filter element or multiple receiving slots for receiving multiple filter elements 144. The one filter element 144 is preferably a disposable filter element or the multiple filter elements 144 are preferably disposable filter elements 144. The filter body 138 is preferably reusable. Disposable preferably describes that the filter element 144 is replaced after a defined number of runs, in particular after one, two or three or up to five or up to ten runs. Reusable preferably describes that the filter body 138 is used for more runs compared to a filter element 144. The filter body 138 is preferably made of carbon, in particular graphite, or consists of graphite.

FIGS. 17*a* to 17*f* schematically show variants of the filter unit 130 according to the present invention.

According to FIGS. 17*a*, 17*b*, 17*c* and 17*e* the filter unit 130 comprises one filter element 144, wherein the filter element 144 preferably has a ring-shaped form. The ring-shaped form preferably has an outer surface 156 and an inner surface 162, wherein the inner surface 162 preferably forms a through hole 299. The inner surface 162 and the outer surface 156 can be of the same type, in particular circular, or of different type, in particular circular and rectangular or of different (preferably cross-sectional) shapes, wherein the inner surface 162 and or the outer surface 156 can be different in dependency of the height of the filter unit 130. E.g. the outer form can have a cylindrical shape and the inner form can have a shape differing from the cylindrical shape (cf. FIG. 17*c*). Furthermore, the diameter of the inner and/or outer surface 156, 162 can be different at different heights of the filter unit 130.

Figures 17A, 17B, 17C, 17D, 17E, 17F:
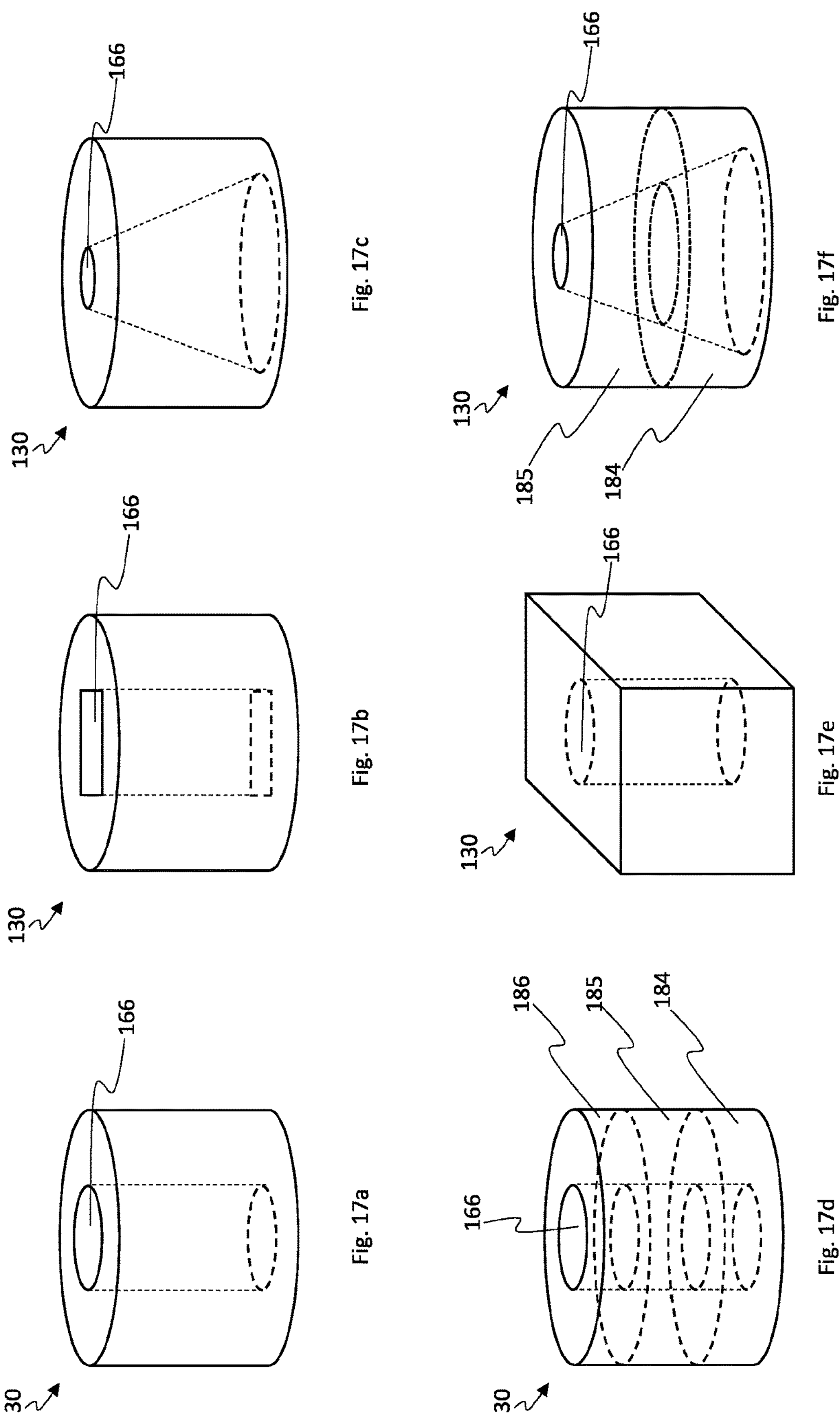
FIG. 17*a* schematically shows an additional or alternative example of a filter unit.
FIG. 17*b* schematically shows an additional or alternative example of a filter unit.
FIG. 17*c* schematically shows an additional or alternative example of a filter unit.
FIG. 17*d* schematically shows an additional or alternative example of a filter unit.
FIG. 17*e* schematically shows an additional or alternative example of a filter unit.
FIG. 17*f* schematically shows an additional or alternative example of a filter unit.

FIG. 17*d* shows a further example of the present filter unit 130. According to this embodiment the filter unit 130 can be materialized by multiple sub-filter units 184, 185, 186, in particular two or three sub-filter units. The sub-filter units 184, 185, 186 can have the same or different properties (e.g. surface size, particle size, binder, height, mass and/or porosity and/or thermal stability). The lower sub-filter unit 184 can be made of material having a higher thermal stability compared to the sub-filter unit 186, which is arranged in a colder zone during a SiC production run of the furnace apparatus according to the present invention. Furthermore, in case one of said sub-filter units 184, 185, 186 needs to be replaced it is possible to only replace the specific sub-filter unit 184, 185, 186. The same applies to the filter unit example shown in FIG. 17*f*.

Figures 18A, 18B, 18C:
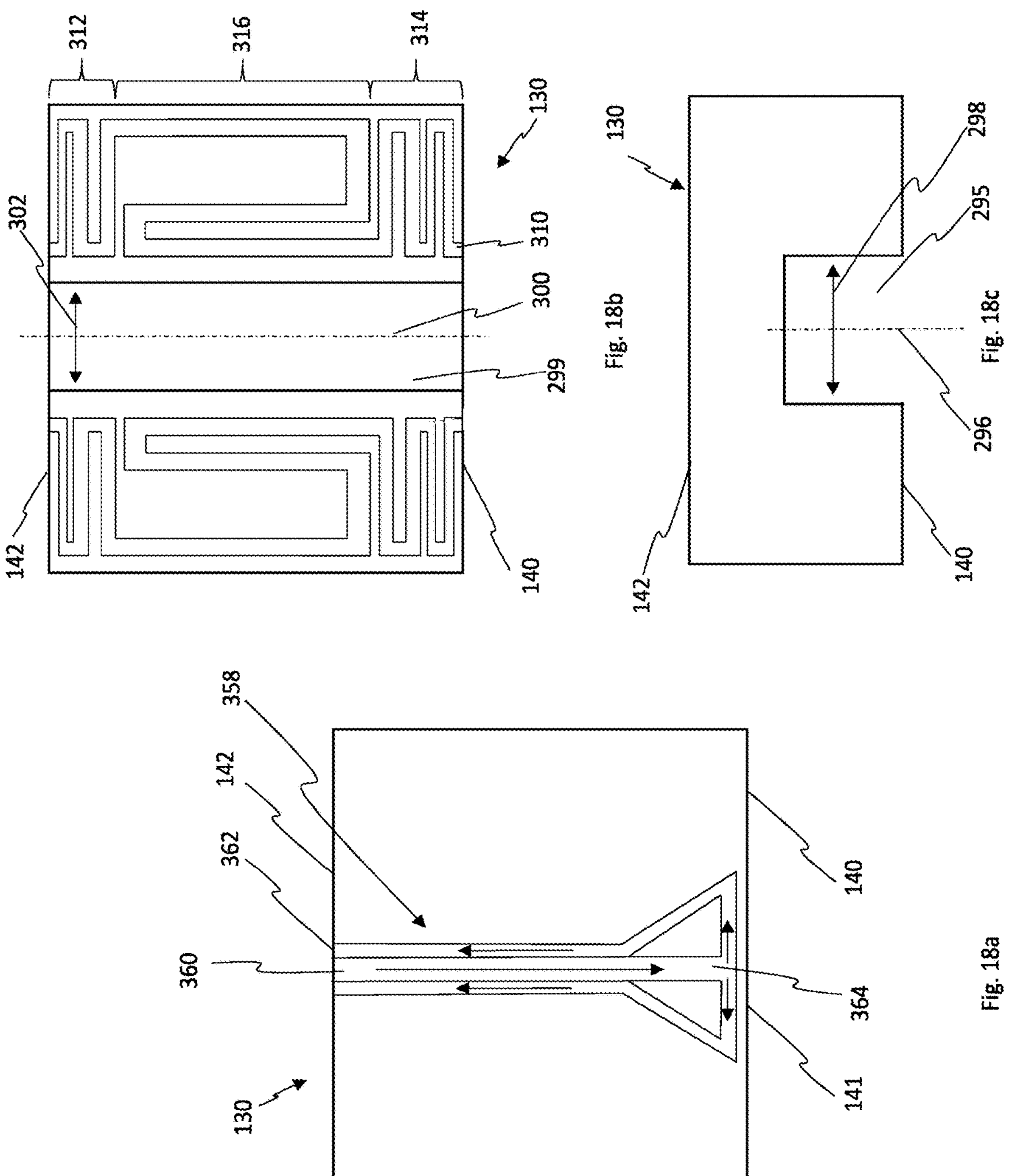
FIG. 18*a* schematically shows an additional or alternative example of a filter unit FIG. 18*b* schematically shows an additional or alternative example of a filter unit FIG. 18*c* schematically shows an additional or alternative example of a filter unit FIG. 19 schematically shows a CVD reactor, which can be used to produce source material that can be transformed by means of the furnace apparatus of the present invention into SiC crystals.

FIG. 18*a* shows a further example of the filter unit 130. The filter unit 130 comprises a filter-cooling-unit 358 for cooling a filter-unit-input-surface-section 141 of the filter unit input surface 140.

The filter-cooling-unit 385 preferably comprises a filter-cooling-unit-gas-inlet 360 and a filter-cooling-unit-gas-outlet 362 and a filter-unit-cooling-gas-guide 364 for guiding gas introduced via the filter-cooling-unit-gas-inlet 360 along and/or through the filter unit 130, in particular the filter body 138 and/or filter element/s 144, to remove thermal energy from at least the filter-unit-input-surface-section 141. The filter-unit-input-surface-section 141 preferably at least partially overlaps in axial direction of the seed holder unit 122 the backside of the seed holder unit 122. The filter-unit-input-surface-section 141 preferably overlaps at least 30% of the backside surface of the seed holder unit 122 and highly preferably at least 70% of the backside surface of the seed holder unit 122 and most preferably between 75% and 100% or at least or up to 100% of the backside surface of the seed holder unit 122.

The filter-cooling-unit-gas-inlet 360 is preferably coupled via a first-cooling-gas-pipe (not shown) with a cooling-gas-source (not shown) and the filter-cooling-unit-gas-outlet 362 is preferably coupled via a second-cooling-gas-pipe (not shown) with a cooling-gas-receiving-space (not shown), in particular the cooling-gas-source, for feeding back the heated cooling gas. The first-cooling-gas-pipe and the second-cooling-gas-pipe preferably extend through the crucible lid respectively filter lid 107 to the furnace and highly preferably though a furnace wall or lid to the outside of the furnace apparatus.

As shown in FIGS. 18*b* and 18*c* the filter unit 130 can form a blind-hole 295 (FIG. 18*c*) or a through-hole 299 (FIG. 18*b* or FIG. 17*a-f* or 16*a-d* or FIG. 9-12). A blind-hole-center-axis 296 or a through-hole-center-axis 300 is preferably arranged in parallel or coaxial to a seed-holder-unit-center-axis AS. The blind-hole-center-axis 296 or a through-hole-center-axis 300 is preferably arranged in a distance of less than 50% of the diameter or average diameter or largest diameter of the seed holder unit 122 to the seed-holder-unit-center-axis AS and preferably in a distance of less than 30% of the diameter of the seed holder unit 122 to the seed-holder-unit-center-axis AS and highly preferably in a distance of less than 15% of the diameter or average diameter or largest diameter of the seed holder unit 122 to the seed-holder-unit-center-axis AS and most preferably in a distance of less than 5% of the diameter of the seed holder unit 122 to the seed-holder-unit-center-axis AS.

The blind hole 295 or through hole 299 preferably has a diameter or average diameter or largest diameter (298, 302) of more than 20% of the diameter or average diameter or largest diameter 123 of the seed holder unit 122 and preferably of more than 50% of the diameter of the seed holder unit 122 and highly preferably of more than 80% of the diameter 123 of the seed holder unit 122 and most preferably of up to, exactly or more than 100% of the diameter 123 of the seed holder unit 122.

The diameter or average diameter or largest diameter of the outer surface 156 of the filter unit 130 is preferably more than 110% of the diameter or average diameter or largest diameter of the seed holder unit 122 or highly preferably more or up to 125% of the diameter or average diameter or largest diameter of the seed holder unit 122 or most preferably more or up to 150% of the diameter or average diameter or largest diameter of the seed holder unit 122.

The blind hole 295 of the filter unit 130 preferably extends from the side of the filter input surface 140 into the direction of the filter output surface 142 more or up to 10% of the distance or average distance between the input surface 140 of the filter unit 130 and the output surface 142 of the filter unit 130 or preferably more or up to 20% of the distance or average distance between the input surface 140 of the filter unit 130 and the output surface 142 of the filter unit 130 or highly preferably more or up to 50% of the distance or average distance between the input surface 140 of the filter unit 130 and the output surface 142 of the filter unit 130 or most preferably more or up to 70% of the distance or average distance between the input surface 140 of the filter unit 130 and the output surface 142 of the filter unit 130.

The blind hole 295 of the filter unit 130 preferably extends from the side of the filter input surface 140 into the direction of the filter output surface 142 preferably between 5% and 10% of the distance or average distance between the input surface 140 of the filter unit 130 and the output surface 142 of the filter unit 130 or preferably between 5% and 30% of the distance or average distance between the input surface 140 of the filter unit 130 and the output surface 142 of the filter unit 130 or highly preferably between 10% and 90% of the distance or average distance between the input surface 140 of the filter unit 130 and the output surface 142 of the filter unit 130 or most preferably between 15% and 95% of the distance or average distance between the input surface 140 of the filter unit 130 and the output surface 142 of the filter unit 130.

Figure 19:
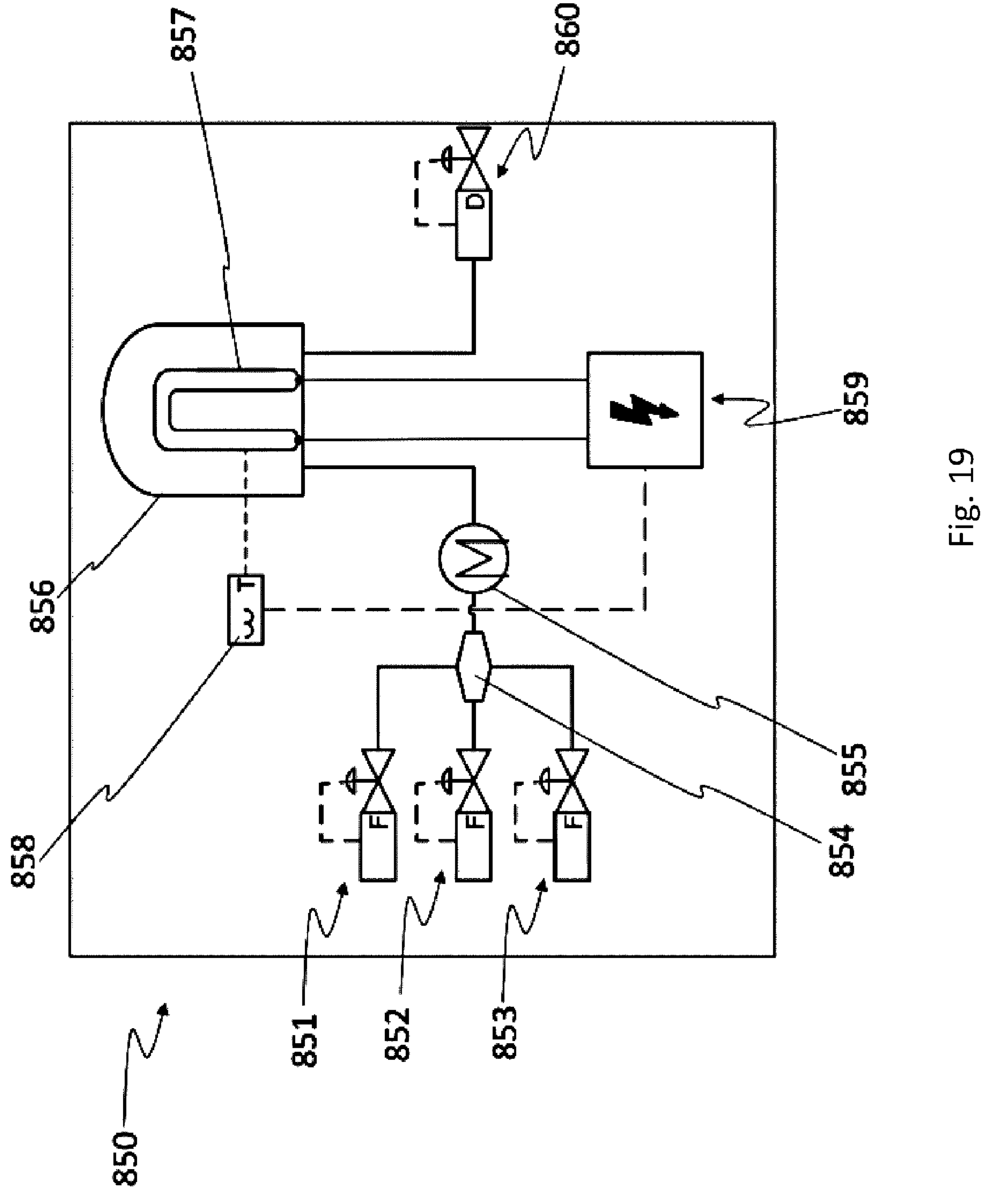

FIG. 19 shows an example of a manufacturing apparatus 850 for manufacturing SiC material, in particular SiC material of a first type respectively 3C-SiC material. This apparatus 850 comprises a first feeding device 851, a second feeding device 852 and a third feeding device 853. The first feed device 851 is preferably designed as a first mass flow controller, in particular for controlling the mass flow of a first source fluid, in particular a first source liquid or a first source gas, wherein the first source fluid preferably comprises Si, in particular e.g. silanes/chlorosilanes of the general composition SiH4-mClm or organochlorosilanes of the general composition SiR4-mClm (where R=hydrogen, hydrocarbon or chlorohydrocarbon). The second feed device 852 is preferably designed as a second mass flow controller, in particular for controlling the mass flow of a second source fluid, in particular a second source liquid or a second source gas, wherein the second source fluid preferably comprises C, e.g. hydrocarbons or chlorinated hydrocarbons, preferably with Sdp. <100° C., particularly preferably methane. The third feed device 853 is preferably designed as a third mass flow controller, in particular for controlling the mass flow of a carrier fluid, in particular a carrier gas, the carrier fluid or carrier gas preferably comprising H respectively H2 or mixtures of hydrogen and inert gases.

The reference sign 854 indicates a mixing device or a mixer by which the source fluids and/or the carrier fluid can be mixed with one another, in particular in predetermined ratios. The reference sign 855 indicates an evaporator device or an evaporator by which the fluid mixture which can be supplied from the mixing device 854 to the evaporator device 855 can be evaporated.

The evaporated fluid mixture is then fed to a process chamber 856 or a separator container, which is designed as a pressure vessel. At least one separating element 857 and preferably several separating elements 857 are arranged in the process chamber 856, wherein Si and C are separated from the vaporized fluid mixture at the separating element 857 and SiC is formed.

The reference sign 858 indicates a temperature measuring device, which is preferably provided for detecting the surface temperature of the separating element 857 and is preferably connected to a control device (not shown) by data and/or signal technology.

The reference sign 859 indicates an energy source, in particular for introducing electrical energy into the separating element 857 for heating the separating element. The energy source 859 is thereby preferably also connected to the control device by means of signals and/or data. Preferably, the control device controls the energy supply, in particular power supply, through the separating element 857 in dependence on the measurement signals and/or measurement data output by the temperature measuring device 858.

Furthermore, a pressure maintenance device is indicated by the reference sign 860. The pressure maintenance device 860 can preferably be implemented by a pressure-regulated valve or the working pressure of a downstream exhaust gas treatment system.

Thus, the present invention can also be solved by a method for the production of at least one SiC crystal. Said method preferably comprises the steps providing a CVD reactor, in particular as described above, for the production of SiC of a first type, introducing at least one source gas, in particular a first source gas, in particular SiCl3(CH3), into a process chamber, the source gas comprising Si and C, introducing at least one carrier gas into the process chamber, the carrier gas preferably comprising H, electrically energizing at least one separator element disposed in the process chamber to heat the separator element, wherein the surface of the deposition element is heated to a temperature in the range between 1300° C. and 1700° C., depositing SiC of the first type onto the separator element, in particular at a deposition rate of more than 200 μm/h, removing the deposited SiC of the first type from the PVT reactor, transforming the removed SiC into fragmented SiC of the first type or into one or multiple solid bodies SiC of the first type. The method also might preferably comprise the following steps: Providing a PVT reactor for the production of SiC of a second type, wherein the PVT reactor comprises a furnace unit 102 (cf. FIG. 1-18*c*), wherein the furnace unit 102 comprises a furnace housing 108 with an outer surface 242 and an inner surface 240, at least one crucible unit 106, wherein the crucible unit 106 is arranged inside the furnace housing 108, wherein the crucible unit 106 comprises a crucible housing 110, wherein the crucible housing 110 has an outer surface 112 and an inner surface 114, wherein the inner surface 114 at least partially defines a crucible volume 116, wherein a receiving space 118 for receiving a source material 120 is arranged or formed inside the crucible volume 116, wherein a seed holder unit 122 for holding a defined seed wafer 18 is arranged inside the crucible volume 116, wherein the seed wafer holder 122 holds a seed wafer 18, wherein the furnace housing inner wall 240 and the crucible housing outer wall 112 define a furnace volume 104, at least one heating unit 124 for heating the source material 120, wherein the receiving space 118 for receiving the source material 120 is at least in parts arranged above the heating unit 124 and below the seed holder unit 122, adding the fragmented SiC of the first type or adding one or multiple solid bodies SiC of the first type as source material 120 into the receiving space 118, sublimating the SiC of the first type and depositing the sublimated SiC on the seed wafer 18 as SiC of the second type.

| List of reference numbers | |
|---|---|
| 2 | furnace lower housing |
| 3 | furnace upper housing |
| 4 | furnace gas inlet |
| 7 | pyrometer sightline |
| 8 | bottom insulation |
| 9 | side insulation |
| 13 | crucible legs |
| 17 | crystal |
| 18 | seed wafer |
| 20 | gasket |
| 22 | filter grooves |
| 26 | crucible vacuum outlet |
| 28 | upper pyrometer sightline |
| 30 | seed wafer attaching surface |
| 32 | seed wafer backside |
| 100 | furnace apparatus |
| 102 | furnace unit |
| 104 | furnace volume |
| 106 | crucible unit |
| 107 | filter lid or crucible lid |
| 108 | furnace housing |
| 110 | crucible housing |
| 112 | crucible housing outer surface |
| 114 | crucible housing inner surface |
| 116 | crucible volume |
| 117 | bottom surface of receiving space |
| 118 | receiving space |
| 119 | receiving sub-space |
| 120 | source material |
| 122 | seed holder unit |
| 123 | diameter of seed holder unit |
| 124 | heating unit |
| 126 | leak prevention means |
| 128 | covering element |
| 129 | density increasing element |
| 130 | filter unit |
| 131 | overlapping region |
| 132 | pressure unit |
| 134 | sealing element/coating |
| 135 | filter-coating |
| 138 | filter body |
| 140 | filter input surface |
| 141 | filter-unit-input-surface-section |
| 142 | filter output surface |
| 143 | seed-holder-unit-attaching-section |
| 144 | filter element |
| 145 | crucible-lid-attaching-section |
| 146 | filter trapping section |
| 147 | filter gas flow path |
| 148 | crucible lower volume |
| 150 | crucible upper volume |
| 152 | crucible lower housing |
| 154 | crucible upper housing |
| 156 | filter outer surface |
| 158 | filter outer surface covering element |
| 160 | filter element member |
| 162 | filter inner surface |
| 164 | filter inner surface covering element |
| 166 | filter through hole |
| 167 | filter particles |
| 168 | filter binder |
| 169 | gas source |
| 170 | gas flow unit |
| 172 | crucible gas inlet tube |

-continued

| List of reference numbers | |
|---|---|
| 173 | upper end of gas inlet |
| 174 | crucible vacuum outlet tube or crucible gas outlet tube |
| 178 | transformation zone |
| 180 | trapping zone |
| 182 | gas distribution member |
| 184 | first filter sub-unit |
| 185 | second filter sub-unit |
| 186 | third filter sub-unit |
| 188 | lower surface of the gas distribution member |
| 190 | gas distribution plate |
| 192 | upper surface of the gas distribution plate |
| 194 | pipe system |
| 196 | crucible pipe |
| 198 | vacuum unit |
| 200 | furnace pipe |
| 202 | control element |
| 204 | furnace vacuum outlet |
| 206 | crucible solid bottom section |
| 207 | crucible bottom wall inner surface |
| 208 | crucible bottom wall |
| 210 | crucible empty bottom section |
| 212 | side heater |
| 214 | bottom heater |
| 230 | gas distribution plate/growth guide |
| 232 | growth-guide-gas-path-section-boundary |
| 236 | gas flow passage |
| 240 | furnace housing inner surface |
| 242 | furnace housing outer surface |
| 244 | crucible solid bottom section upper surface |
| 246 | crucible solid bottom section outer surface |
| 248 | top of the lowest side wall member |
| 252 | crystal growth face |
| 260 | growth guide growth guide first section |
| 261 | growth guide growth guide third section |
| 262 | growth guide growth guide second section |
| 264 | growth guide fourth section |
| 266 | growth guide upper vertical end |
| 268 | gas flow channel |
| 270 | lower gas guide |
| 272 | Upper gas guide |
| 274 | growth guide third section growth guide third section upper surface |
| 276 | insert |
| 278 | Source material holding plate |
| 279 | Source material holding plate seat |
| 280 | Gas flow gap |
| 282 | Source material plate hole |
| 284 | Gas flow path |
| 290 | filter-cooling-unit |
| 292 | filter-cooling-unit-gas-inlet |
| 294 | filter-cooling-unit-gas-outlet |
| 295 | blind hole |
| 296 | blind-hole-center-axis |
| 298 | blind hole diameter |
| 299 | filter through hole |
| 300 | through-hole-center-axis |
| 302 | through hole diameter |
| 310 | condensing path |
| 312 | first condensing section |
| 314 | second condensing section |
| 316 | further condensing section |
| 358 | filter-unit-cooling-unit |
| 360 | filter-cooling-unit-gas-inlet |
| 362 | filter-cooling-unit-gas-outlet |
| 364 | filter-unit-cooling-gas-guide |
| 370 | Source material holding plate upper surface |
| 372 | Source material holding plate lower surface |
| 850 | Manufacturing apparatus |
| 851 | first feeding device |
| 852 | second feeding device |
| 853 | third feeding device |
| 854 | mixing device |
| 855 | evaporator device |
| 856 | process chamber |
| 857 | separating element |
| 858 | temperature measuring device |
| 859 | energy source, especially power supply |
| 860 | pressure maintenance device |

-continued

| List of reference numbers | |
|---|---|
| A | crucible central axis |
| AS | central axis of seed holder unit |
| HR | receiving space vertical height |
| $T_c$ | condensation temperature |
| P1 | crucible volume pressure |
| P2 | furnace volume pressure |
| D1 | filter outer diameter |
| D2 | filter inner diameter |
| X | horizontal direction |
| Y | vertical direction |

The invention claimed is:

1. A furnace apparatus for growing SiC crystals, comprising a furnace unit, wherein the furnace unit comprises a furnace housing with an outer surface and an inner surface, at least one crucible unit wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a solid SiC source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged below the seed holder unit, characterized in that a crucible gas flow unit is provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume, a filter unit is arranged inside the crucible volume between the crucible gas inlet tube and the crucible gas outlet tube for capturing at least $Si_2C$ sublimation vapor, $SiC_2$ sublimation vapor and Si sublimation vapor, the gas flow path extends through the filter unit, the filter unit is arranged between a crucible lower housing and a crucible upper housing, wherein the filter body forms a filter outer surface, wherein the filter outer surface connects the crucible lower housing and the crucible upper housing, wherein the filter outer surface forms a portion of the outer surface of crucible housing, and the filter outer surface comprises a filter outer surface covering element, wherein the filter outer surface covering element is a sealing element, wherein the sealing element is a filter coating, wherein the filter coating is generated at the filter surface or attached to the filter surface or forms the filter surface.

2. A furnace apparatus for growing SiC crystals, comprising a furnace unit, wherein the furnace unit comprises a furnace housing with an outer surface and an inner surface, at least one crucible unit wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a solid SiC source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged below the seed holder unit, characterized in that a crucible gas flow unit is provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume, a filter unit is arranged inside the crucible volume between the crucible gas inlet tube and the crucible gas outlet tube for capturing at least $Si_2C$ sublimation vapor, $SiC_2$ sublimation vapor and Si sublimation vapor, the gas flow path extends through the filter unit, the filter unit is arranged between a crucible lower housing and a crucible upper housing, wherein the filter body forms a filter outer surface, wherein the filter outer surface connects the crucible lower housing and the crucible upper housing, wherein the filter outer surface forms a portion of the outer surface of crucible housing, and the filter body forms a filter inner surface, wherein the filter inner surface forms a filter through hole.

3. The furnace apparatus according to claim 1, characterized in that the filter unit comprises a filter body, wherein the filter body comprises a filter input surface for inputting sublimated vapor comprising $Si_2C$ vapor, $SiC_2$ vapor, Si vapor and carrier and/or doping gases into the filter body and an output surface for outputting filtered carrier and doping gases, wherein a filter element is arranged between the filter input surface and the output surface, wherein the filter element forms a trapping section for adsorbing and condensing Si vapor.

4. The furnace apparatus according to claim 1, characterized in that the filter element forms a filter-unit-gas-flow-path from the filter input surface to the output surface, wherein the filter gas flow path is part of the gas flow path between the crucible gas inlet tube and the crucible gas outlet tube, wherein the filter element has a height S1 and wherein the filter-unit-gas-flow-path through the filter element has a length S2, wherein S2 is at least 2 times longer compared to S1.

5. The furnace apparatus according to claim 1, characterized in that the filter body forms a filter inner surface, wherein the filter inner surface forms a filter through hole.

6. The furnace apparatus according to claim 5, characterized in that the filter inner surface comprises a further filter inner surface covering element, wherein the further filter inner surface covering element is a sealing element, wherein the sealing element is a filter coating, wherein the filter coating is generated at the filter surface or attached to the filter surface or forms the filter surface.

7. The furnace apparatus according to claim 5, characterized in that the filter through hole is arranged above the seed holder unit, wherein a through-hole-center-axis of the filter through hole is arranged parallel to a seed-holder-unit-axis.

8. The furnace apparatus according to claim 5, characterized in that the through-hole-center-axis is arranged in a distance of less than 50% of the diameter or average diameter or largest diameter of the seed holder unit to the seed-holder-unit-center-axis and the filter through hole has a diameter or average diameter or largest diameter of more than 20% of the diameter or average diameter or largest diameter of the seed holder unit.

9. A furnace apparatus for growing SiC crystals, comprising a furnace unit, wherein the furnace unit comprises a furnace housing with an outer surface and an inner surface, at least one crucible unit wherein the crucible unit is arranged inside the furnace housing, wherein the crucible unit comprises a crucible housing, wherein the housing has an outer surface and an inner surface, wherein the inner surface at least partially defines a crucible volume, wherein a receiving space for receiving a solid SiC source material is arranged or formed inside the crucible volume, wherein a seed holder unit for holding a defined seed wafer is arranged inside the crucible volume, wherein the furnace housing inner wall and the crucible housing outer wall define a furnace volume, at least one heating unit for heating the source material, wherein the receiving space for receiving the source material is at least in parts arranged below the seed holder unit, characterized in that a crucible gas flow unit is provided for causing gas flow along a gas flow path inside the crucible volume, wherein the gas flow unit comprises a crucible gas inlet tube for conducting gas into the crucible volume and a crucible gas outlet tube for removing gas conducted into the crucible volume via the crucible gas inlet tube from the crucible volume, a filter unit is arranged inside the crucible volume between the crucible gas inlet tube and the crucible gas outlet tube for capturing at least $Si_2C$ sublimation vapor, $SiC_2$ sublimation vapor and Si sublimation vapor, the gas flow path extends through the filter unit, the receiving space is located between the crucible gas inlet tube and the seed holder unit for conducting gas flow around the receiving space and/or through the receiving space, a source material holding plate is provided, wherein the source material holding plate comprises an upper surface forming a bottom section of the receiving space and a lower surface forming a source-material-holding-plate-gas-flow-path-boundary-section, the source-material-holding-plate comprises multiple through holes, wherein the multiple through holes extend from the upper surface of the source-material-holding-plate through a main body of the source-material-holding-plate to the lower surface of source-material-holding-plate, wherein at least the majority of the multiple through holes has a diameter of less than 12 mm.

10. The furnace apparatus according to claim 9, characterized in that the number of through holes through the main body of the source-material-holding-plate depends on the surface size of the upper surface of the source-material-holding-plate, wherein at least one though hole is provided per 10 $cm^2$ surface size of the upper surface.

11. The furnace apparatus according to claim 10, characterized in that the number of through holes per 10 $cm^2$ is higher in a radially outer section of the source-material-holding-plate compared to a radially inner section of the source-material-holding-plate, wherein the radially inner section extends up to 20% or 30% or 40% or 50% of the radial extension of the source-material-holding-plate, wherein the radially outer section of the source-material-holding-plate extends between the radially inner section and the radial end of the source-material-holding-plate.

12. The furnace apparatus according to claim 1, characterized in that the lower surface of the source-material-holding-plate forms together with a bottom wall section of the crucible housing a gas-guide-gap or gas-guide-channel for guiding gas from the crucible gas inlet tube to the receiving space or around the receiving space.

13. The furnace apparatus according to claim 1, characterized in that a pressure unit for setting up a crucible volume pressure inside the crucible volume is provided, wherein the pressure unit is configured to cause the crucible volume pressure to be in a range between 2666.45 Pa and 50000.00 Pa.

14. A method for producing SiC material, comprising the steps:

Providing at least one furnace apparatus according to claim 1,

Arranging source material in a receiving space within the crucible housing,

Heating the source material, and

Feeding a carrier gas into the crucible housing.

15. The method according to claim 14, further comprising removing the carrier gas from the crucible housing via a crucible gas outlet tube.

16. The method according to claim 14, characterized in that at least 50% of the source material is provided as fragments having a volume of more than 0.5 $cm^3$.

17. The method according to claim 14, characterized in that the source material is solid SiC material.

18. The method according to claim 14, further comprising generating a crucible volume pressure inside the crucible volume above 2666.45 Pa.

* * * * *